(12) United States Patent
Yamazaki

(10) Patent No.: US 11,271,013 B2
(45) Date of Patent: Mar. 8, 2022

(54) SEMICONDUCTOR DEVICE INCLUDING A PLUG

(71) Applicant: SEMICONDUCTOR ENERGY LABORATORY CO., LTD., Atsugi (JP)

(72) Inventor: Shunpei Yamazaki, Tokyo (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 0 days.

(21) Appl. No.: 17/022,384

(22) Filed: Sep. 16, 2020

(65) Prior Publication Data
US 2020/0411565 A1   Dec. 31, 2020

Related U.S. Application Data

(63) Continuation of application No. 15/345,772, filed on Nov. 8, 2016, now Pat. No. 10,784,284.

(30) Foreign Application Priority Data

Nov. 13, 2015   (JP) ................................. 2015-222731

(51) Int. Cl.
*H01L 27/12* (2006.01)
*H01L 29/786* (2006.01)
(Continued)

(52) U.S. Cl.
CPC ...... *H01L 27/1207* (2013.01); *H01L 21/0223* (2013.01); *H01L 21/02178* (2013.01);
(Continued)

(58) Field of Classification Search
CPC .......... H01L 21/02178; H01L 21/0223; H01L 21/02266; H01L 21/02271;
(Continued)

(56) References Cited

U.S. PATENT DOCUMENTS 8,519,387 B2   8/2013   Endo et al.
8,547,771 B2   10/2013  Koyama
(Continued)

FOREIGN PATENT DOCUMENTS

JP   2012-257187 A   12/2012
JP   2013-168644 A   8/2013
(Continued)

OTHER PUBLICATIONS

International Search Report (Application No. PCT/IB2016/056578) dated Feb. 7, 2017.
(Continued)

*Primary Examiner* — Matthew E Warren
(74) *Attorney, Agent, or Firm* — Fish & Richardson P.C.

(57) ABSTRACT

To provide a highly reliable semiconductor device that is suitable for miniaturization and an increase in density. The semiconductor device includes a first insulator over a substrate, a transistor including an oxide semiconductor over the first insulator, a second insulator over the transistor, and a third insulator over the second insulator. The first insulator and the third insulator have a barrier property with respect to oxygen and hydrogen. The second insulator includes an excess-oxygen region. The transistor is enclosed with the first insulator and the third insulator that are in contact with each other in an edge of a region where the transistor is positioned.

7 Claims, 38 Drawing Sheets

(51) Int. Cl.
*H01L 21/02* (2006.01)
*H01L 21/768* (2006.01)
*H01L 21/84* (2006.01)
*H01L 23/522* (2006.01)
*H01L 23/532* (2006.01)
*H01L 29/66* (2006.01)
*H01L 21/822* (2006.01)
*H01L 21/8258* (2006.01)

(52) U.S. Cl.
CPC .. *H01L 21/02266* (2013.01); *H01L 21/02271* (2013.01); *H01L 21/76826* (2013.01); *H01L 21/76828* (2013.01); *H01L 21/84* (2013.01); *H01L 23/5223* (2013.01); *H01L 23/5226* (2013.01); *H01L 23/53295* (2013.01); *H01L 27/1225* (2013.01); *H01L 29/66969* (2013.01); *H01L 29/7869* (2013.01); *H01L 29/78603* (2013.01); *H01L 29/78606* (2013.01); *H01L 21/8221* (2013.01); *H01L 21/8258* (2013.01)

(58) Field of Classification Search
CPC ......... H01L 21/76826; H01L 21/76828; H01L 21/8221; H01L 21/8258; H01L 21/84; H01L 23/5223; H01L 23/5226; H01L 23/53295; H01L 27/1207; H01L 27/1225; H01L 29/66969; H01L 29/78603; H01L 29/78606; H01L 29/7869

See application file for complete search history.

(56) References Cited

U.S. PATENT DOCUMENTS

| | | | |
|---|---|---|---|
| 8,748,240 | B2 | 6/2014 | Yamazaki |
| 8,753,928 | B2 | 6/2014 | Yamazaki et al. |
| 8,785,258 | B2 | 7/2014 | Yamazaki |
| 8,796,681 | B2 | 8/2014 | Yamade et al. |
| 8,809,992 | B2 | 8/2014 | Yamazaki et al. |
| 8,828,794 | B2 | 9/2014 | Yamazaki et al. |
| 8,865,555 | B2 | 10/2014 | Yamazaki et al. |
| 8,878,173 | B2 | 11/2014 | Yamazaki |
| 8,912,080 | B2 | 12/2014 | Yamazaki |
| 8,916,424 | B2 | 12/2014 | Isobe et al. |
| 8,927,990 | B2 | 1/2015 | Sasaki et al. |
| 8,969,130 | B2 | 3/2015 | Tanaka et al. |
| 9,012,913 | B2 | 4/2015 | Noda et al. |
| 9,023,684 | B2 | 5/2015 | Suzawa et al. |
| 9,082,860 | B2 | 7/2015 | Nakano et al. |
| 9,117,662 | B2 | 8/2015 | Isobe et al. |
| 9,356,054 | B2 | 5/2016 | Miyairi et al. |
| 9,496,375 | B2 | 11/2016 | Isobe et al. |
| 9,502,434 | B2 | 11/2016 | Tanaka et al. |
| 9,502,572 | B2 | 11/2016 | Yamazaki |
| 2003/0211685 | A1* | 11/2003 | Ohyagi ............ H01L 21/02063 438/240 |
| 2005/0151276 | A1* | 7/2005 | Jang ................ H01L 27/11 257/427 |
| 2006/0186484 | A1* | 8/2006 | Chau ................ H01L 29/785 257/401 |
| 2010/0193851 | A1* | 8/2010 | Nagai ............... H01L 23/53238 257/295 |
| 2011/0079778 | A1 | 4/2011 | Yamazaki et al. |
| 2011/0101335 | A1 | 5/2011 | Yamazaki et al. |
| 2013/0026570 | A1* | 1/2013 | Fan .................. H01L 29/41783 257/347 |
| 2013/0161611 | A1 | 6/2013 | Yamazaki et al. |
| 2013/0187150 | A1 | 7/2013 | Yamazaki et al. |
| 2013/0187161 | A1 | 7/2013 | Yamazaki |
| 2013/0200365 | A1* | 8/2013 | Yamazaki ............ H01L 29/045 257/43 |
| 2013/0203214 | A1* | 8/2013 | Isobe ................ H01L 21/47573 438/104 |
| 2014/0027762 | A1 | 1/2014 | Tsurume et al. |
| 2014/0326992 | A1 | 11/2014 | Hondo et al. |
| 2015/0187823 | A1 | 7/2015 | Miyairi et al. |
| 2016/0141240 | A1* | 5/2016 | Saka ................ H01L 23/4824 257/401 |
| 2016/0268261 | A1 | 9/2016 | Miyairi et al. |
| 2017/0062619 | A1* | 3/2017 | Sasagawa ......... H01L 29/78648 |

FOREIGN PATENT DOCUMENTS

| | | |
|---|---|---|
| JP | 2013-179284 A | 9/2013 |
| JP | 2013-179286 A | 9/2013 |
| JP | 2014-042013 A | 3/2014 |
| JP | 2014-232870 A | 12/2014 |
| JP | 2015-144267 A | 8/2015 |
| KR | 2013-0085969 A | 7/2013 |
| KR | 2014-0131264 A | 11/2014 |
| KR | 2016-0102236 A | 8/2016 |
| TW | 201501311 | 1/2015 |
| TW | 201530698 | 8/2015 |
| WO | WO-2015/097593 | 7/2015 |
| WO | WO-2015/159179 | 10/2015 |

OTHER PUBLICATIONS

Written Opinion (Application No. PCT/IB2016/056578) dated Feb. 7, 2017.

* cited by examiner

FIG. 7A
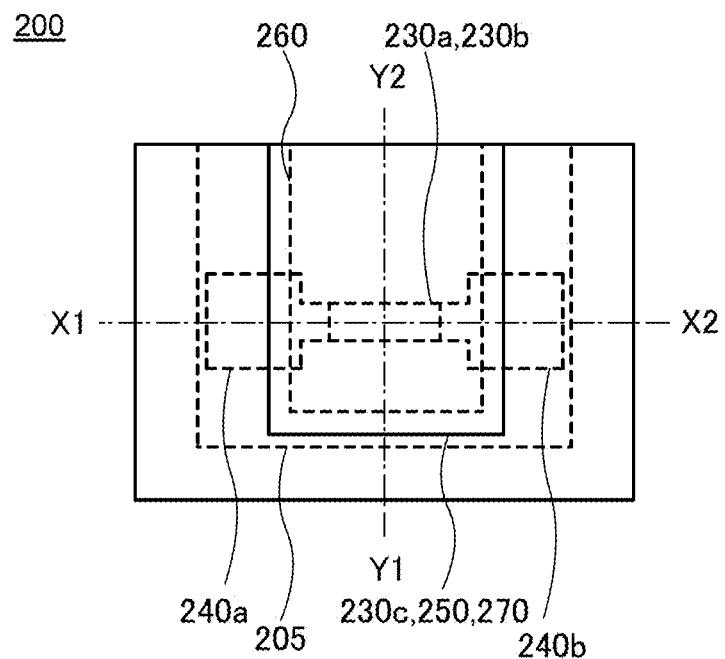
FIG. 7B
FIG. 7C
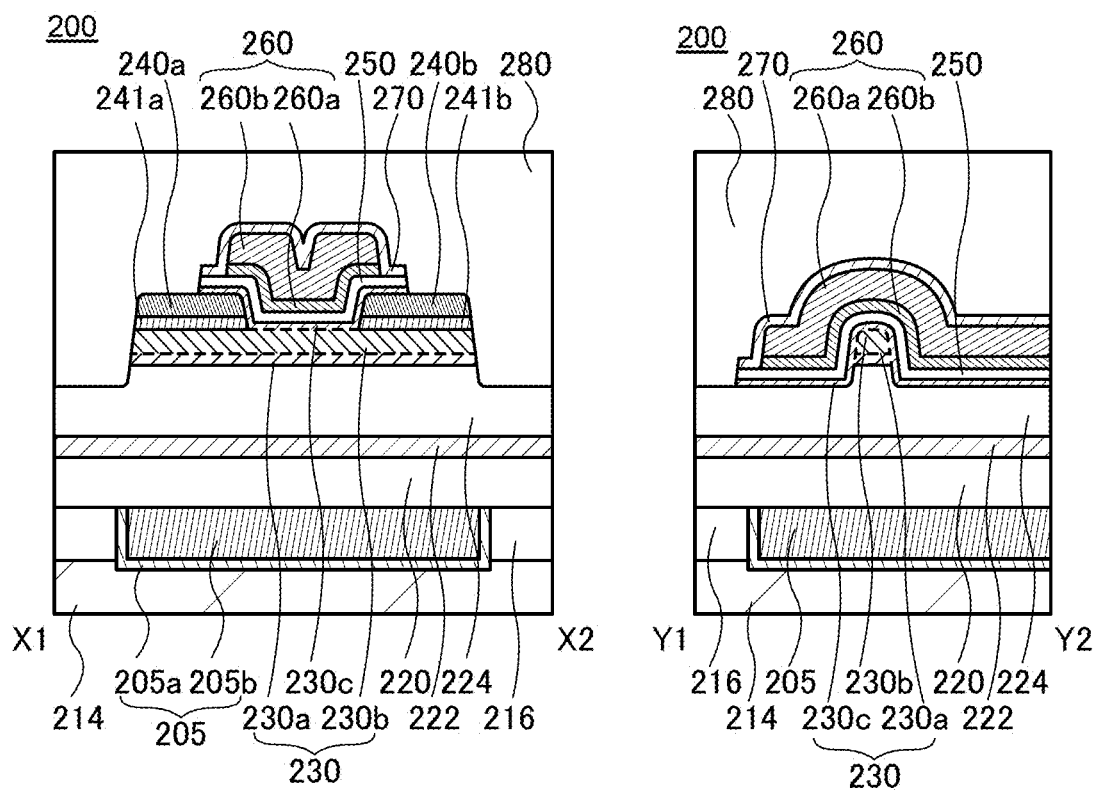

FIG. 8A
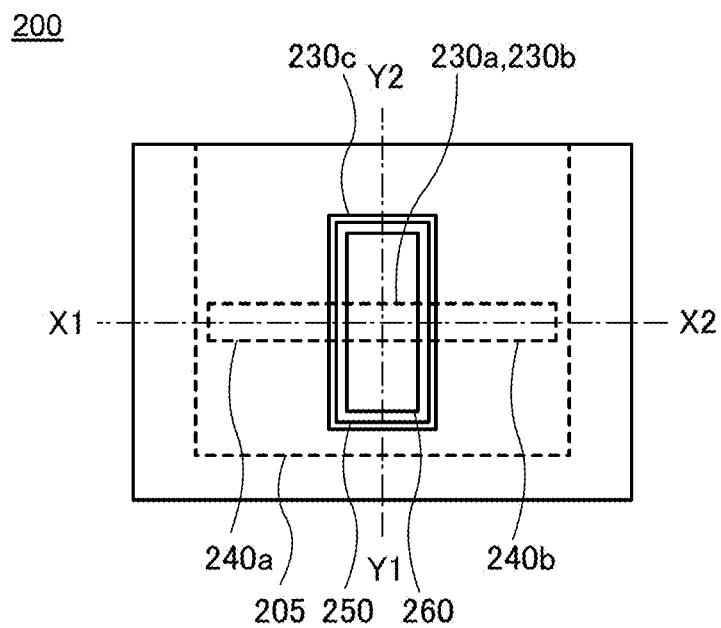
FIG. 8B
FIG. 8C
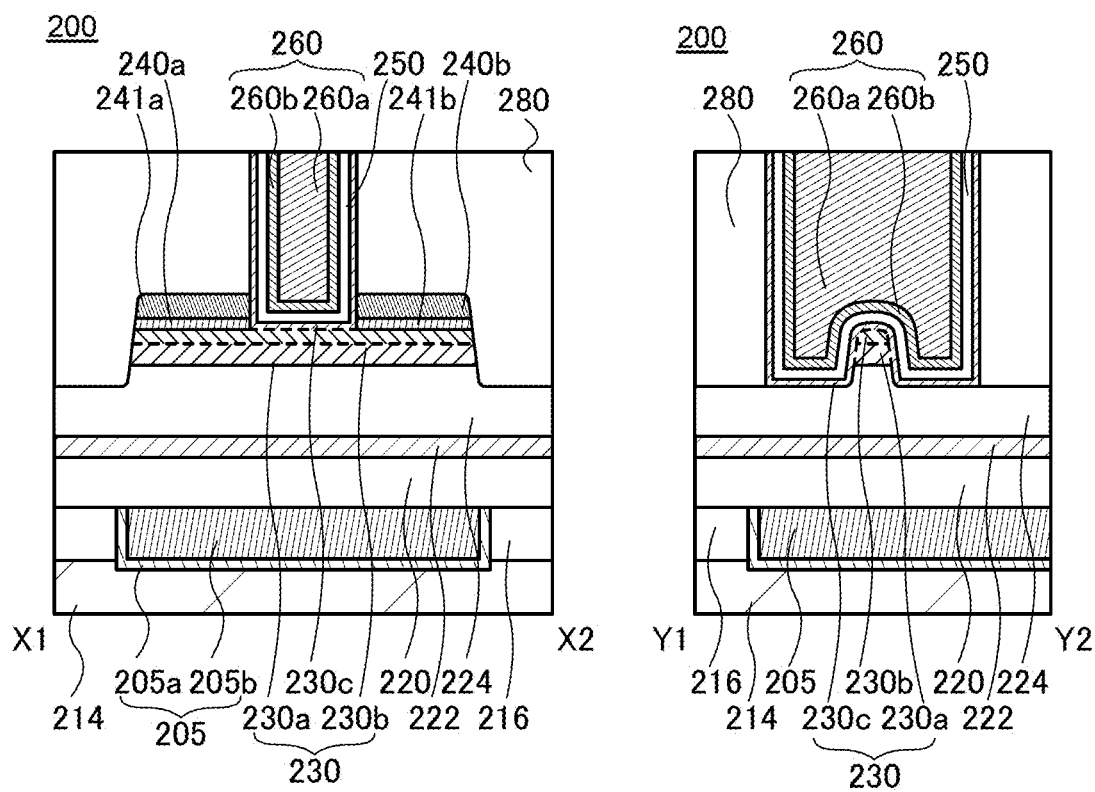

SEMICONDUCTOR DEVICE INCLUDING A PLUG

CROSS-REFERENCE TO RELATED APPLICATIONS

This application is a continuation of U.S. application Ser. No. 15/345,772, filed Nov. 8, 2016, now allowed, which claims the benefit of a foreign priority application filed in Japan as Serial No. 2015-222731 on Nov. 13, 2015, both of which are incorporated by reference.

TECHNICAL FIELD

The present invention relates to an object, a method, or a manufacturing method. The present invention relates to a process, a machine, manufacture, or a composition of matter. One embodiment of the present invention relates to a semiconductor device, a light-emitting device, a display device, an electronic appliance, a lighting device, and a method for fabricating these. In particular, one embodiment of the present invention relates to a light-emitting device using an organic electroluminescence (hereinafter also referred to as EL) phenomenon, and a method for fabricating the light-emitting device. For example, one embodiment of the present invention relates to an electronic device that includes, as a component, an LSI, a CPU, a power device mounded in a power circuit, a semiconductor integrated circuit including a memory, a thyristor, a converter, an image sensor, or the like.

Note that one embodiment of the present invention is not limited to the above technical field.

In this specification, a semiconductor device generally means a device that can function by utilizing semiconductor characteristics. An electro-optical device, a semiconductor circuit, and an electronic device include a semiconductor device in some cases.

BACKGROUND ART

In recent years, semiconductor devices have been developed to be used mainly for an LSI, a CPU, or a memory. A CPU is an aggregation of semiconductor elements each provided with an electrode which is a connection terminal, which includes a semiconductor integrated circuit (including at least a transistor and a memory) separated from a semiconductor wafer.

A semiconductor circuit (IC chip) of an LSI, a CPU, a memory, or the like is mounted on a circuit board, for example, a printed wiring board, to be used as one of components of a variety of electronic devices.

A technique by which a transistor is formed using a semiconductor thin film formed over a substrate having an insulating surface has been attracting attention. The transistor is applied to a wide range of electronic devices such as an integrated circuit (IC) or an image display device (also simply referred to as a display device). A silicon-based semiconductor material is widely known as a material for a semiconductor thin film that can be used for a transistor. As another material, an oxide semiconductor has been attracting attention.

It is known that a transistor including an oxide semiconductor has an extremely low leakage current in an off state. For example, a low-power-consumption CPU utilizing a characteristic of low leakage current of the transistor including an oxide semiconductor has been disclosed (see Patent Document 1).

A transistor including an oxide semiconductor is known to have a problem of low reliability because of high possibility of change in electric characteristics, although the transistor including an oxide semiconductor can be operated at higher speed than a transistor including amorphous silicon and can be manufactured more easily than a transistor including polycrystalline silicon. For example, the threshold voltage of the transistor is changed in some cases after a bias-temperature stress test (BT test).

REFERENCE

Patent Document

[Patent Document 1] Japanese Published Patent Application No. 2012-257187

DISCLOSURE OF INVENTION

An object of one embodiment of the present invention is to improve the reliability of a semiconductor device including an oxide semiconductor. Further, there is a problem in that a transistor including an oxide semiconductor tends to have normally-on characteristics and it is difficult to provide a logic circuit which operates properly in a driver circuit. Thus, an object of one embodiment of the present invention is to obtain normally-off characteristics of a transistor including an oxide semiconductor.

Another object is to provide a transistor having high reliability. Another object is to provide a transistor with extremely low leakage current in an off state.

Another object is to provide a highly reliable semiconductor device. Another object is to provide semiconductor devices with high productivity. Another object is to provide semiconductor devices with high yield. Another object is to provide a semiconductor device that occupies a small area.

Another object is to provide a highly integrated semiconductor device. Another object is to provide a semiconductor device which can operate at high speed. Another object is to provide a semiconductor device with low power consumption.

Another object is to provide a novel semiconductor device. Another object is to provide a module including any of the above semiconductor devices. Another object is to provide an electronic device including any of the above semiconductor devices or the module.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a semiconductor device including a first insulator over a substrate, a transistor including an oxide semiconductor over the first insulator, a second insulator over the transistor, and a third insulator over the second insulator. The first insulator and the third insulator have a barrier property with respect to oxygen and hydrogen. The second insulator includes an excess-oxygen region. The transistor is enclosed with the first insulator and the third insulator that are in contact with each other in an edge of a region where the transistor is positioned.

One embodiment of the present invention is a semiconductor device including a first insulator over a substrate, a fourth insulator over the first insulator, a transistor including an oxide semiconductor over the first insulator, a second insulator over the transistor, a third insulator over the second insulator, and a fifth insulator over the third insulator. The first insulator, the third insulator, the fourth insulator, and the fifth insulator have a barrier property with respect to oxygen and hydrogen. The second insulator includes an excess-oxygen region. The fourth insulator and the fifth insulator are in contact with each other in an edge of a region where the transistor is positioned. The first insulator and the second insulator are in contact with each other in an edge of a region where the fourth insulator and the fifth insulator are in contact with each other. The transistor is enclosed with the fourth insulator and the fifth insulator. The fourth insulator and the fifth insulator are enclosed with the first insulator and the second insulator.

In the above structure, the fourth insulator and the fifth insulator are aluminum oxide.

In the above structure, the amount of hydrogen released from each of the first insulator and the third insulator that is converted into hydrogen atoms in TDS analysis is less than or equal to $10 \times 10^{20}$ atoms/cm$^3$, preferably less than or equal to $5 \times 10^{20}$ atoms/cm$^3$ in a temperature range of 50° C. to 500° C.

In the above structure, the first insulator and the third insulator are aluminum oxide.

An electronic device including the above-described semiconductor device is provided.

In one embodiment of the present invention, a first insulator is formed over a substrate, a transistor including an oxide semiconductor is formed over the first insulator, a second insulator is formed over the transistor, a third insulator is formed over the second insulator, and heat treatment is performed after oxygen introduction treatment is performed on the second insulator through the third insulator.

In the above structure, the oxygen introduction treatment and the heat treatment are performed repeatedly.

In the above structure, the third insulator has a barrier property with respect to oxygen and hydrogen and is formed by a sputtering method.

In the above structure, the third insulator has a barrier property with respect to oxygen and hydrogen and is formed by a CVD method.

A change in electric characteristics can be prevented and reliability can be improved in a semiconductor device including a transistor including an oxide semiconductor. A transistor including an oxide semiconductor with high on-state current can be provided. A transistor including an oxide semiconductor with low off-state current can be provided. A semiconductor device with low power consumption can be provided.

A novel semiconductor device can be provided. A module including the semiconductor device can be provided. An electronic device including the semiconductor device or the module can be provided.

Note that the description of these effects does not preclude the existence of other effects. One embodiment of the present invention does not have to have all the effects listed above. Other effects will be apparent from and can be derived from the description of the specification, the drawings, the claims, and the like.

BRIEF DESCRIPTION OF DRAWINGS

FIGS. 7A to 7C illustrate a top view and cross-sectional structures of a transistor of one embodiment.

FIGS. 8A to 8C illustrate a top view and cross-sectional structures of a transistor of one embodiment.

BEST MODE FOR CARRYING OUT THE INVENTION

Figure 1:
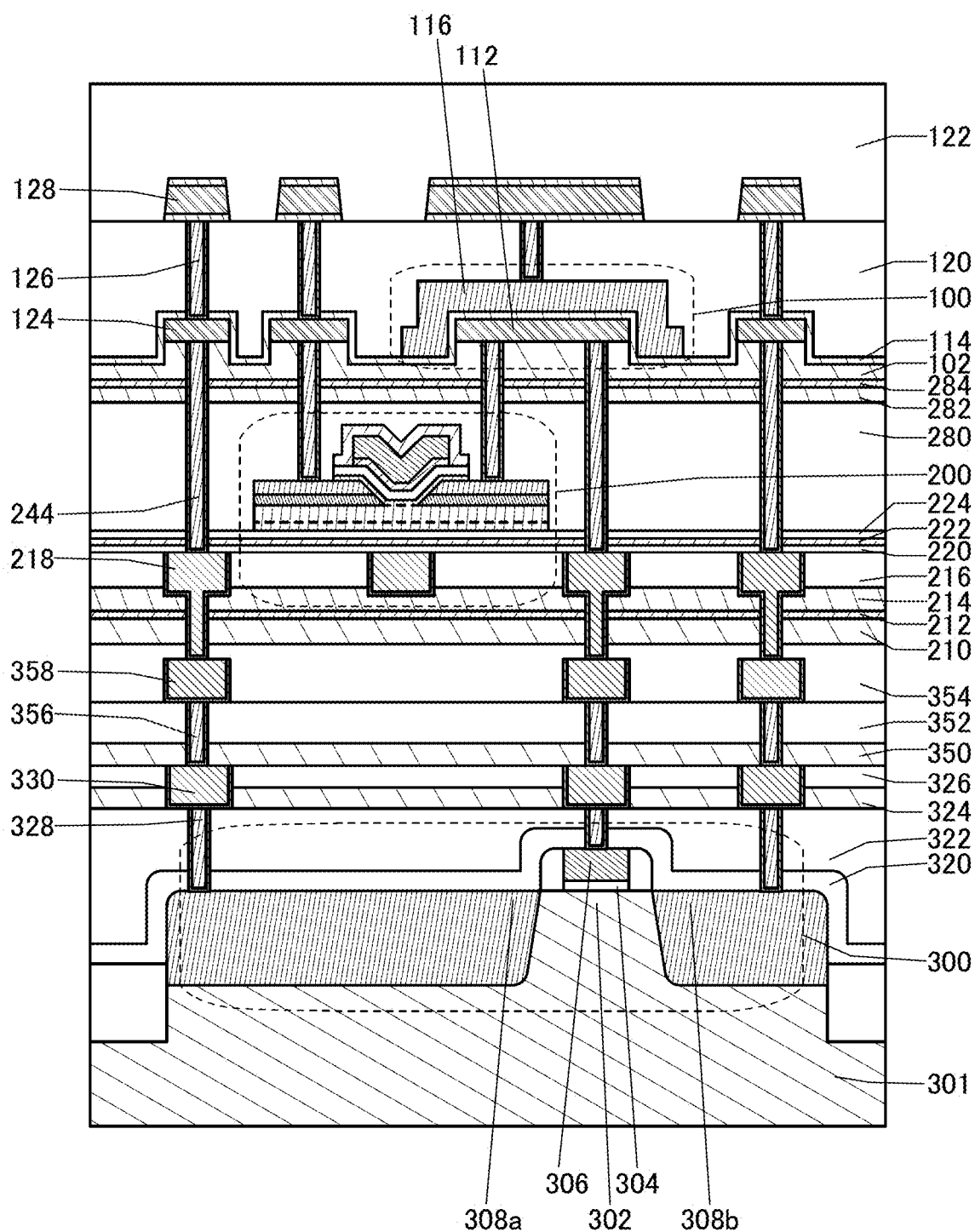
FIG. 1 illustrates a cross-sectional structure of a semiconductor device of one embodiment.

Hereinafter, embodiments will be described with reference to drawings. Note that the embodiments can be implemented with various modes, and it will be readily appreciated by those skilled in the art that modes and details can be changed in various ways without departing from the spirit and scope of the present invention. Thus, the present invention should not be interpreted as being limited to the following description of the embodiments.

In the drawings, the size, the layer thickness, or the region is exaggerated for clarity in some cases. Therefore, the size, the layer thickness, or the region is not limited to the illustrated scale. Note that the drawings are schematic views showing ideal examples, and embodiments of the present invention are not limited to shapes or values shown in the drawings. In the drawings, the same portions or portions having similar functions are denoted by the same reference numerals in different drawings, and explanation thereof will not be repeated. Further, the same hatching pattern is applied to portions having similar functions, and the portions are not especially denoted by reference numerals in some cases.

Note that the ordinal numbers such as "first", "second", and the like in this specification and the like are used for convenience and do not denote the order of steps or the stacking order of layers. Therefore, for example, description can be made even when "first" is replaced with "second" or "third", as appropriate. In addition, the ordinal numbers in this specification and the like are not necessarily the same as those which specify one embodiment of the present invention.

In this specification, terms for describing arrangement, such as "over", "above", "under", and "below", are used for convenience in describing a positional relation between components with reference to drawings. Furthermore, the positional relationship between components is changed as appropriate in accordance with a direction in which each component is described. Thus, there is no limitation on terms used in this specification, and description can be made appropriately depending on the situation.

The "semiconductor device" in this specification and the like means all devices which can operate by utilizing semiconductor characteristics. A semiconductor element such as a transistor, a semiconductor circuit, an arithmetic device, and a memory device are each an embodiment of a semiconductor device. An imaging device, a display device, a liquid crystal display device, a light-emitting device, an electro-optical device, a power generation device (including a thin film solar cell, an organic thin film solar cell, and the like), and an electronic device may each include a semiconductor device.

In this specification and the like, a transistor is an element having at least three terminals of a gate, a drain, and a source. The transistor has a channel region between a drain (a drain terminal, a drain region, or a drain electrode) and a source (a source terminal, a source region, or a source electrode), and current can flow through the drain, the channel region, and the source. Note that in this specification and the like, a channel region refers to a region through which current mainly flows.

Furthermore, functions of a source and a drain might be switched when transistors having different polarities are employed or a direction of current flow is changed in circuit operation, for example. Therefore, the terms "source" and "drain" can be switched in this specification and the like.

Note that in this specification and the like, a silicon oxynitride film refers to a film in which the proportion of oxygen is higher than that of nitrogen. The silicon oxynitride film preferably contains oxygen, nitrogen, silicon, and hydrogen at concentrations ranging from 55 atomic % to 65 atomic %, 1 atomic % to 20 atomic %, 25 atomic % to 35 atomic %, and 0.1 atomic % to 10 atomic %, respectively. A silicon nitride oxide film refers to a film in which the proportion of nitrogen is higher than that of oxygen. The silicon nitride oxide film preferably contains nitrogen, oxygen, silicon, and hydrogen at concentration ranging from 55 atomic % to 65 atomic %, 1 atomic % to 20 atomic %, 25 atomic % to 35 atomic %, and 0.1 atomic % to 10 atomic %, respectively.

In this specification and the like, the terms "film" and "layer" can be interchanged with each other. For example, the term "conductive layer" can be changed into the term "conductive film" in some cases. Also, the term "insulating film" can be changed into the term "insulating layer" in some cases.

In this specification and the like, the term "parallel" indicates that the angle formed between two straight lines is greater than or equal to $-10°$ and less than or equal to $10°$, and accordingly also includes the case where the angle is greater than or equal to $-5°$ and less than or equal to $5°$. In addition, the term "substantially parallel" indicates that the angle formed between two straight lines is greater than or equal to $-30°$ and less than or equal to $30°$. The terms "perpendicular" indicates that the angle formed between two straight lines is greater than or equal to $80°$ and less than or equal to $100°$, and accordingly also includes the case where the angle is greater than or equal to $85°$ and less than or equal to $95°$. In addition, the term "substantially perpendicular" indicates that the angle formed between two straight lines is greater than or equal to $60°$ and less than or equal to $120°$.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, and a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

Embodiment 1

In this embodiment, one mode of a semiconductor device is described with reference to FIGS. 1 to 9C and FIGS. 22A and 22B.

Structure Examples

Figure 22A:
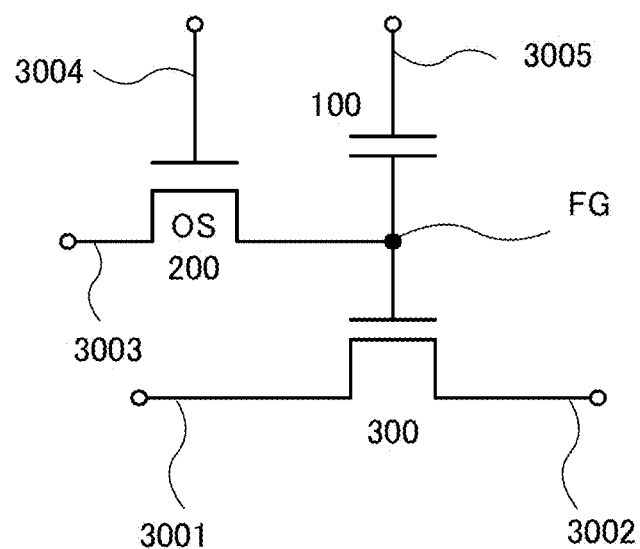
FIGS. 22A and 22B are circuit diagrams of semiconductor devices of one embodiment.

Examples of a semiconductor device (memory device) including a capacitor of one embodiment of the present invention are shown in FIGS. 1 to 9C and FIGS. 22A and 22B. Note that FIG. 22A is a circuit diagram of FIGS. 1 to 4. FIGS. 5A and 5B and FIGS. 6A to 6C show end portions of regions where semiconductor devices shown in FIGS. 1 to 4 are formed. FIGS. 7A to 7C, FIGS. 8A to 8C, and FIGS. 9A to 9C show structure examples of a transistor that can be used in FIGS. 1 to 3.

<Circuit Configuration of Semiconductor Device>

Semiconductor devices shown in FIGS. 1 to 4 and FIG. 22A each include a transistor 300, a transistor 200, and a capacitor 100.

The transistor 200 is a transistor in which a channel is formed in a semiconductor layer including an oxide semiconductor. Since the off-state current of the transistor 200 is small, by using the transistor 200 in a semiconductor device (memory device), stored data can be retained for a long time. In other words, it is possible to obtain a semiconductor device (memory device) which does not require refresh operation or has an extremely low frequency of the refresh operation, which leads to a sufficient reduction in power consumption.

In FIG. 22A, a first wiring 3001 is electrically connected to a source of the transistor 300. A second wiring 3002 is electrically connected to a drain of the transistor 300. A third wiring 3003 is electrically connected to one of a source and a drain of the transistor 200. A fourth wiring 3004 is electrically connected to a gate of the transistor 200. A gate of the transistor 300 and the other of the source and the drain of the transistor 200 are electrically connected to one electrode of the capacitor 100. A fifth wiring 3005 is electrically connected to the other electrode of the capacitor 100.

The semiconductor device in FIG. 22A has a feature that the potential of the gate of the transistor 300 can be retained, and thus enables writing, retaining, and reading of data as follows.

Writing and retaining of data will be described. First, the potential of the fourth wiring 3004 is set to a potential at which the transistor 200 is turned on, so that the transistor 200 is turned on. Accordingly, the potential of the third wiring 3003 is supplied to a node FG where the gate of the transistor 300 and the one electrode of the capacitor 100 are electrically connected to each other. That is, a predetermined charge is supplied to the gate of the transistor 300 (writing). Here, one of two kinds of charges providing different potential levels (hereinafter referred to as a low-level charge and a high-level charge) is supplied. After that, the potential of the fourth wiring 3004 is set to a potential at which the transistor 200 is turned off, so that the transistor 200 is turned off. Thus, the charge is retained at the node FG (retaining).

In the case where the off-state current of the transistor 200 is low, the electric charge of the node FG is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the node FG. This is because in the case of using an n-channel transistor as the transistor 300, an apparent threshold voltage $V_{th\_H}$ at the time when the high-level electric charge is given to the gate of the transistor 300 is lower than an apparent threshold voltage $V_{th\_L}$ at the time when the low-level electric charge is given to the gate of the transistor 300. Here, an apparent threshold voltage refers to the potential of the fifth wiring 3005 which is needed to make the transistor 300 be in "on state". Thus, the potential of the fifth wiring 3005 is set to a potential $V_0$ which is between $V_{th\_H}$ and $V_{th\_L}$, whereby charge supplied to the node FG can be determined. For example, in the case where the high-level charge is supplied to the node FG in writing and the potential of the fifth wiring 3005 is $V_0$ ($>V_{th\_H}$), the transistor 300 is brought into "on state". On the other hand, in the case where the low-level charge is supplied to the node FG in writing, even when the potential of the fifth wiring 3005 is $V_0$ ($<V_{th\_L}$), the transistor 300 remains in "off state". Thus, the data retained in the node FG can be read by determining the potential of the second wiring 3002.

By arranging semiconductor devices each having the structure illustrated in FIG. 22A in a matrix, a memory device (memory cell array) can be formed.

Note that in the case where memory cells are arrayed, it is necessary that data of a desired memory cell is read in read operation. For example, a configuration in which only data of a desired memory cell can be read by supplying a potential at which the transistor 300 is in "off state" regardless of the charge supplied to the node FG, that is, a potential lower than $V_{th\_H}$ to the fifth wiring 3005 of memory cells from which data is not read may be employed. As another example, a configuration in which only data of a desired memory cell can be read by supplying a potential at which the transistor 300 is in "on state" regardless of the potential applied to the node FG, that is, a potential higher than $V_{th\_L}$ to the fifth wiring 3005 of memory cells from which data is not read may be employed.

<Circuit Configuration 2 of Semiconductor Device>

Figure 22B:
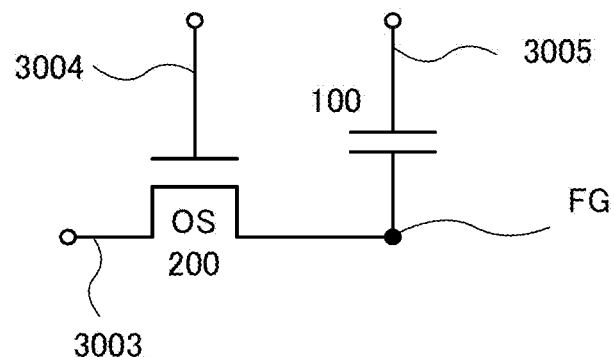

A semiconductor device in FIG. 22B is different from the semiconductor device in FIG. 22A in that the transistor 300 is not provided. Also in this case, data can be written and retained in a manner similar to that of the semiconductor device in FIG. 22A.

Reading of data in the semiconductor device in FIG. 22B is described. When the transistor 200 is brought into on state, the third wiring 3003 which is in a floating state and the capacitor 100 are brought into conduction, and the electric charge is redistributed between the third wiring 3003 and the capacitor 100. As a result, the potential of the third wiring 3003 is changed. The amount of change in the potential of the third wiring 3003 varies depending on the potential of the one electrode of the capacitor 100 (or the electric charge accumulated in the capacitor 100).

For example, the potential of the third wiring 3003 after the charge redistribution is $(C_B \times V_{B0} + C \times V)/(C_B + C)$, where V is the potential of the one electrode of the capacitor 100, C is the capacitance of the capacitor 100, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 100 is $V_1$ and $V_0$ ($V_1 > V_0$), the potential of the third wiring 3003 in the case of retaining the potential $V_1$ ($= (C_B \times V_{B0} + C \times V_1)/(C_B + C)$) is higher than the potential of the third wiring 3003 in the case of retaining the potential $V_0$ ($=(C_B \times V_{B0}+C\times V_0)/(C_B+C)$).

Then, by comparing the potential of the third wiring 3003 with a predetermined potential, data can be read.

In this case, a transistor including the oxide as a semiconductor may be used for a driver circuit for driving a memory cell, and a transistor including the oxide as a semiconductor may be stacked over the driver circuit as the transistor 200.

When including a transistor using an oxide semiconductor and having a low off-state current, the semiconductor device described above can retain stored data for a long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device, high voltage is not needed for writing data and deterioration of elements is less likely to occur. Unlike in a conventional nonvolatile memory, for example, it is not necessary to inject and extract electrons into and from a floating gate; thus, a problem such as deterioration of an insulator is not caused. That is, unlike a conventional nonvolatile memory, the semiconductor device of one embodiment of the present invention does not have a limit on the number of times data can be rewritten, and the reliability thereof is drastically improved. Furthermore, data is written depending on the state of the transistor (on or off), whereby high-speed operation can be easily achieved.

<Structure 1 of Semiconductor Device>

The semiconductor device of one embodiment of the present invention includes the transistor 300, the transistor 200, and the capacitor 100 as shown in FIG. 1. The transistor 200 is provided over the transistor 300, and the capacitor 100 is provided over the transistor 300 and the transistor 200.

The transistor 300 is provided over a substrate 301 and includes a conductor 306, an insulator 304, a semiconductor region 302 that is a part of the substrate 301, and low-resistance regions 308a and 308b functioning as a source region and a drain region.

The transistor 300 may be a p-channel transistor or an n-channel transistor.

It is preferable that a region of the semiconductor region 302 where a channel is formed, a region in the vicinity thereof, the low-resistance regions 308a and 308b functioning as a source region and a drain region, and the like contain a semiconductor such as a silicon-based semiconductor, more preferably single crystal silicon. Alternatively, a material including germanium (Ge), silicon germanium (SiGe), gallium arsenide (GaAs), gallium aluminum arsenide (GaAlAs), or the like may be contained. Silicon whose effective mass is controlled by applying stress to the crystal lattice and thereby changing the lattice spacing may be contained. Alternatively, the transistor 300 may be a high-electron-mobility transistor (HEMT) with GaAs, GaAlAs, or the like.

The low-resistance regions 308a and 308b contain an element which imparts n-type conductivity, such as arsenic or phosphorus, or an element which imparts p-type conductivity, such as boron, in addition to a semiconductor material used for the semiconductor region 302.

The conductor 306 functioning as a gate electrode can be formed using a semiconductor material such as silicon containing the element which imparts n-type conductivity, such as arsenic or phosphorus, or the element which imparts p-type conductivity, such as boron, or a conductive material such as a metal material, an alloy material, or a metal oxide material.

Note that a work function of a conductor is determined by a material of the conductor, whereby the threshold voltage can be adjusted. Specifically, it is preferable to use titanium nitride, tantalum nitride, or the like as the conductor. Furthermore, in order to ensure the conductivity and embeddability of the conductor, it is preferable to use a laminated layer of metal materials such as tungsten and aluminum as the conductor. In particular, tungsten is preferable in terms of heat resistance.

In the transistor 300 shown in FIG. 1, the semiconductor region 302 (part of the substrate 301) in which a channel is formed includes a protruding portion. Furthermore, the conductor 306 is provided to cover a side surface and a top surface of the semiconductor region 302 with the insulator 304 therebetween. Note that the conductor 306 may be formed using a material for adjusting the work function. The transistor 300 having such a structure is also referred to as a FIN transistor because the protruding portion of the semiconductor substrate is utilized. An insulator serving as a mask for forming the protruding portion may be provided in contact with a top surface of the protruding portion. Although the case where the protruding portion is formed by processing part of the semiconductor substrate is described here, a semiconductor film having a protruding shape may be formed by processing an SOI substrate.

Figure 2:
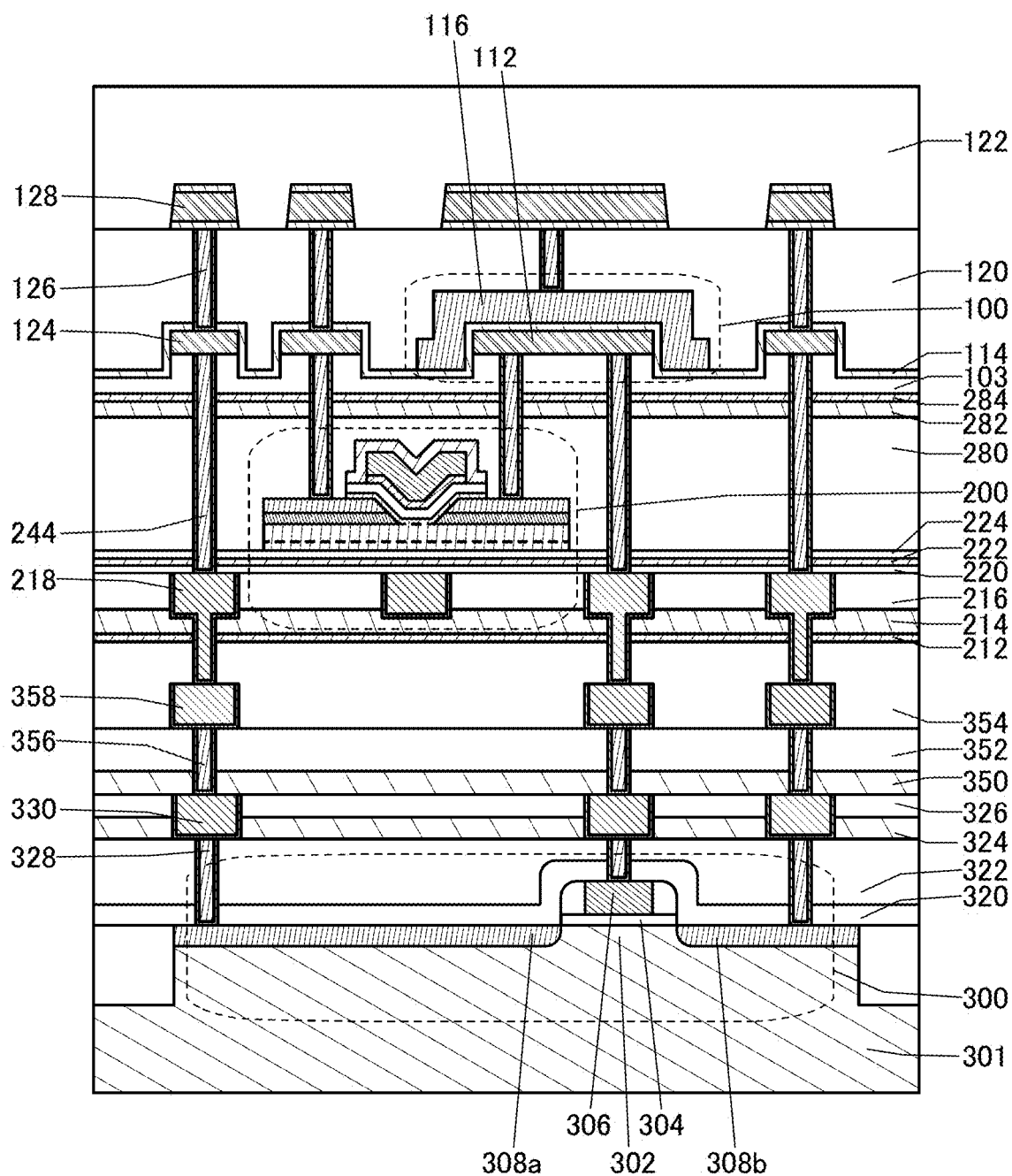
FIG. 2 illustrates a cross-sectional structure of a semiconductor device of one embodiment.

Note that the transistor 300 shown in FIG. 1 is just an example and is not limited to the structure shown therein; an appropriate transistor may be used in accordance with a circuit configuration or a driving method. For example, the transistor 300 may be a planar transistor as shown in FIG. 2. In the case of using the circuit configuration shown in FIG. 22B, the transistor 300 may be omitted.

An insulator 320, an insulator 322, an insulator 324, and an insulator 326 are stacked sequentially and cover the transistor 300.

The insulator 320, the insulator 322, the insulator 324, and the insulator 326 can be formed using, for example, silicon oxide, silicon oxynitride, silicon nitride oxide, silicon nitride, aluminum oxide, aluminum oxynitride, aluminum nitride oxide, aluminum nitride, or the like.

The insulator 322 functions as a planarization film for eliminating a level difference caused by the transistor 300 or the like underlying the insulator 322. A top surface of the insulator 322 may be planarized by planarization treatment using a chemical mechanical polishing (CMP) method or the like to increase the level of planarity.

The insulator 324 is preferably formed using, for example, a film having a barrier property that prevents hydrogen or impurities from diffusing from the substrate 301, the transistor 300, or the like into a region where the transistor 200 is formed.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

Note that the dielectric constant of the insulator 326 is preferably lower than that of the insulator 324. For example, the relative dielectric constant of the insulator 326 is preferably lower than 4, more preferably lower than 3. For example, the relative dielectric constant of the insulator 324 is preferably 0.7 times or less that of the insulator 326, more preferably 0.6 times or less that of the insulator 326. In the case where a material with a low dielectric constant is used as an interlayer film, the parasitic capacitance between wirings can be reduced.

A conductor 328, a conductor 330, and the like that are electrically connected to the capacitor 100 or the transistor 200 are embedded in the insulator 320, the insulator 322, the insulator 324, and the insulator 326. Note that the conductor 328 and the conductor 330 each function as a plug or a wiring. Note that a plurality of structures of conductors functioning as plugs or wirings are collectively denoted by the same reference numeral in some cases, as described later. Furthermore, in this specification and the like, a wiring and a plug electrically connected to the wiring may be a single component. That is, there are cases where a part of a conductor functions as a wiring and a part of a conductor functions as a plug.

As a material of each of plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is particularly preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, in FIG. 1, an insulator 350, an insulator 352, and an insulator 354 are stacked sequentially. Furthermore, a conductor 356 and a conductor 358 are formed in the insulator 350, the insulator 352, and the insulator 354. The conductor 356 and the conductor 358 each function as a plug or a wiring. Note that the conductor 356 and the conductor 358 can be formed using a material similar to that used for forming the conductor 328 and the conductor 330.

Note that for example, the insulator 350 is preferably formed using an insulator having a barrier property with respect to hydrogen, like the insulator 324. Furthermore, the conductor 356 and the conductor 358 preferably include a conductor having a barrier property with respect to hydrogen. The conductor having a barrier property with respect to hydrogen is formed particularly in an opening portion of the insulator 350 having a barrier property with respect to hydrogen. In such a structure, the transistor 300 and the transistor 200 can be separated by a layer having a barrier property, so that diffusion of hydrogen from the transistor 300 to the transistor 200 can be prevented.

Note that as the conductor having a barrier property with respect to hydrogen, tantalum nitride may be used, for example. By stacking tantalum nitride and tungsten, which has high conductivity, diffusion of hydrogen from the transistor 300 can be prevented while the conductivity of a wiring is ensured. In this case, a tantalum nitride layer having a barrier property with respect to hydrogen is preferably in contact with the insulator 350 having a barrier property with respect to hydrogen.

An insulator 210, an insulator 212, and an insulator 214 are stacked sequentially over the insulator 354. A material having a barrier property with respect to oxygen or hydrogen is preferably used for one or all of the insulator 210, the insulator 212, and the insulator 214.

The insulator 210 is preferably formed using, for example, a film having a barrier property that prevents hydrogen or impurities from diffusing from a region where the substrate 301 or the transistor 300 is formed or the like into a region where the transistor 200 is formed. Therefore, the insulator 210 can be formed using a material similar to that used for forming the insulator 324.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

As the insulator 212 and the insulator 214, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

An insulator 216 is provided over the insulator 214. The insulator 216 can be formed using a material similar to that used for forming the insulator 320. For example, a silicon oxide film, a silicon oxynitride film, or the like can be used as the insulator 216.

A conductor 218, a conductor forming the transistor 200, and the like are embedded in the insulator 210, the insulator 212, the insulator 214, and the insulator 216. Note that the conductor 218 functions as a plug or a wiring that is electrically connected to the capacitor 100 or the transistor 300. The conductor 218 can be formed using a material similar to that used for forming the conductor 328 and the conductor 330.

In particular, the conductor 218 in a region in contact with the insulator 210, the insulator 212, and the insulator 214 is preferably a conductor having a barrier property with respect to oxygen, hydrogen, and water. In such a structure, the transistor 300 and the transistor 200 can be completely separated by a layer having a barrier property with respect to oxygen, hydrogen, and water, so that diffusion of hydrogen from the transistor 300 into the transistor 200 can be prevented.

The transistor 200 is provided over the insulator 214. Note that a structure of the transistor 200 is described below using FIGS. 7A to 7C, FIGS. 8A to 8C, and FIGS. 9A to 9C. Note that the transistor 200 shown in FIG. 1 is just an example and is not limited to the structure shown therein; an appropriate transistor may be used in accordance with a circuit configuration or a driving method.

An insulator 280 is provided over the transistor 200. The insulator 280 preferably includes oxide containing oxygen in excess of that in the stoichiometric composition. That is, in the insulator 280, a region containing oxygen in excess of that in the stoichiometric composition (hereinafter also referred to as excess-oxygen region) is preferably formed. In particular, in the case of using an oxide semiconductor in the transistor 200, when an insulator including an excess-oxygen region is provided as an interlayer film or the like in the vicinity of the transistor 200, oxygen vacancies in the transistor 200 are reduced, whereby the reliability can be improved.

As the insulator including the excess-oxygen region, specifically, an oxide material that releases part of oxygen by heating is preferably used. Oxide that releases part of oxygen by heating is an oxide film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

For example, as such a material, a material containing silicon oxide or silicon oxynitride is preferably used. Alternatively, a metal oxide can be used. Note that in this specification, "silicon oxynitride" refers to a material that contains oxygen at a higher proportion than nitrogen, and "silicon nitride oxide" refers to a material that contains nitrogen at a higher proportion than oxygen.

The insulator 280 covering the transistor 200 may function as a planarization film that covers a roughness thereunder.

An insulator 282, an insulator 284, and an insulator 102 are stacked sequentially over the insulator 280. A conductor 244 and the like are embedded in an insulator 220, an insulator 222, an insulator 224, the insulator 280, the insulator 282, the insulator 284, and the insulator 102. Note that the conductor 244 functions as a plug or a wiring that is electrically connected to the capacitor 100, the transistor 200, or the transistor 300. The conductor 244 can be formed using a material similar to that used for forming the conductor 328 and the conductor 330.

A material having a barrier property with respect to oxygen or hydrogen is preferably used for one or all of the insulator 282, the insulator 284, and the insulator 102. Thus, the insulator 282 can be formed using a material similar to that used for forming the insulator 214. The insulator 284 can be formed using a material similar to that used for forming the insulator 212. The insulator 102 can be formed using an insulator similar to that of the insulator 210.

As the insulator 282 and the insulator 284, metal oxide such as aluminum oxide, hafnium oxide, or tantalum oxide is preferably used, for example.

In particular, aluminum oxide has an excellent blocking effect that prevents permeation of oxygen and impurities such as hydrogen and moisture which cause a change in electrical characteristics of the transistor. Accordingly, the use of aluminum oxide can prevent entry of impurities such as hydrogen and moisture into the transistor 200 in and after a manufacturing process of the transistor. In addition, release of oxygen from oxide in the transistor 200 can be prevented. Therefore, aluminum oxide is suitably used as a protective film for the transistor 200.

The insulator 102 is preferably formed using, for example, a film having a barrier property that prevents hydrogen or impurities from diffusing from a region where the capacitor 100 is formed into a region where the transistor 200 is formed. Therefore, the insulator 102 can be formed using a material similar to that used for forming the insulator 324.

As an example of the film having a barrier property with respect to hydrogen, silicon nitride formed by a CVD method can be used. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

Therefore, a structure can be obtained in which the transistor 200 and the insulator 280 including the excess-oxygen region are positioned between a stacked-layer structure of the insulator 210, the insulator 212, and the insulator 214 and a stacked-layer structure of the insulator 282, the insulator 284, and the insulator 102. The insulator 210, the insulator 212, the insulator 214, the insulator 282, the insulator 284, and the insulator 102 have a barrier property that prevents diffusion of oxygen or impurities such as hydrogen and water.

Oxygen released from the insulator 280 and the transistor 200 can be prevented from diffusing into a layer where the capacitor 100 is formed or a layer where the transistor 300 is formed. Furthermore, impurities such as hydrogen and water can be prevented from diffusing from a layer over the insulator 282 and a layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

Figure 5A:
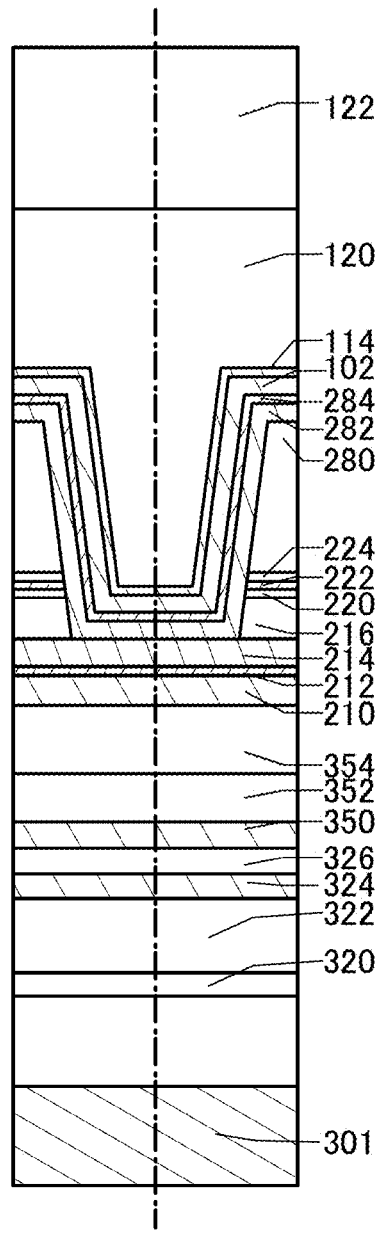
FIGS. 5A and 5B illustrate cross-sectional structures of semiconductor devices of one embodiment.
Figure 5B:
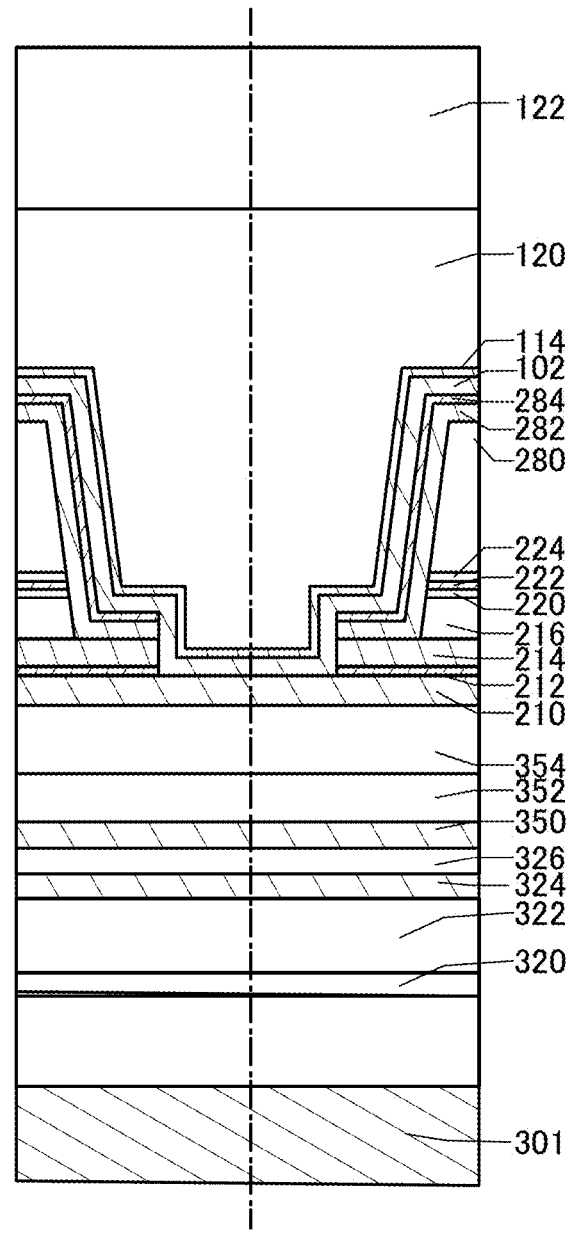

FIGS. 5A and 5B are each a cross-sectional view in the vicinity of a scribe line.

For example, as shown in FIG. 5A, an opening is provided in the insulator 216, the insulator 220, the insulator 222, the insulator 224, and the insulator 280 in the vicinity of a region overlapping with a scribe line (shown by a dashed-dotted line in FIG. 5A) formed in an edge of a memory cell including the transistor 200. The insulator 282, the insulator 284, and the insulator 102 are provided to cover side surfaces of the insulator 216, the insulator 220, the insulator 222, the insulator 224, and the insulator 280. Therefore, in the opening, the insulator 214 and the insulator 282 are in contact with each other, and a stacked-layer structure of the insulator 210, the insulator 212, the insulator 214, the insulator 282, the insulator 284, and the insulator 102 is obtained. At this time, in the case where the insulator 214 and the insulator 282 are formed using the same material and the same method, adhesion therebetween in the stacked-layer structure is increased.

In the structure, the insulator 216, the insulator 220, the insulator 222, the insulator 224, and the insulator 280 can be enclosed with the insulator 210, the insulator 212, the insulator 214, the insulator 282, the insulator 284, and the insulator 102. The insulator 210, the insulator 212, the insulator 214, the insulator 282, the insulator 284, and the insulator 102 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

As another example, as shown in FIG. 5B, an opening is provided in the insulator 216, the insulator 220, the insulator 222, the insulator 224, and the insulator 280 in the vicinity of a region overlapping with a scribe line (shown by a dashed-dotted line in FIG. 5B). The insulator 282 and the insulator 284 are provided to cover the side surfaces of the insulator 216, the insulator 220, the insulator 222, the insulator 224, and the insulator 280. In addition, an opening is provided in the insulator 212, the insulator 214, the insulator 282, and the insulator 284, and the insulator 102 is provided to cover side surfaces of the insulator 212, the insulator 214, the insulator 282, and the insulator 284.

That is, in the opening, the insulator 214 and the insulator 282 are in contact with each other. Furthermore, on the side outer than that, the insulator 210 and the insulator 102 are in contact with each other. At this time, by forming the insulator 214 and the insulator 282 using the same material and the same method, a stacked-layer structure in which adhesion therebetween is high is obtained. Furthermore, by forming the insulator 210 and the insulator 102 using the same material and the same method, a stacked-layer structure in which adhesion therebetween is high is obtained.

In such a structure, the transistor 200 and the insulator 280 can be enclosed tightly. Thus, the oxide where a channel is formed in the transistor 200 can be an oxide semiconductor with a low density of defect states and stable characteristics. That is, a change in the electrical characteristics of the transistor 200 can be prevented and the reliability can be improved.

The capacitor 100 and a conductor 124 are provided over the insulator 284. The capacitor 100 is provided over the insulator 102 and includes a conductor 112, an insulator 114, and a conductor 116. Note that the conductor 124 functions as a plug or a wiring that is electrically connected to the capacitor 100, the transistor 200, or the transistor 300.

The conductor 112 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 112 is formed concurrently with another component such as a conductor, Cu (copper), Al (aluminum), or the like which is a low-resistance metal material may be used.

Note that the conductor 124 can be formed using a material similar to that used for forming the conductor 112 functioning as an electrode of the capacitor.

The insulator 114 is provided over the conductor 124 and the conductor 112. The insulator 114 can have a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

In the case where the insulator 114 has a stacked-layer structure, for example, the stacked-layer structure is preferably formed using a high dielectric constant (high-k) material such as aluminum oxide and a material with high dielectric strength such as silicon oxynitride. In the capacitor 100 having the structure, a sufficient capacitance can be provided because of a high dielectric constant (high-k) insulator, and the dielectric strength can be increased and the electrostatic breakdown can be prevented because of an insulator with high dielectric strength.

The conductor 116 is provided over the conductor 112 with the insulator 114 therebetween. Note that the conductor 116 can be formed using a conductive material such as a metal material, an alloy material, or a metal oxide material. It is preferable to use a high-melting-point material which has both heat resistance and conductivity, such as tungsten or molybdenum, and it is particularly preferable to use tungsten. In the case where the conductor 116 is formed concurrently with another component such as a conductor, Cu (copper), Al (aluminum), or the like which is a low-resistance metal material may be used.

For example, as shown in FIG. 1, the insulator 114 is provided to cover a top surface and a side surface of the conductor 112. Furthermore, the conductor 116 is provided to cover the top surface and the side surface of the conductor 112 with the insulator 114 therebetween. In the structure, the conductor 116 faces the side surface of the conductor 112 with the insulator 114 therebetween. That is, a capacitance is formed also on the side surface of the conductor 112, so that a capacitance per projected area of a capacitor can be increased. Thus, the semiconductor device can be reduced in area, highly integrated, and miniaturized.

An insulator 120 and an insulator 122 are stacked sequentially over the conductor 116 and the insulator 114. A conductor 126 is embedded in the insulator 120 and the insulator 114. A conductor 128 is embedded in the insulator 122. Note that the conductor 126 and the conductor 128 each function as a plug or a wiring that is electrically connected to the transistor 200 or the transistor 300. The conductor 126 can be formed using a material similar to that used for forming the conductor 328 and the conductor 330.

The insulator 120 and the insulator 122 can be formed using a material similar to that used for forming the insulator 320. The insulator 120 covering the capacitor 100 may function as a planarization film that covers a roughness thereunder.

Figure 38:
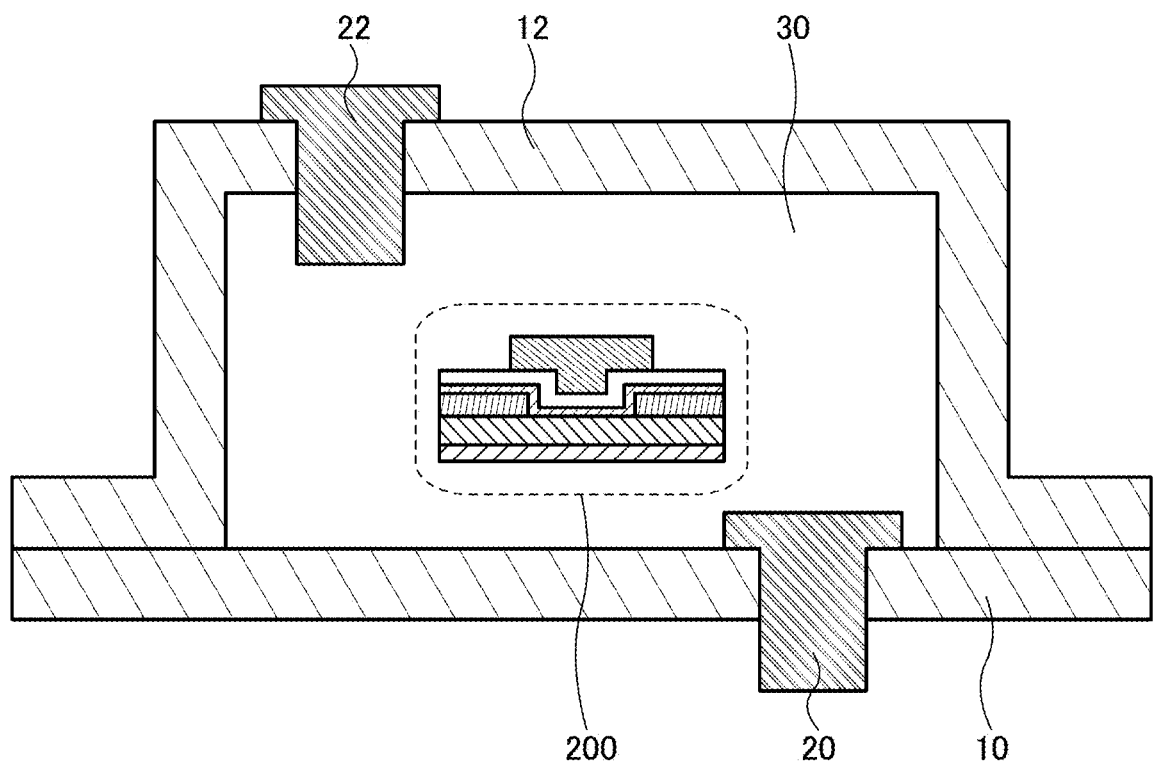
FIG. 38 illustrates a concept of a semiconductor device of the present invention.

The above is the description of the structure example. That is, as shown in FIG. 38, the transistor 200 and an insulator 30 are surrounded by an insulator 10, an insulator 12, a conductor 20, and a conductor 22 in this embodiment.

Here, the insulator 10 corresponds to the insulator 210, the insulator 212, and the insulator 216 shown in FIG. 1. The insulator 12 corresponds to the insulator 282 and the insulator 284 shown in FIG. 1. The insulator 30 corresponds to the insulator 280 shown in FIG. 1. The conductor 20 corresponds to the conductor 218 shown in FIG. 1. The conductor 22 corresponds to the conductor 244 shown in FIG. 1.

That is, the insulator 30 contains excess oxygen. The insulator 10, the insulator 12, the conductor 20, and the conductor 22 have a barrier property with respect to oxygen, hydrogen, and water. The conductor 20 or the conductor 22 is electrically connected to the capacitor 100 or the transistor 300.

The transistor 200 and the insulator 30 containing excess oxygen are sealed with the conductor having a barrier property or the insulator having a barrier property. Thus, excess oxygen contained in the insulator 30 is diffused into only a sealed region without being released to the outside of the insulator 10, the insulator 12, the conductor 20, and the conductor 22, and is therefore supplied to the transistor 200 efficiently. Moreover, hydrogen and water as impurities in the outside of the insulator 10, the insulator 12, the conductor 20, and the conductor 22 can be prevented from diffusing into the transistor 200.

With the use of the structure, a change in electrical characteristics can be prevented and reliability can be improved in a semiconductor device including a transistor including an oxide semiconductor. Furthermore, a transistor including an oxide semiconductor with high on-state current can be provided. Furthermore, a transistor including an oxide semiconductor with low off-state current can be provided. Furthermore, a semiconductor device with low power consumption can be provided.

Modification Example 1

As a modification example of this embodiment, the insulator 210 may be omitted as shown in FIG. 2. An insulator 103 may be used instead of the insulator 102. The insulator 103 preferably has a dielectric constant lower than that of the insulator 102, like the insulator 326. For example, the relative dielectric constant of the insulator 103 is preferably lower than 4, more preferably lower than 3. For example, the relative dielectric constant of the insulator 103 is preferably 0.7 times or less that of the insulator 102, more preferably 0.6 times or less that of the insulator 102. The use of a material with a low dielectric constant in an interlayer film can reduce the parasitic capacitance between wirings.

A structure can be obtained in which the transistor 200 and the insulator 280 including the excess-oxygen region are provided between a stacked-layer structure of the insulator 212 and the insulator 214 and a stacked-layer structure of the insulator 282 and the insulator 284. The insulator 212, the insulator 214, the insulator 282, and the insulator 284 have a barrier property that prevents diffusion of oxygen or and impurities such as hydrogen and water.

Accordingly, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from the layer over the insulator 282 and the layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

Figure 6A:
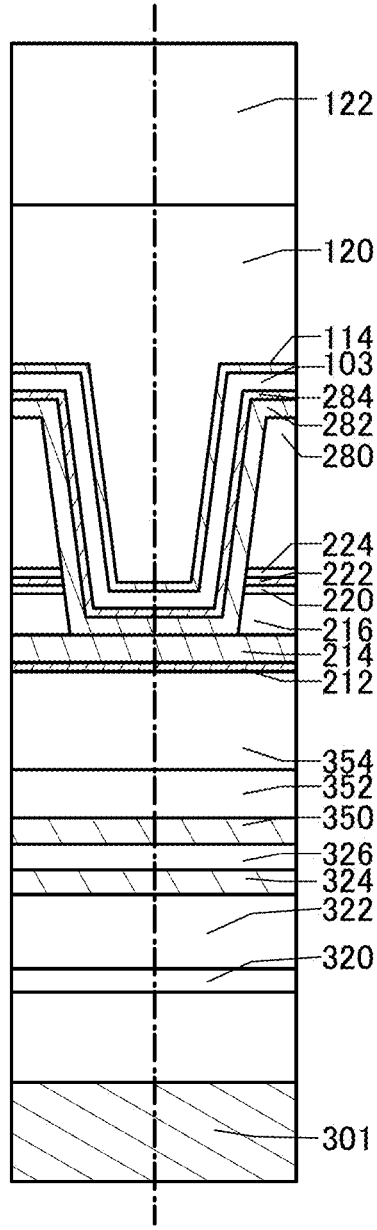
FIGS. 6A to 6C illustrate cross-sectional structures of semiconductor devices of one embodiment.

FIG. 6A is a cross-sectional view in the vicinity of a scribe line in this modification example.

For example, as shown in FIG. 6A, in the vicinity of a region overlapping with a scribe line (shown by a dashed-dotted line in FIG. 6A), the insulator 214 and the insulator 282 are in contact with each other and a stacked-layer structure of the insulator 212, the insulator 214, the insulator 282, and the insulator 284 is obtained. At this time, in the case where the insulator 214 and the insulator 282 are formed using the same material and the same method, adhesion therebetween in the stacked-layer structure is increased.

In the structure, the insulator 216, the insulator 220, the insulator 222, the insulator 224, and the insulator 280 can be enclosed with the insulator 212, the insulator 214, the insulator 282, and the insulator 284. The insulator 212, the insulator 214, the insulator 282, and the insulator 284 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 214. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Modification Example 2

Figure 3:
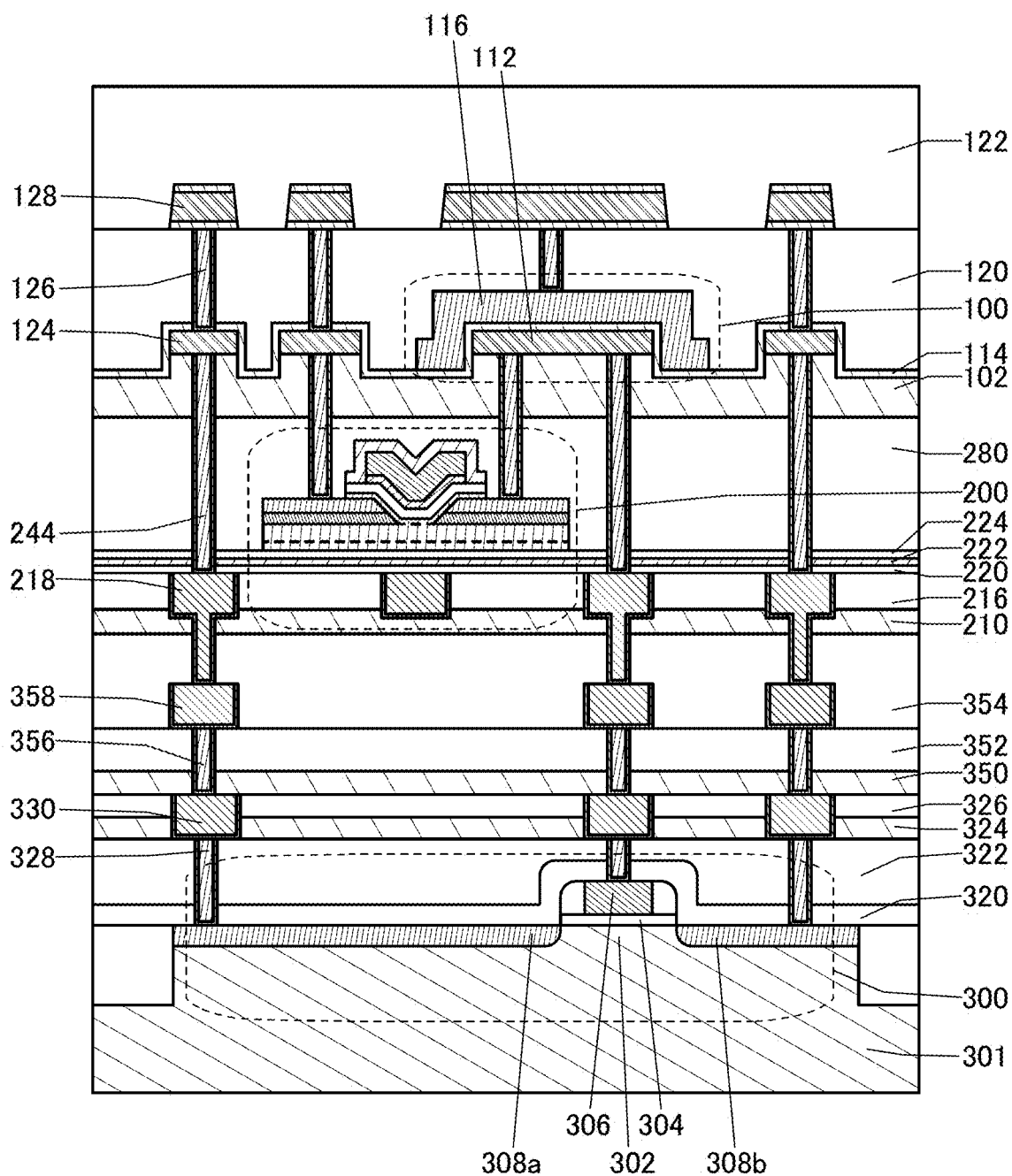
FIG. 3 illustrates a cross-sectional structure of a semiconductor device of one embodiment.

As a modification example of this embodiment, the insulator 212, the insulator 214, the insulator 282, and the insulator 284 may be omitted as shown in FIG. 3.

A structure can be obtained in which the transistor 200 and the insulator 280 including the excess-oxygen region are positioned between the insulator 210 and the insulator 102. The insulator 210 and the insulator 102 have a barrier property that prevents diffusion of oxygen or impurities such as hydrogen and water.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from the layer over the insulator 282 and the layer under the insulator 214 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

Figure 6B:
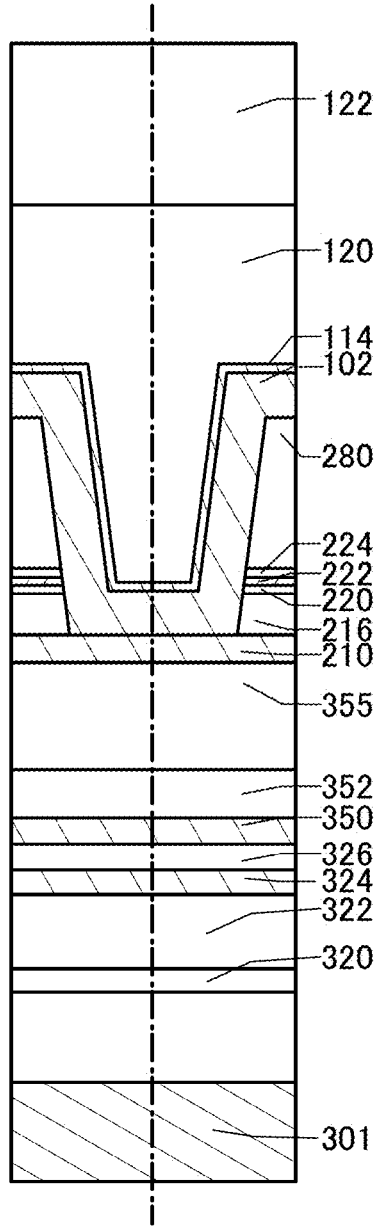

FIG. 6B is a cross-sectional view in the vicinity of a scribe line in this modification example.

For example, as shown in FIG. 6B, in the vicinity of a region overlapping with a scribe line (shown by a dashed-dotted line in FIG. 6B), the insulator 210 and the insulator 102 are in contact with each other and a stacked-layer structure of the insulator 210 and the insulator 102 is obtained. At this time, in the case where the insulator 210 and the insulator 102 are formed using the same material and the same method, adhesion therebetween in the stacked-layer structure is increased.

The insulator 216, the insulator 220, the insulator 222, the insulator 224, and the insulator 280 can be enclosed with the insulator 210 and the insulator 102. The insulator 210 and the insulator 102 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, excess oxygen in the insulator 280 can be prevented from diffusing into the outside of the insulator 282 and the insulator 210. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Modification Example 3

Figure 4:
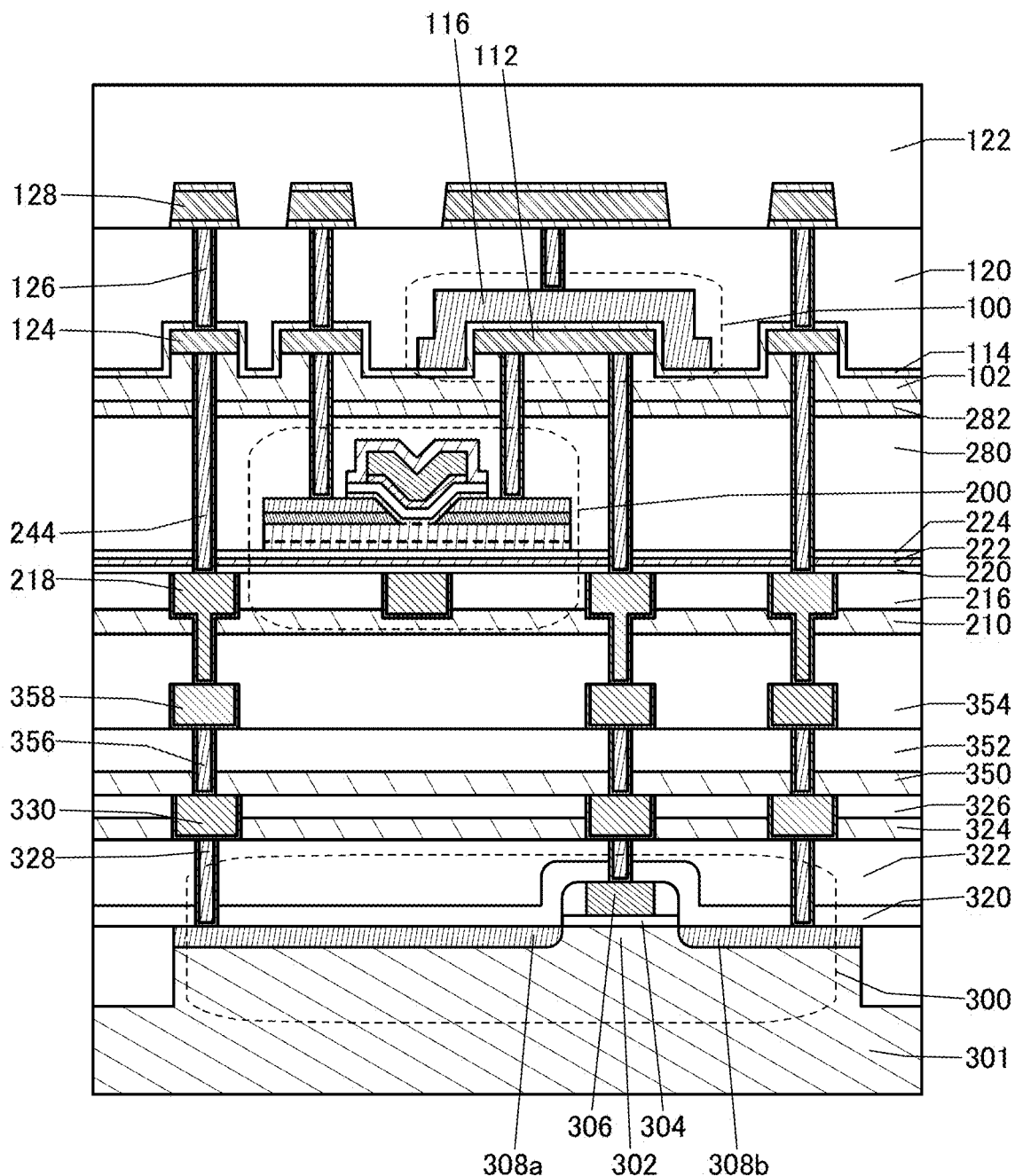
FIG. 4 illustrates a cross-sectional structure of a semiconductor device of one embodiment.

As a modification example of this embodiment, the insulator 212, the insulator 214, and the insulator 284 may be omitted as shown in FIG. 4.

A structure can be obtained in which the transistor 200 and the insulator 280 including the excess-oxygen region are positioned between the insulator 210 and a stacked-layer structure of the insulator 282 and the insulator 102. The insulator 210, the insulator 282, and the insulator 102 have a barrier property that prevents diffusion of oxygen or impurities such as hydrogen and water.

Thus, oxygen released from the insulator 280 and the transistor 200 can be prevented from diffusing into the layer where the capacitor 100 is formed or the layer where the transistor 300 is formed. Furthermore, impurities such as hydrogen and water can be prevented from diffusing from the layer over the insulator 282 and the layer under the insulator 210 into the transistor 200.

That is, oxygen can be efficiently supplied from the excess-oxygen region of the insulator 280 to oxide where a channel is formed in the transistor 200, so that oxygen vacancies can be reduced. Moreover, oxygen vacancies can be prevented from being formed by impurities in the oxide where a channel is formed in the transistor 200. Thus, the oxide where a channel is formed in the transistor 200 can be an oxide semiconductor with a low density of defect states and stable characteristics. That is, a change in electrical characteristics of the transistor 200 can be prevented and the reliability can be improved.

Figure 6C:
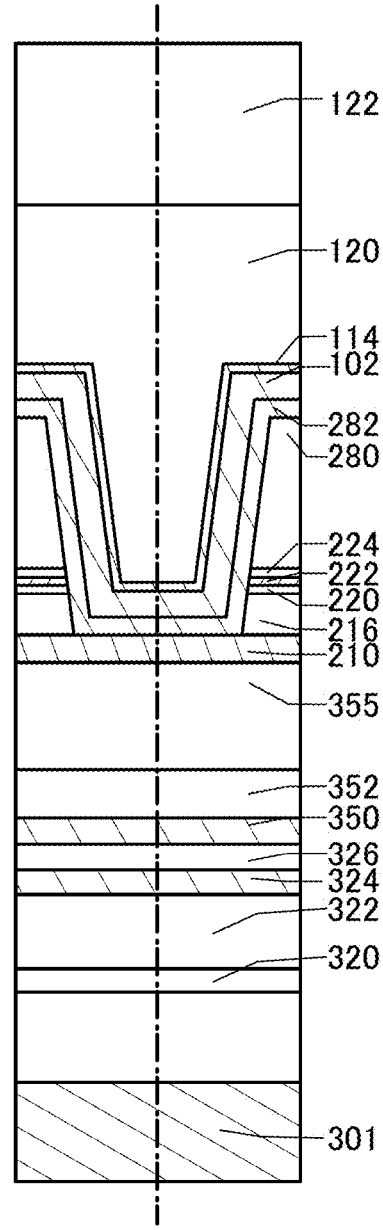

FIG. 6C is a cross-sectional view in the vicinity of a scribe line in this modification example.

For example, as shown in FIG. 6C, in the vicinity of a region overlapping with a scribe line (shown by a dashed-dotted line in FIG. 6C), the insulator 210 and the insulator 282 are in contact with each other and a stacked-layer structure of the insulator 210, the insulator 282, and the insulator 102 is obtained.

In the structure, the insulator 216, the insulator 220, the insulator 222, the insulator 224, and the insulator 280 can be enclosed with the insulator 210, the insulator 282, and the insulator 102. The insulator 210, the insulator 282, and the insulator 102 have a function of preventing diffusion of oxygen, hydrogen, and water, and therefore, entry and diffusion of hydrogen or water from the side surfaces of the insulator 216, the insulator 220, the insulator 222, the insulator 224, and the insulator 280 into the transistor 200 can be prevented even when the semiconductor device described in this embodiment is subjected to scribing.

Furthermore, in the structure, excess oxygen in the insulator 280 can be prevented from diffusing into the outside of the insulator 282 and the insulator 210. Accordingly, excess oxygen in the insulator 280 is efficiently supplied to the oxide where a channel is formed in the transistor 200. The oxygen can reduce oxygen vacancies in the oxide where a channel is formed in the transistor 200. Thus, the oxide where a channel is formed in the transistor 200 can be an oxide semiconductor with a low density of defect states and stable characteristics. That is, a change in the electrical characteristics of the transistor 200 can be prevented and the reliability can be improved.

At least part of this embodiment can be implemented in combination with any of the other embodiments and the other examples described in this specification as appropriate.

Embodiment 2

In this embodiment, one mode of a semiconductor device is described with reference to FIGS. 7A to 7C, FIGS. 8A to 8C, and FIGS. 9A to 9C.

<Transistor Structure 1>

An example of a transistor of one embodiment of the present invention is described below. FIGS. 7A to 7C are a top view and cross-sectional views illustrating a transistor of one embodiment of the present invention. FIG. 7A is a top view. FIG. 7B is a cross-sectional view taken along dashed-dotted line X1-X2 in FIG. 7A. FIG. 7C is a cross-sectional view taken along dashed-dotted line Y1-Y2 in FIG. 7A. Note that for simplification of the drawing, some components in the top view in FIG. 7A are not illustrated.

The transistor 200 includes a conductor 205 and a conductor 260 that function as gate electrodes; the insulator 220, the insulator 222, the insulator 224, and an insulator 250 that function as gate insulating layers; an oxide 230 that includes a region where a channel is formed; a conductor 240a and a conductor 241a that function as one of a source and a drain; a conductor 240b and a conductor 241b that function as the other of the source and the drain; an insulator 270; and the insulator 280 that includes excess oxygen.

The oxide 230 includes an oxide 230a, an oxide 230b over the oxide 230a, and an oxide 230c over the oxide 230b. When the transistor 200 is turned on, a current flows (a channel is formed) mainly in the oxide 230b. Although current sometimes flows through a region in the vicinity of the interface (a mixed region in some cases) between the oxide 230b and the oxides 230a and 230c, the oxides 230a and 230c function as insulators at the other region.

Note that in the semiconductor device illustrated in FIGS. 7A to 7C, components having the same functions as the components in the semiconductor device illustrated in FIG. 1 are denoted by the same reference numerals.

The conductor 205 is formed using a metal film containing an element selected from molybdenum, titanium, tantalum, tungsten, aluminum, copper, chromium, neodymium, and scandium; a metal nitride film containing any of the above elements as its component (e.g., a titanium nitride film, a molybdenum nitride film, or a tungsten nitride film); or the like. Alternatively, a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added can also be used.

A two-layer structure of a conductor 205a and a conductor 205b is shown in FIGS. 7A to 7C, but the structure of the conductor 205 is not limited thereto, and a single-layer structure or a stacked-layer structure of three or more layers may be used. For example, a conductor having a barrier property with respect to hydrogen, e.g., tantalum nitride, may be used as the conductor 205a, and tungsten, which has high conductivity, may be stacked thereover as the conductor 205b. The use of the combination of the materials can prevent diffusion of hydrogen into the oxide 230 while conductivity of a wiring is ensured.

Each of the insulators 220 and 224 is preferably an insulator containing oxygen, such as a silicon oxide film or a silicon oxynitride film. In particular, the insulator 224 is preferably an insulator containing excess oxygen (containing oxygen in excess of that in the stoichiometric composition). In the case where such an insulator containing excess oxygen is provided in contact with an oxide in the transistor 200, oxygen vacancies in the oxide can be compensated. Note that the insulators 220 and 224 are not necessarily formed of the same material.

The insulator 222 preferably has a single-layer structure or a stacked-layer structure formed using an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate ($SrTiO_3$), or (Ba, Sr)$TiO_3$ (BST). Aluminum oxide, bismuth oxide, germanium oxide, niobium oxide, silicon oxide, titanium oxide, tungsten oxide, yttrium oxide, or zirconium oxide may be added to the insulator, for example. The insulator may be subjected to nitriding treatment. A layer of silicon oxide, silicon oxynitride, or silicon nitride may be stacked over the insulator.

Note that the insulator 222 may have a stacked-layer structure of two or more layers. In this case, the stacked layers are not necessarily formed of the same material but may be formed of different materials.

In the case where the insulator 222 including a high-k material is provided between the insulator 220 and the insulator 224, electrons can be trapped in the insulator 222 under specific conditions, and the threshold voltage can be increased. As a result, the insulator 222 is negatively charged in some cases.

For example, in the case where the insulator 220 and the insulator 224 are formed using silicon oxide and the insulator 222 is formed using a material having a lot of electron trap states such as hafnium oxide, aluminum oxide, or tantalum oxide, the state where the potential of the conductor 205 is higher than the potential of the source electrode and the drain electrode is kept at a temperature higher than the operating temperature or the storage temperature of the semiconductor device (e.g., at a temperature of 125° C. or higher and 450° C. or lower, typically 150° C. or higher and 300° C. or lower) for 10 milliseconds or longer, typically one minute or longer. Thus, electrons are moved from the oxide in the transistor 200 to the conductor 205. At this time, some of the moving electrons are trapped by the electron trap states of the insulator 222.

In the transistor in which a necessary amount of electrons is trapped by the electron trap states of the insulator 222, the threshold voltage is shifted in the positive direction. By controlling the voltage of the conductor 205, the amount of electrons to be trapped can be controlled, and thus the threshold voltage can be controlled. The transistor 200 having the structure is a normally-off transistor which is in a non-conduction state (also referred to as an off state) even when the gate voltage is 0 V.

The treatment for trapping the electrons may be performed in the manufacturing process of the transistor. For example, the treatment is preferably performed at any step before factory shipment, such as after the formation of a conductor connected to a source conductor or a drain conductor of the transistor, after the preceding process (wafer processing), after a wafer-dicing step, or after packaging. In either case, it is preferable that the transistor be not exposed to temperatures of 125° C. or higher for one hour or more after the process for trapping electrons.

When the insulators 220 and 224 are formed using silicon oxide and the insulator 222 is formed using hafnium oxide, the insulators 220 and 224 may be formed by a chemical vapor deposition method (including a CVD method and an atomic layer deposition (ALD) method) and the insulator 222 may be formed by a sputtering method. Note that using a sputtering method for the formation of the insulator 222 might easily crystallize the insulator 222 at low temperature to generate a large amount of fixed charges.

The threshold voltages can be controlled by appropriate adjustment of the thicknesses of the insulator 220, the insulator 222, and the insulator 224. A transistor having a low leakage current in an off state can be provided. A transistor with stable electrical characteristics can be provided. A transistor having a high on-state current can be provided. A transistor with a small subthreshold swing value can be provided. A highly reliable transistor can be provided.

The insulator 222 is preferably formed using a material having a barrier property with respect to oxygen and hydrogen. When such a material is used, release of oxygen from the oxide in the transistor 200 or entry of an impurity such as hydrogen from the outside can be prevented.

The oxide 230a, the oxide 230b, and the oxide 230c are formed using metal oxide such as In-M-Zn oxide (M is Al, Ga, Y, or Sn). In—Ga oxide or In—Zn oxide may be used as the oxide 230.

The oxide 230 according to the present invention is described below.

An oxide used as the oxide 230 preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide according to the present invention are described with reference to FIGS. 23A to 23C. Note that the proportion of oxygen atoms is not shown in FIGS. 23A to 23C. The terms of the atomic ratio of indium, the element M, and zinc contained in the oxide are denoted by [In], [M], and [Zn], respectively.

Figure 23A:
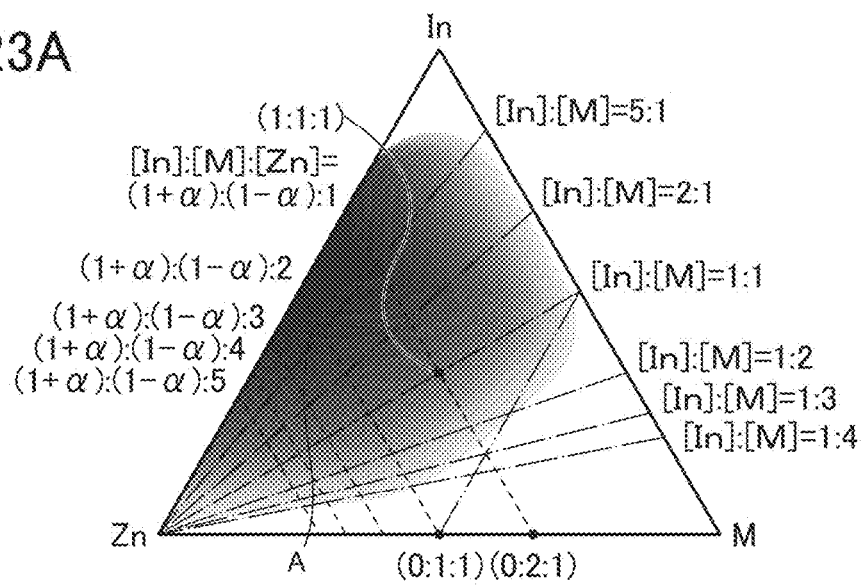
FIGS. 23A to 23C each illustrate an atomic ratio range of an oxide of the present invention.
Figure 23B:
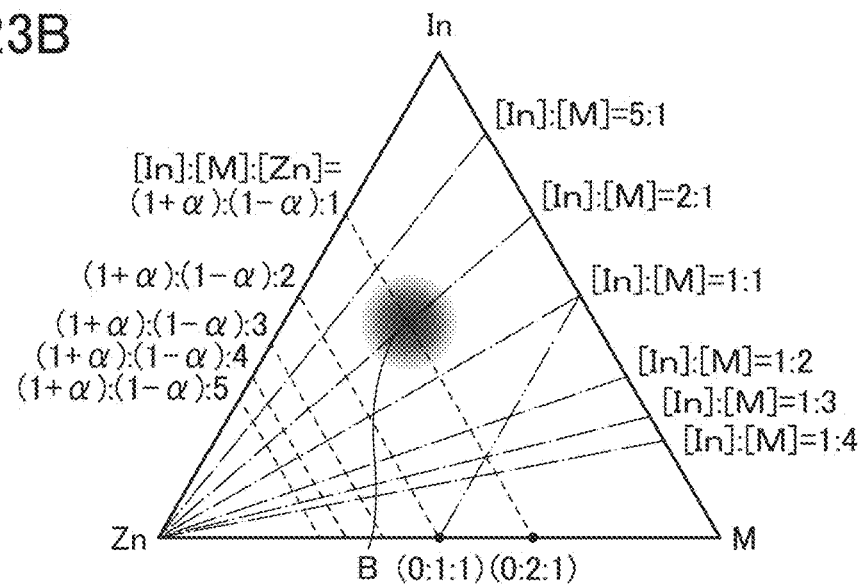
Figure 23C:
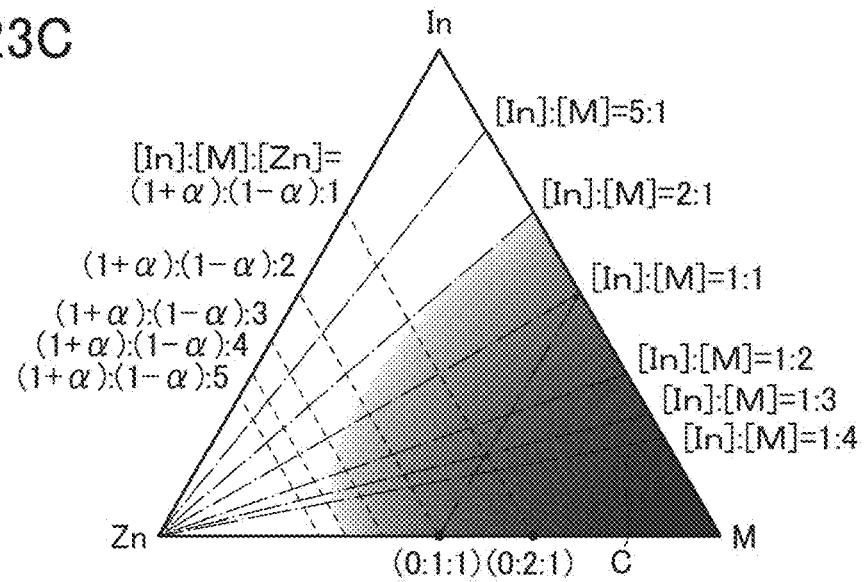

In FIGS. 23A to 23C, broken lines indicate a line where the atomic ratio [In]:[M]:[Zn] is $(1+\alpha):(1-\alpha):1$, where $-1 \leq \alpha \leq 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \geq 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

Dashed-double dotted lines indicate a line where the atomic ratio [In]:[M]:[Zn] is $(1+\gamma):2:(1-\gamma)$, where $-1 \leq \gamma \leq 1$. An oxide having the atomic ratio of [In]:[M]:[Zn]=0:2:1 or a neighborhood thereof in FIGS. 23A to 23C tends to have a spinel crystal structure.

FIGS. 23A and 23B show examples of the preferred ranges of the atomic ratio of indium, the element M, and zinc contained in an oxide in one embodiment of the present invention.

Figure 24:
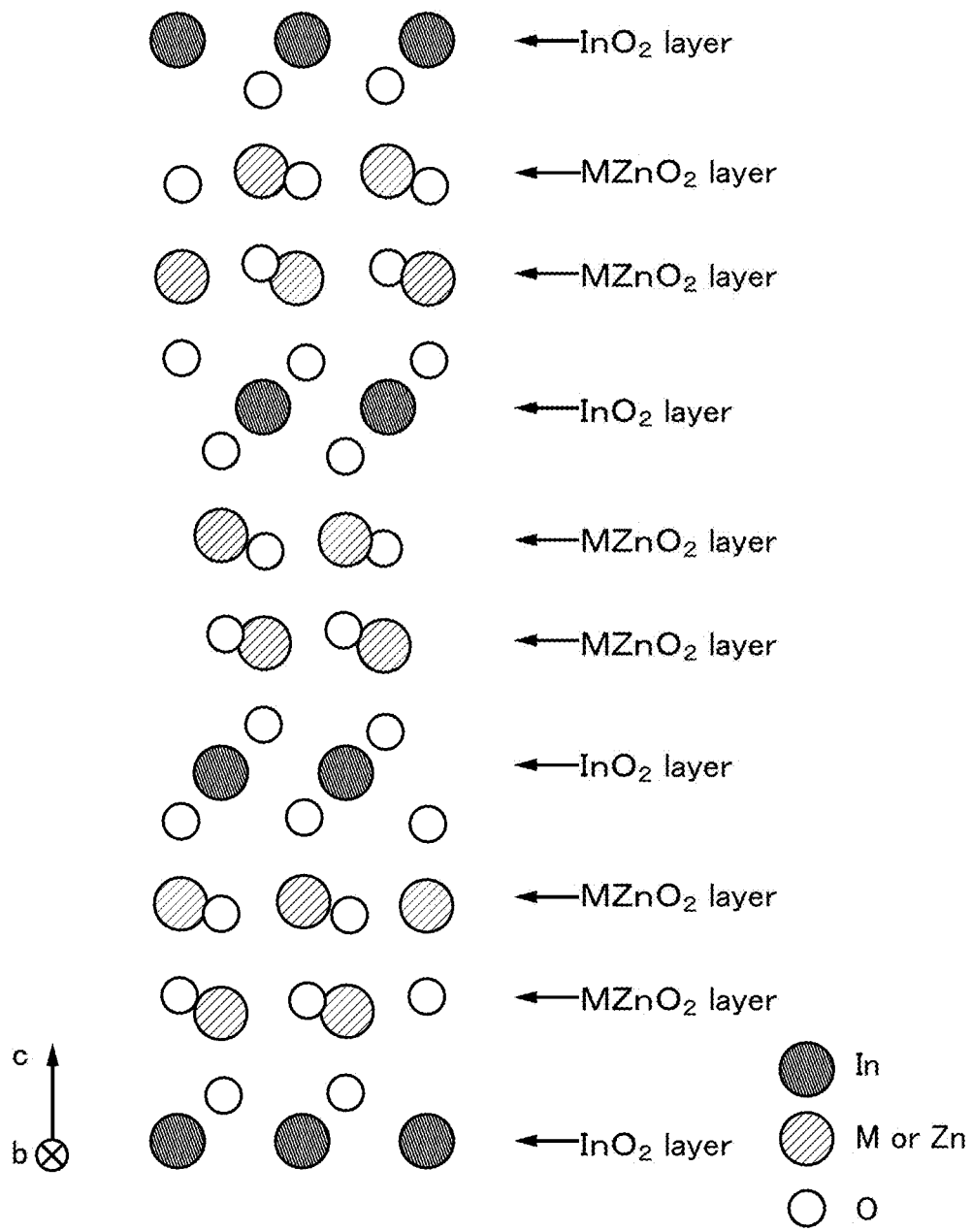
FIG. 24 illustrates a crystal structure of InMZnO$_4$.

FIG. 24 shows an example of the crystal structure of InMZnO$_4$ whose atomic ratio [In]:[M]:[Zn] is 1:1:1. The crystal structure shown in FIG. 24 is InMZnO$_4$ observed from a direction parallel to a b-axis. Note that a metal element in a layer that contains M, Zn, and oxygen (hereinafter, this layer is referred to as an "(M,Zn) layer") in FIG. 24 represents the element M or zinc. In that case, the proportion of the element M is the same as the proportion of zinc. The element M and zinc can be replaced with each other, and their arrangement is random.

InMZnO$_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 24.

Indium and the element M can be replaced with each other. Therefore, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers for every In layer is not an integer in the oxide, the oxide might have plural kinds of layered structures where the number of (M,Zn) layers for every In layer is an integer. For example, in the case of [In]:[M]:[Zn]=1:1:1.5, the oxide might have the following layered structures: a layered structure of one In layer for every two (M,Zn) layers and a layered structure of one In layer for every three (M,Zn) layers.

For example, in the case where the oxide is deposited with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases or three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide containing indium in a higher proportion can have high carrier mobility (electron mobility). This is because in an oxide containing indium, the element M, and zinc, the s orbital of heavy metal mainly contributes to carrier transfer, and when the indium content in the oxide is increased, overlaps of the s orbitals of indium atoms are increased; therefore, an oxide having a high content of indium has higher carrier mobility than an oxide having a low content of indium.

In contrast, when the indium content and the zinc content in an oxide become lower, carrier mobility becomes lower. Thus, with an atomic ratio of [In]:[M]:[Zn]=0:1:0 and the vicinity thereof (e.g., a region C in FIG. 23C), insulation performance becomes better.

Accordingly, an oxide in one embodiment of the present invention preferably has an atomic ratio represented by a region A in FIG. 23A. With the atomic ratio, a layered structure with high carrier mobility and a few grain boundaries is easily obtained.

A region B in FIG. 23B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Therefore, the illustrated regions each represent an atomic ratio with which an oxide has a layered structure, and boundaries of the regions A to C are not clear.

Next, the case where the oxide is used for a transistor is described.

Note that when the oxide is used for a transistor, carrier scattering or the like at a grain boundary can be reduced; thus, the transistor can have high field-effect mobility. In addition, the transistor can have high reliability.

An oxide with low carrier density is preferably used for the transistor. For example, an oxide whose carrier density is lower than $8 \times 10^{11}/cm^3$, preferably lower than $1 \times 10^{11}/cm^3$, more preferably lower than $1 \times 10^{10}/cm^3$, and greater than or equal to $1 \times 10^{-9}/cm^3$ is used.

A highly purified intrinsic or substantially highly purified intrinsic oxide has few carrier generation sources and thus can have a low carrier density. The highly purified intrinsic or substantially highly purified intrinsic oxide has a low density of defect states and accordingly has a low density of trap states in some cases.

Charge trapped by the trap states in the oxide takes a long time to be released and may behave like fixed charge. Thus, a transistor whose channel region is formed in an oxide having a high density of trap states has unstable electrical characteristics in some cases.

In order to obtain stable electrical characteristics of the transistor, it is effective to reduce the concentration of impurities in the oxide. In addition, in order to reduce the concentration of impurities in the oxide, the concentration of impurities in a film that is adjacent to the oxide is preferably reduced. Examples of impurities include hydrogen, nitrogen, alkali metal, alkaline earth metal, iron, nickel, and silicon.

Here, the influence of impurities in the oxide is described.

When silicon or carbon that is one of Group 14 elements is contained in the oxide, defect states are formed. Thus, the concentration of silicon or carbon in the oxide and around an interface with the oxide (measured by secondary ion mass spectrometry (SIMS)) is set lower than or equal to $2 \times 10^{18}$ atoms/cm$^3$, and preferably lower than or equal to $2 \times 10^{17}$ atoms/cm$^3$.

When the oxide contains alkali metal or alkaline earth metal, defect states are formed and carriers are generated, in some cases. Thus, a transistor including an oxide that contains alkali metal or alkaline earth metal is likely to be normally-on. Therefore, it is preferable to reduce the concentration of alkali metal or alkaline earth metal in the oxide. Specifically, the concentration of alkali metal or alkaline earth metal of the oxide, which is measured by SIMS, is set lower than or equal to $1 \times 10^{18}$ atoms/cm$^3$, and preferably lower than or equal to $2 \times 10^{16}$ atoms/cm$^3$.

When the oxide contains nitrogen, the oxide easily becomes n-type by generation of electrons serving as carriers and an increase of carrier density. Thus, a transistor whose semiconductor includes an oxide that contains nitrogen is likely to be normally-on. For this reason, nitrogen in the oxide is preferably reduced as much as possible; the nitrogen concentration of the oxide, which is measured by SIMS, is set, for example, lower than $5 \times 10^{19}$ atoms/cm$^3$, preferably lower than or equal to $5 \times 10^{18}$ atoms/cm$^3$, further preferably lower than or equal to $1 \times 10^{18}$ atoms/cm$^3$, and still further preferably lower than or equal to $5 \times 10^{17}$ atoms/cm$^3$.

Hydrogen contained in an oxide reacts with oxygen bonded to a metal atom to be water, and thus causes an oxygen vacancy, in some cases. Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide that contains hydrogen is likely to be normally-on. Accordingly, it is preferable that hydrogen in the oxide be reduced as much as possible. Specifically, the hydrogen concentration of the oxide, which is measured by SIMS, is set lower than $1 \times 10^{20}$ atoms/cm$^3$, preferably lower than $1 \times 10^{19}$ atoms/cm$^3$, further preferably lower than $5 \times 10^{18}$ atoms/cm$^3$, and still further preferably lower than $1 \times 10^{18}$ atoms/cm$^3$.

When an oxide with sufficiently reduced impurity concentration is used for a channel region in a transistor, the transistor can have stable electrical characteristics.

Next, the case where the oxide has a two-layer structure or a three-layer structure is described. A band diagram of insulators that are in contact with a stacked structure of an oxide S1, an oxide S2, and an oxide S3, a band diagram of insulators that are in contact with a stacked structure of the oxide S1 and the oxide S2, and a band diagram of insulators that are in contact with a stacked structure of the oxide S2 and the oxide S3 are described with reference to FIGS. 25A to 25C.

Figure 25A:
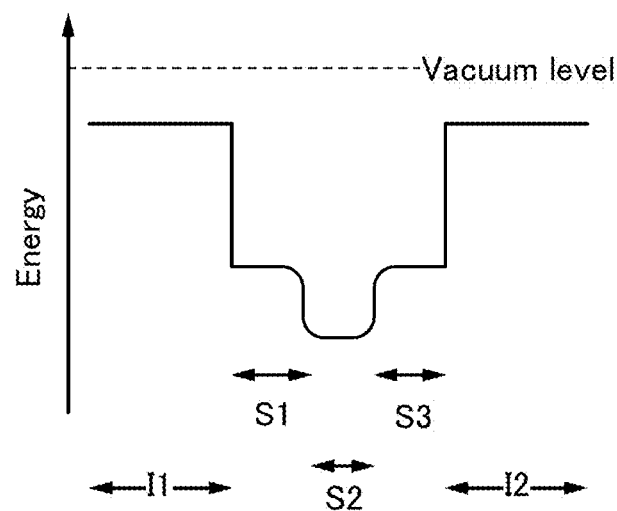
FIGS. 25A to 25C are each a band diagram of a layered structure of oxide semiconductors.
Figure 25B:
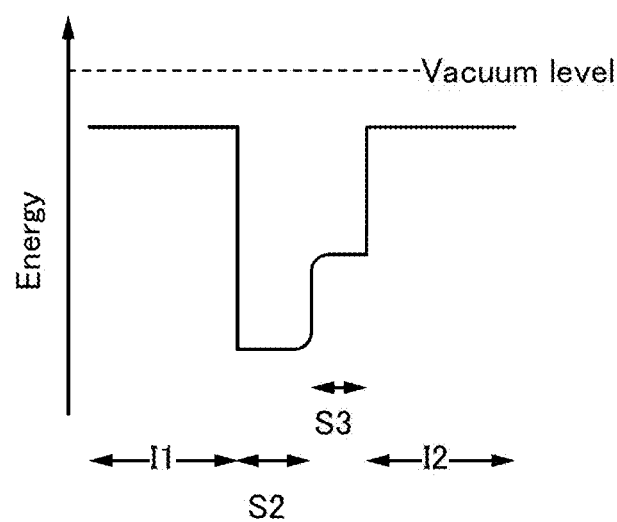
Figure 25C:
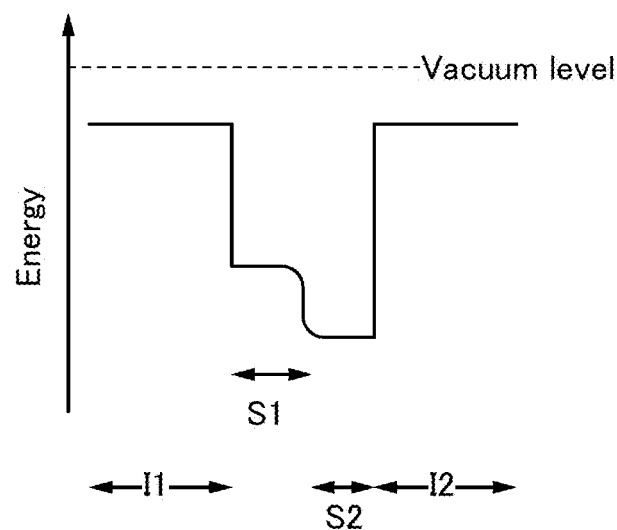

FIG. 25A is an example of a band diagram of a stacked structure including an insulator I1, the oxide S1, the oxide S2, the oxide S3, and an insulator I2 in a film thickness direction. FIG. 25B is an example of a band diagram of a stacked structure including the insulator I1, the oxide S2, the oxide S3, and the insulator I2 in a film thickness direction. FIG. 25C is an example of a band diagram of a stacked structure including the insulator I1, the oxide S1, the oxide S2, and the insulator I2 in a thickness direction. Note that for easy understanding, the band diagrams show the energy level of the conduction band minimum (Ec) of each of the insulator I1, the oxide S1, the oxide S2, the oxide S3, and the insulator I2.

The energy level of the conduction band minimum of each of the oxides S1 and S3 is closer to the vacuum level than that of the oxide S2. Typically, a difference in energy level between the conduction band minimum of the oxide S2 and the conduction band minimum of each of the oxides S1 and S3 is preferably greater than or equal to 0.15 eV or greater than or equal to 0.5 eV, and less than or equal to 2 eV or less than or equal to 1 eV. That is, it is preferable that the electron affinity of the oxide S2 be higher than the electron affinity of each of the oxides S1 and S3, and the difference between the electron affinity of each of the oxides S1 and S3 and the electron affinity of the oxide S2 be greater than or equal to 0.15 eV or greater than or equal to 0.5 eV, and less than or equal to 2 eV or less than or equal to 1 eV.

As shown in FIGS. 25A to 25C, the energy level of the conduction band minimum of each of the oxides S1 to S3 is gradually varied. In other words, the energy level of the conduction band minimum is continuously varied or continuously connected. In order to obtain such a band diagram, the density of defect states in a mixed layer formed at an interface between the oxides S1 and S2 or an interface between the oxides S2 and S3 is preferably made low.

Specifically, when the oxides S1 and S2 or the oxides S2 and S3 contain the same element (as a main component) in addition to oxygen, a mixed layer with a low density of defect states can be formed. For example, in the case where the oxide S2 is an In—Ga—Zn oxide, it is preferable to use an In—Ga—Zn oxide, a Ga—Zn oxide, gallium oxide, or the like as each of the oxides S1 and S3.

At this time, the oxide S2 serves as a main carrier path. Since the density of defect states at the interface between the oxides S1 and S2 and the interface between the oxides S2 and S3 can be made low, the influence of interface scattering on carrier conduction is small, and high on-state current can be obtained.

When an electron is trapped in a trap state, the trapped electron behaves like fixed charge; thus, the threshold voltage of the transistor is shifted in a positive direction. The oxides S1 and S3 can make the trap state apart from the oxide S2. This structure can prevent the positive shift of the threshold voltage of the transistor.

A material whose conductivity is sufficiently lower than that of the oxide S2 is used for the oxides S1 and S3. In that case, the oxide S2, the interface between the oxides S1 and S2, and the interface between the oxides S2 and S3 mainly function as a channel region. For example, an oxide with high insulation performance and the atomic ratio represented by the region C in FIG. 23C may be used as each of the oxides S1 and S3. Note that the region C in FIG. 23C represents the atomic ratio of [In]:[M]:[Zn]=0:1:0 or the vicinity thereof.

In the case where an oxide with the atomic ratio represented by the region A is used as the oxide S2, it is particularly preferable to use an oxide with [M]/[In] of greater than or equal to 1, preferably greater than or equal to 2 as each of the oxides S1 and S3. In addition, it is suitable to use an oxide with sufficiently high insulation performance and [M]/([Zn]+[In]) of greater than or equal to 1 as the oxide S3.

The insulator 250 can have a single-layer structure or a stacked-layer structure using, for example, one or more of an insulator containing a so-called high-k material such as silicon oxide, silicon oxynitride, silicon nitride oxide, aluminum oxide, hafnium oxide, tantalum oxide, zirconium oxide, lead zirconate titanate (PZT), strontium titanate (SrTiO$_3$), and (Ba,Sr)TiO$_3$ (BST). Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. A layer of silicon oxide, silicon oxynitride, or silicon nitride may be stacked over the insulator.

As the insulator 250, like the insulator 224, an oxide insulator that contains oxygen in excess of the stoichiometric composition is preferably used. When such an insulator containing excess oxygen is provided in contact with the oxide 230, oxygen vacancies in the oxide 230 can be reduced.

As the insulator 250, an insulating film formed of aluminum oxide, aluminum oxynitride, gallium oxide, gallium oxynitride, yttrium oxide, yttrium oxynitride, hafnium oxide, hafnium oxynitride, silicon nitride, or the like, which has barrier properties with respect to oxygen and hydrogen, can be used. The insulator 250 formed of such a material each serve as a layer that prevents release of oxygen from the oxide 230 and entry of an impurity such as hydrogen from the outside.

Note that the insulator 250 may have a stacked-layer structure similar to that of the insulator 220, the insulator 222, and the insulator 224. When the insulator 250 includes an insulator in which a necessary amount of electrons is trapped by electron trap states, the threshold voltage of the transistor 200 can be shifted in the positive direction. The transistor 200 having the structure is a normally-off transistor that is in a non-conduction state (also referred to as an off state) even when the gate voltage is 0 V.

In addition to the insulator 250, a barrier film may be provided between the oxide 230 and the conductor 260 in the semiconductor device illustrated in FIGS. 7A to 7C. The oxide 230c may have a barrier property.

For example, an insulating film containing excess oxygen is provided in contact with the oxide 230 and covered by a barrier film, whereby the composition of the oxide can be almost the same as the stoichiometric composition or can be in a supersaturated state containing more oxygen than that in the stoichiometric composition. It is also possible to prevent entry of impurities such as hydrogen into the oxide 230.

One of a pair of the conductor 240a and the conductor 241a and a pair of the conductor 240b the conductor 241b functions as a source electrode, and the other pair functions as a drain electrode.

Any of metals such as aluminum, titanium, chromium, nickel, copper, yttrium, zirconium, molybdenum, silver, tantalum, and tungsten, or an alloy containing any of the metals as its main component can be used for each of the conductors 240a, 241a, 240b, and 241b. Although a two-layer structure is shown in FIGS. 7A to 7C, a single-layer structure or a stacked-layer structure of three or more layers may be used.

For example, a titanium film is used as each of the conductor 240a and the conductor 240b, and an aluminum film is used as each of the conductor 241a and the conductor 241b. Other examples include a two-layer structure where an aluminum film is stacked over a tungsten film, a two-layer structure where a copper film is stacked over a copper-magnesium-aluminum alloy film, a two-layer structure where a copper film is stacked over a titanium film, and a two-layer structure where a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

Conductors 260a and 260b functioning as a gate electrode can be formed using, for example, a metal selected from aluminum, chromium, copper, tantalum, titanium, molybdenum, and tungsten, an alloy containing any of these metals as its component, an alloy containing any of these metals in combination, or the like. Furthermore, one or both of manganese and zirconium may be used. Alternatively, a semiconductor typified by polycrystalline silicon doped with an impurity element such as phosphorus, or a silicide such as nickel silicide may be used.

For example, a two-layer structure where aluminum is used as the conductor 260a and a titanium film is used as the conductor 260b is used. Other examples include a two-layer structure where a titanium film is stacked over a titanium nitride film, a two-layer structure where a tungsten film is stacked over a titanium nitride film, and a two-layer structure where a tungsten film is stacked over a tantalum nitride film or a tungsten nitride film.

Other examples include a three-layer structure where a titanium film is formed, an aluminum film is stacked over the titanium film, and a titanium film is formed over the aluminum film. An alloy film or a nitride film that contains aluminum and one or more metals selected from titanium, tantalum, tungsten, molybdenum, chromium, neodymium, and scandium may be used.

The conductor 260 can also be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added. The conductor 260 can have a stacked-layer structure of the above light-transmitting conductive material and the above metal.

The insulator 270 may be provided to cover the conductor 260. In the case where the insulator 280 is formed using an oxide material from which oxygen is released, the insulator 270 is formed using a substance having a barrier property with respect to oxygen to prevent the conductor 260 from being oxidized by the released oxygen.

For example, the insulator 270 can be formed using metal oxide such as aluminum oxide. The insulator 270 is formed to a thickness with which the oxidation of the conductor 260 is prevented. For example, the thickness of the insulator 270 is set greater than or equal to 1 nm and less than or equal to 10 nm, preferably greater than or equal to 3 nm and less than or equal to 7 nm.

Thus, the oxidation of the conductor 260 can be prevented, and oxygen released from the insulator 280 can be supplied to the oxide 230 efficiently.

In the structure, a region of the oxide 230b where a channel is formed can be electrically surrounded by an electric field of the conductor 260 that functions as a gate electrode. Because of the s-channel structure, the channel might be formed in the entire oxide 230b, which faces the conductor 260 with the insulator 250 interposed therebetween. In the s-channel structure, a large amount of current can flow between a source and a drain of a transistor, so that a high on-state current can be obtained. Furthermore, a voltage is applied from all directions to a region where a channel is formed, and thus, a transistor in which leakage current is suppressed can be provided.

<Transistor Structure 2>

FIGS. 8A to 8C illustrate an example of a structure that can be used for the transistor 200. FIG. 8A illustrates a top surface of the transistor 200. For simplification of the figure, some films are omitted in FIG. 8A. FIG. 8B is a cross-sectional view taken along dashed-dotted line X1-X2 in FIG. 8A, and FIG. 8C is a cross-sectional view taken along dashed-dotted line Y1-Y2 in FIG. 8A.

Note that in the transistor 200 in FIGS. 8A to 8C, components having the same function as the components in the transistor 200 in FIGS. 7A to 7C are denoted by the same reference numerals.

In the structure illustrated in FIGS. 8A to 8C, the oxide 230c, the insulator 250, and the conductor 260 are formed in an opening portion formed in the insulator 280. Furthermore, one end portion of each of the conductor 240a, the conductor 240b, the conductor 241a, and the conductor 241b is aligned with an end portion of the opening portion formed in the insulator 280. Furthermore, three end portions of each of the conductor 240a, the conductor 240b, the conductor 241a, and the conductor 241b are aligned with parts of end portions of each of the oxide 230a and the oxide 230b. Therefore, the conductor 240a, the conductor 240b, the conductor 241a, and the conductor 241b can be formed concurrently with the oxide 230 or the opening portion in the insulator 280. This leads to a reduction in the number of masks and steps and improvement in yield and productivity.

Since the transistor 200 illustrated in FIGS. 8A to 8C has a structure in which the conductors 240a, 240b, 241a, and 241b hardly overlap with the conductor 260, the parasitic capacitance added to the conductor 260 can be reduced. Thus, the transistor 200 with a high operation frequency can be provided.

<Transistor Structure 3>

Figure 9A:
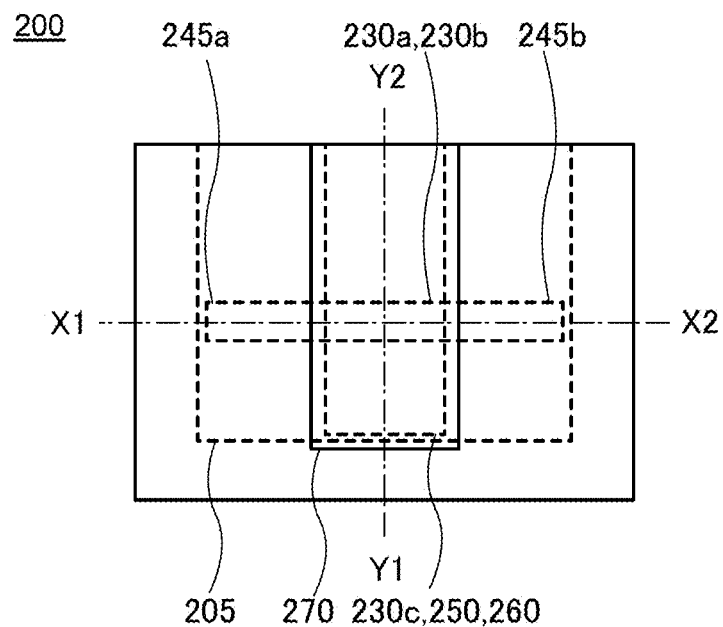
FIGS. 9A to 9C illustrate a top view and cross-sectional structures of a transistor of one embodiment.
Figure 9B:
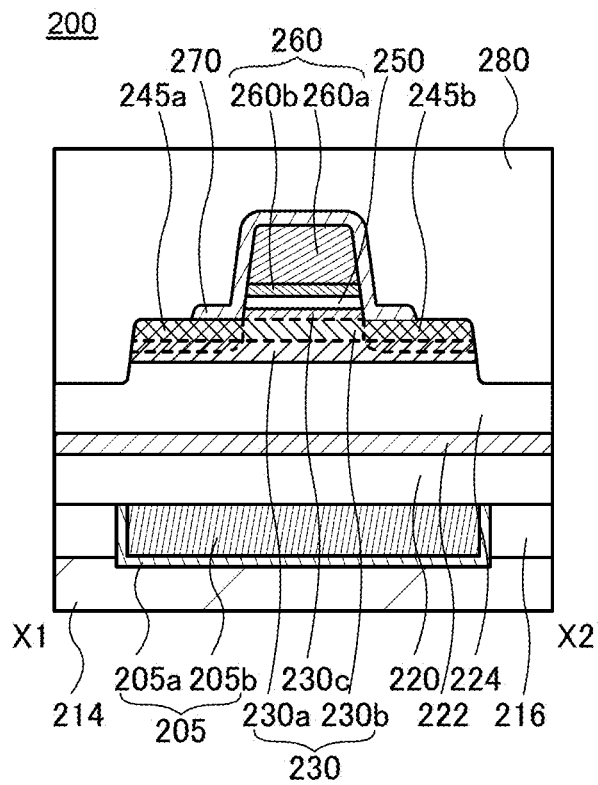
Figure 9C:
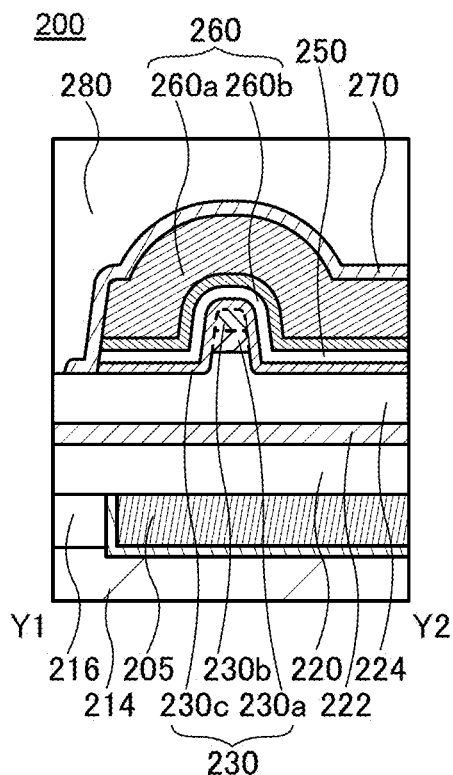

FIGS. 9A to 9C illustrate an example of a structure that can be used for the transistor 200. FIG. 9A illustrates a top surface of the transistor 200. For simplification of the figure, some films are omitted in FIG. 9A. FIG. 9B is a cross-sectional view taken along dashed-dotted line X1-X2 in FIG. 9A, and FIG. 9C is a cross-sectional view taken along dashed-dotted line Y1-Y2 in FIG. 9A.

Note that in the transistor 200 in FIGS. 9A to 9C, components having the same function as the components in the transistor 200 in FIGS. 7A to 7C are denoted by the same reference numerals.

In the structure illustrated in FIGS. 9A to 9C, a region 245a functioning as one of a source region and a drain region and a region 245b functioning as the other of the source region and the drain region are provided in the oxide 230. The regions can be formed in such a manner that an impurity such as boron, phosphorus, or argon is added to the oxide 230 using the conductor 260 as a mask. Alternatively, the regions can be formed in such a manner that the insulator 280 is formed of an insulator containing hydrogen, such as a silicon nitride film and hydrogen is diffused to part of the oxide 230. This leads to a reduction in the number of masks and steps and improvement in yield and productivity.

The structures, the methods, and the like described in this embodiment can be combined as appropriate with any of the structures, the methods, and the like described in the other embodiments and examples.

Embodiment 3

In this embodiment, an example of a method for manufacturing the semiconductor device described in the above Structure Example is described below with reference to FIG. 10 to FIG. 21.

<Method 1 for Manufacturing Excess-Oxygen Region in Insulator>

A method for manufacturing an excess-oxygen region in an insulator in the present invention is described with reference to FIG. 10 to FIG. 20. Note that FIG. 10 is a process flow diagram illustrating an example of a process of forming an excess-oxygen region in an insulator in a method for manufacturing a semiconductor device.

[First Step]

Figure 10:
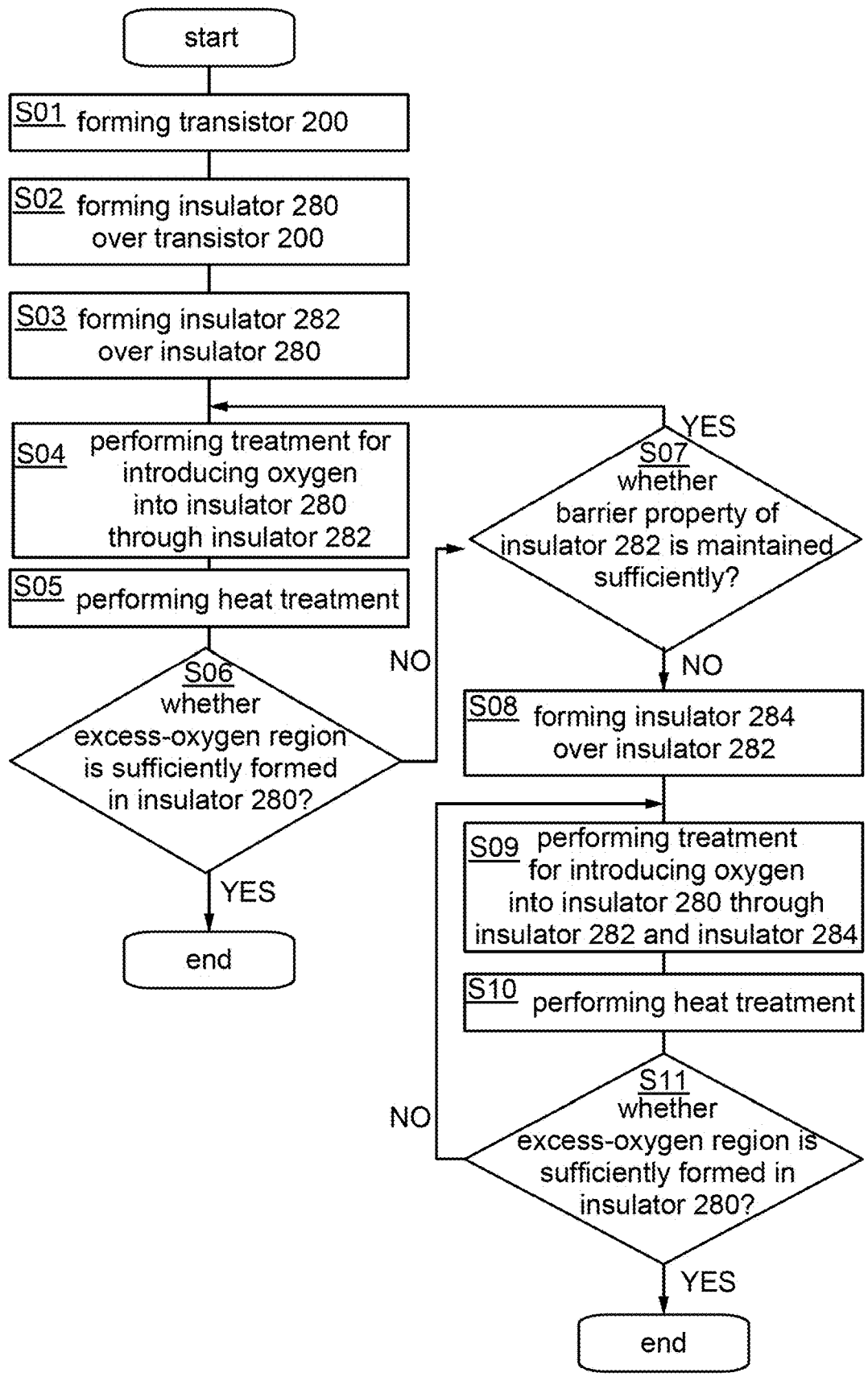
FIG. 10 is a process flowchart of a semiconductor device of one embodiment.

A first step includes a step of forming the transistor 200 (see Step S01 in FIG. 10). The details of the method of manufacturing the transistor 200 are described later.

[Second Step]

A second step includes a step of forming the insulator 280 (see Step S02 in FIG. 10).

[Third Step]

A third step includes a step of forming the insulator 282 (see Step S03 in FIG. 10). Note that the insulator 280 is formed using a material having a barrier property with respect to oxygen, hydrogen, or water.

The insulator 282 is preferably formed with a sputtering apparatus. By using a sputtering method, an excess-oxygen region can be formed easily in the insulator 280 under the insulator 282.

During deposition by a sputtering method, ions and sputtered particles exist between a target and the substrate. For example, a potential $E_0$ is supplied to a target, to which a power source is connected. A potential $E_1$ such as a ground potential is supplied to the substrate side. Note that the substrate may be electrically floating. In addition, there is a region at a potential $E_2$ between the target and the substrate. Note that the potential relationship is $E_2 > E_1 > E_0$.

The ions in plasma are accelerated by a potential difference $(E_2 - E_0)$ and collide with the target; accordingly, the sputtered particles are ejected from the target. These sputtered particles attach to a deposition surface, thereby forming the insulator 282. Some ions recoil by the target and might be taken into the insulator 280 below the formed film as recoil ions through the insulator 282. The ions in the plasma are accelerated by a potential difference $(E_2 - E_1)$ and collide with the deposition surface. Some ions reach the inside of the insulator 280. The ions are taken into the insulator 280; accordingly, a region into which the ions are taken is formed in the insulator 280. That is, an excess-oxygen region is formed in the insulator 280 in the case where the ions include oxygen.

[Fourth Step]

A fourth step includes a step of performing treatment for introducing oxygen into the insulator 280 through the insulator 282 (see Step S04 in FIG. 10). As the treatment for introducing oxygen into the insulator 280, an ion implantation method, an ion doping method, a plasma immersion ion implantation method, plasma treatment, or the like can be used. By this step, oxygen in excess of that in the stoichiometric composition is introduced into the insulator 280, so that an excess-oxygen region is formed.

[Fifth Step]

A fifth step includes a step of performing heat treatment (see Step S05 in FIG. 10). The heat treatment may be performed at a temperature higher than or equal to 250° C. and lower than or equal to 650° C., preferably higher than or equal to 300° C. and lower than or equal to 500° C., more preferably higher than or equal to 350° C. and lower than or equal to 400° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

By the heat treatment, oxygen introduced by the fourth step is diffused into a film of the insulator 280 and the transistor 200. By supply of oxygen to the oxide 230 in the transistor 200, oxygen vacancies in the oxide 230 are reduced. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Note that the fourth step and the fifth step may be performed concurrently. That is, the treatment for introducing oxygen may be performed while the substrate is heated, whereby the productivity can be improved.

[Sixth Step]

In a sixth step, whether the excess-oxygen region is sufficiently formed in the insulator 280 is determined (see Step S06 in FIG. 10). In the case where the excess-oxygen region is formed sufficiently, the process proceeds to a step for forming the insulator 284, the capacitor 100, or the like. In the case where the formation of the excess-oxygen region is insufficient, the process proceeds to a seventh step.

[Seventh Step]

In the seventh step, whether the barrier property of the insulator 282 with respect to oxygen, hydrogen, or water is maintained sufficiently is determined (see Step S07 in FIG. 10). In the case where the barrier property of the insulator 282 with respect to oxygen, hydrogen, or water is maintained sufficiently, the fourth step and the fifth step may be performed repeatedly until the excess-oxygen region is formed sufficiently. In the case where the insulator 282 is broken by damage or the like caused in the fourth step, the process proceeds to an eighth step.

[Eighth Step]

The eighth step includes a step of forming the insulator 284 over the insulator 282 (see Step S08 in FIG. 10). The insulator 284 is preferably formed by an ALD method. By an ALD method, the insulator 284 that is dense can be formed. In the dense insulator 284, defects such as cracks or pinholes are reduced, or a uniform thickness is achieved. Furthermore, damage caused to a processed member in forming the insulator 284 can be reduced.

[Ninth Step]

A ninth step includes a step of performing treatment for introducing oxygen into the insulator 280 through the insulator 282 and the insulator 284 (see Step S09 in FIG. 10). As the treatment for introducing oxygen into the insulator 280, an ion implantation method, an ion doping method, a plasma immersion ion implantation method, plasma treatment, or the like can be used. By this step, oxygen in excess of that in the stoichiometric composition is introduced into the insulator 280, so that an excess-oxygen region is formed.

[Tenth Step]

A tenth step includes a step of performing heat treatment (see Step S10 in FIG. 10). The heat treatment may be performed at a temperature higher than or equal to 250° C. and lower than or equal to 650° C., preferably higher than or equal to 300° C. and lower than or equal to 500° C., more preferably higher than or equal to 350° C. and lower than or equal to 400° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

By the heat treatment, oxygen introduced by the eighth step is diffused into a film of the insulator 280 and the transistor 200. By supply of oxygen to the oxide 230 in the transistor 200, oxygen vacancies in the oxide 230 are reduced. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Note that the ninth step and the tenth step may be performed concurrently. That is, the treatment for introducing oxygen may be performed while the substrate is heated, whereby the productivity can be improved.

[Eleventh Step]

In an eleventh step, whether the excess-oxygen region is sufficiently formed in the insulator 280 is determined (see Step S11 in FIG. 10). In the case where the excess-oxygen region is formed sufficiently, the process proceeds to a step for forming the insulator 102, the capacitor 100, or the like. In the case where the formation of the excess-oxygen region is insufficient, the ninth step and the tenth step are performed repeatedly until the excess-oxygen region is formed sufficiently.

As described above, in the method for manufacturing a semiconductor device of one embodiment of the present invention, an excess-oxygen region can be formed by repeatedly performing the treatment for introducing oxygen and the heat treatment on the insulator 280. Furthermore, by performing the treatment for introducing oxygen through the insulator 282 or through the insulator 282 and the insulator 284, damage to the insulator 280 can be prevented and oxygen can be introduced efficiently. Accordingly, a change in electrical characteristics can be prevented and reliability can be improved in the transistor including an oxide semiconductor.

<Method 1 for Manufacturing Semiconductor Device>

Next, an example of a method for manufacturing a semiconductor device of the present invention using the method for manufacturing an excess-oxygen region shown in FIG. 10 is described with reference to FIGS. 11A to 20.

First, the substrate 301 is prepared. A semiconductor substrate is used as the substrate 301. For example, a single crystal silicon substrate (including a p-type semiconductor substrate or an n-type semiconductor substrate), a compound semiconductor substrate containing silicon carbide or gallium nitride, or the like can be used. An SOI substrate may alternatively be used as the substrate 301. The case where single crystal silicon is used as the substrate 301 is described below.

Then, an element isolation layer is formed in the substrate 301. The element isolation layer may be formed by a local oxidation of silicon (LOCOS) method, a shallow trench isolation (STI) method, or others.

In the case where a p-channel transistor and an n-channel transistor are formed on the same substrate, an n-well or a p-well may be formed in part of the substrate 301. For example, a p-well may be formed by adding an impurity element that imparts p-type conductivity, such as boron, to the n-type substrate 301, and an n-channel transistor and a p-channel transistor may be formed on the same substrate.

Then, an insulator to be the insulator 304 is formed over the substrate 301. For example, after surface nitriding treatment, oxidizing treatment may be performed to oxidize the interface between silicon and silicon nitride, whereby a silicon oxynitride film may be formed. For example, a silicon oxynitride film can be obtained by performing oxygen radical oxidation after a thermal silicon nitride film is formed on the surface at 700° C. in an $NH_3$ atmosphere.

The insulator may be formed by a sputtering method, a chemical vapor deposition (CVD) method (including a thermal CVD method, a metal organic CVD (MOCVD) method, a plasma enhanced CVD (PECVD) method, and the like), a molecular beam epitaxy (MBE) method, an atomic layer deposition (ALD) method, a pulsed laser deposition (PLD) method, or the like.

Then, a conductive film to be the conductor 306 is formed. It is preferable that the conductive film be formed using a metal selected from tantalum, tungsten, titanium, molybdenum, chromium, niobium, and the like, or an alloy material or a compound material including any of the metals as its main component. Alternatively, polycrystalline silicon to which an impurity such as phosphorus is added can be used. Further alternatively, a stacked-layer structure of a film of metal nitride and a film of any of the above metals may be used. As a metal nitride, tungsten nitride, molybdenum nitride, or titanium nitride can be used. When the film of metal nitride is provided, adhesiveness of the metal film can be increased; thus, separation can be prevented. Note that the threshold voltage of the transistor 300 can be adjusted by determining a work function of the conductor 306, and therefore, a material of the conductive film is selected as appropriate in accordance with the characteristics that the transistor 300 needs to have.

The conductive film can be formed by a sputtering method, an evaporation method, a CVD method (including a thermal CVD method, an MOCVD method, a PECVD method, and the like), or the like. It is preferable to use a thermal CVD method, an MOCVD method, or an ALD method in order to reduce plasma damage.

Then, a resist mask is formed over the conductive film by a photolithography process or the like and an unnecessary portion of the conductive film is removed. After that, the resist mask is removed, whereby the conductor 306 is formed.

Here, a method for processing a film is described. In the case of finely processing a film, a variety of fine processing techniques can be used. For example, it is possible to use a method in which a resist mask formed by a photolithography process or the like is subjected to slimming treatment. Alternatively, a dummy pattern is formed by a photolithography process or the like, the dummy pattern is provided with a sidewall and is then removed, and a film is etched using the remaining sidewall as a resist mask. In order to achieve a high aspect ratio, anisotropic dry etching is preferably used for etching of a film. Alternatively, a hard mask formed of an inorganic film or a metal film may be used.

As light used to form the resist mask, light with an i-line (with a wavelength of 365 nm), light with a g-line (with a wavelength of 436 nm), light with an h-line (with a wavelength of 405 nm), or light in which the i-line, the g-line, and the h-line are mixed can be used. Alternatively, ultraviolet light, KrF laser light, ArF laser light, or the like can be used. Exposure may be performed by liquid immersion exposure technique. As the light for the exposure, extreme ultra-violet light (EUV) or X-rays may be used. Instead of the light for the exposure, an electron beam can be used. It is preferable to use extreme EUV, X-rays, or an electron beam because extremely minute processing can be performed. Note that in the case of performing exposure by scanning of a beam such as an electron beam, a photomask is not needed.

An organic resin film having a function of improving the adhesion between a film to be processed and a resist film may be formed before the resist film serving as a resist mask is formed. The organic resin film can be formed to planarize a surface by covering a step under the film by a spin coating method or the like, and thus can reduce variation in thickness of the resist mask over the organic resin film. In the case of fine processing, in particular, a material serving as a film preventing reflection of light for the exposure is preferably used for the organic resin film. Examples of the organic resin film having such a function include a bottom anti-reflection coating (BARC) film. The organic resin film may be removed at the same time as the removal of the resist mask or after the removal of the resist mask.

After the conductor 306 is formed, a sidewall covering a side surface of the conductor 306 may be formed. The sidewall can be formed in such a manner that an insulator thicker than the conductor 306 is formed and subjected to anisotropic etching so that only a portion of the insulator on the side surface of the conductor 306 remains.

The insulator to be the insulator 304 is etched concurrently with the formation of the sidewall, whereby the insulator 304 is formed under the conductor 306 and the sidewall. The insulator 304 may be formed by etching the insulator with the conductor 306 or a resist mask for processing the conductor 306 used as an etching mask after the conductor 306 is formed. In this case, the insulator 304 is formed under the conductor 306. Alternatively, the insulator can be used as the insulator 304 without being processed by etching.

Then, an element that imparts n-type conductivity, such as phosphorus, or an element that imparts p-type conductivity, such as boron, is added to a region of the substrate 301 where the conductor 306 (and the sidewall) is not provided.

Then, the insulator 320 is formed, and then, heat treatment is performed to activate the aforementioned element that imparts conductivity.

The insulator 320 can be formed to have a single-layer structure or a stacked-layer structure using, for example, silicon oxide, silicon oxynitride, silicon nitride oxide, silicon nitride, aluminum oxide, aluminum oxynitride, aluminum nitride oxide, aluminum nitride, or the like. The insulator 320 is preferably formed using silicon nitride containing oxygen and hydrogen (SiNOH) because the amount of hydrogen released by heating can be increased. The insulator 320 can also be formed using silicon oxide with high step coverage that is formed by reacting tetraethyl orthosilicate (TEOS), silane, or the like with oxygen, nitrous oxide, or the like.

The insulator 320 can be formed by, for example, a sputtering method, a CVD method (including a thermal CVD method, an MOCVD method, a PECVD method, and the like), an MBE method, an ALD method, a PLD method, or the like. In particular, it is preferable that the insulator be formed by a CVD method, further preferably a plasma CVD method because coverage can be further improved. It is preferable to use a thermal CVD method, an MOCVD method, or an ALD method in order to reduce plasma damage.

The heat treatment can be performed at a temperature higher than or equal to 400° C. and lower than the strain point of the substrate in an inert gas atmosphere such as a rare gas atmosphere or a nitrogen gas atmosphere or in a reduced-pressure atmosphere.

At this stage, the transistor 300 is formed. Note that in the case of using the circuit configuration shown in FIG. 22B, the transistor 300 may be omitted. In that case, there is no particular limitation on the substrate that can be used as the substrate. For example, a glass substrate of barium borosilicate glass, aluminoborosilicate glass, or the like, a ceramic substrate, a quartz substrate, or a sapphire substrate can be used. A single crystal semiconductor substrate or a polycrystalline semiconductor substrate of silicon, silicon carbide, or the like; a compound semiconductor substrate of silicon germanium, gallium arsenide, indium arsenide, or indium gallium arsenide, or the like; a silicon-on-insulator (SOI) substrate; a germanium-on-insulator (GOI) substrate; or the like can be used as the substrate. Any of these substrates provided with a semiconductor element may be used as the substrate.

A flexible substrate may be used as the substrate. A transistor may be directly formed over a flexible substrate; or alternatively, a transistor may be formed over a substrate and then separated from the substrate and transferred to a flexible substrate. In order that the transistor be separated from the substrate to be transferred to the flexible substrate, it is preferable to provide a separation layer between the manufacturing substrate and the transistor including an oxide semiconductor.

Figure 11A:
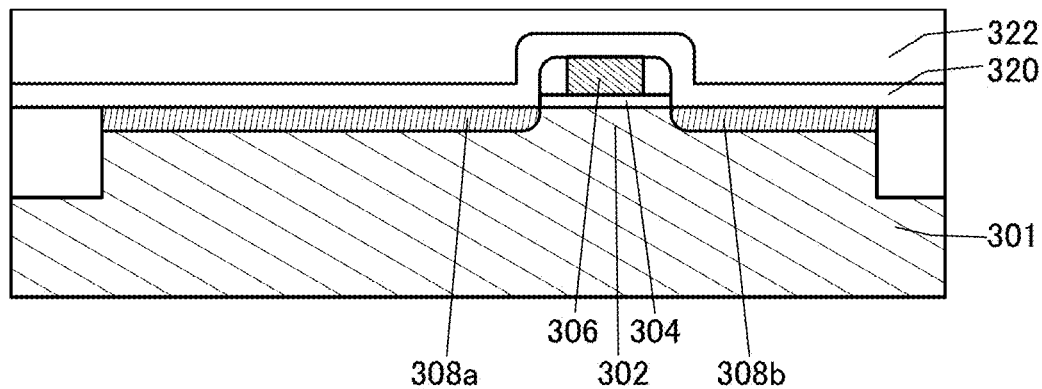
FIGS. 11A to 11C illustrate an example of a method for manufacturing a semiconductor device of one embodiment.

Then, the insulator 322 is formed over the insulator 320. The insulator 322 can be formed using a material and a method similar to those used for forming the insulator 320. In addition, the top surface of the insulator 322 is planarized by a CMP method or the like (FIG. 11A).

Figure 11B:
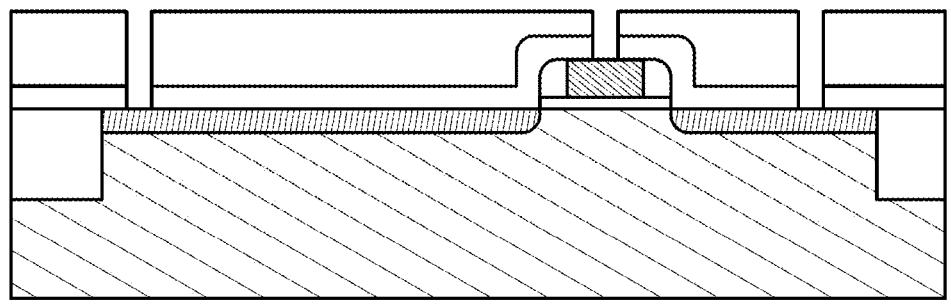
Figure 11C:
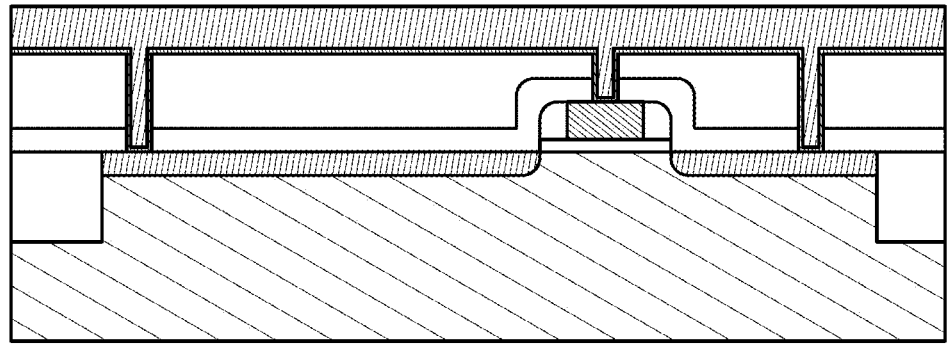

Then, opening portions that reach the low-resistance region 308a, the low-resistance region 308b, the conductor 306, and the like are formed in the insulator 320 and the insulator 322 by a photolithography process or the like (FIG. 11B). After that, a conductive film is formed to fill the opening portions (see FIG. 11C). The conductive film can be formed by a sputtering method, a CVD method (including a thermal CVD method, an MOCVD method, a PECVD method, and the like), an MBE method, an ALD method, a PLD method, or others.

Figure 12A:
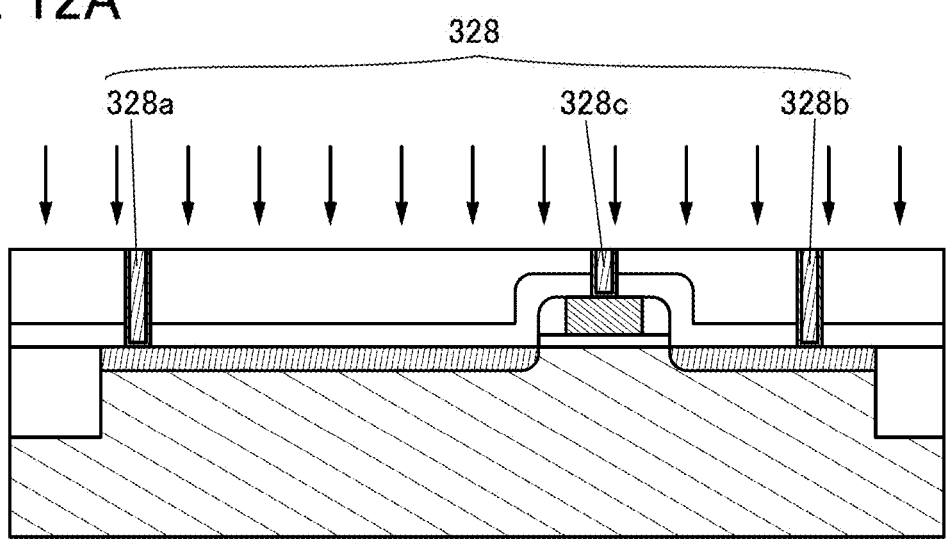
FIGS. 12A to 12C illustrate the example of a method for manufacturing a semiconductor device of one embodiment.

Then, planarization treatment is performed on the conductive film to expose a top surface of the insulator 322, whereby a conductor 328a, a conductor 328b, a conductor 328c, and the like are formed (FIG. 12A). Note that arrows in FIG. 12A show CMP treatment. Furthermore, in the specification and the drawings, the conductor 328a, the conductor 328b, and the conductor 328c each function as a plug or a wiring and are collectively referred to as conductor 328 in some cases. Note that in this specification, conductors each functioning as a plug or a wiring are treated in a similar manner.

Figure 12B:
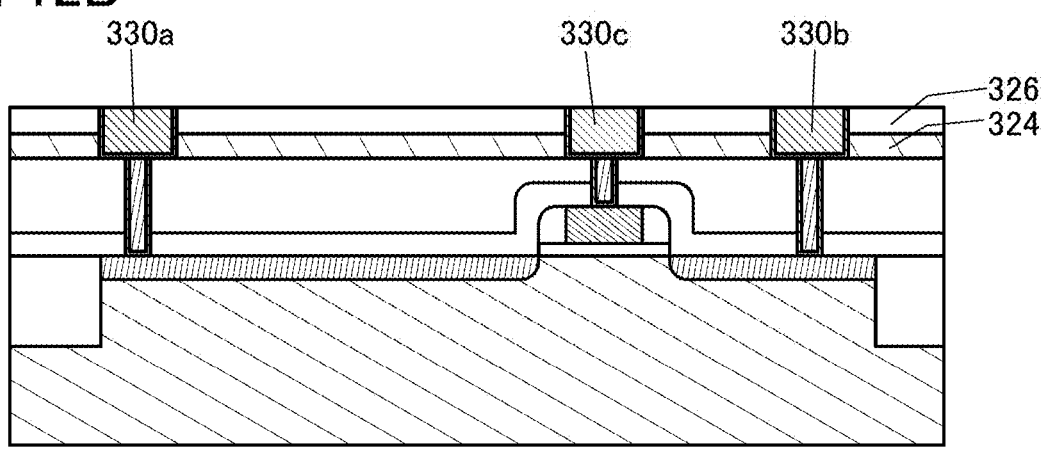

Then, a conductor 330a, a conductor 330b, and a conductor 330c are formed over the insulator 320 by a damascene process or the like (FIG. 12B).

The insulator 324 and the insulator 326 can be formed using a material and a method similar to those used for forming the insulator 320.

The insulator 324 is preferably formed using, for example, a film having a barrier property that prevents hydrogen or impurities from diffusing from the substrate 301, the transistor 300, or the like into a region where the transistor 200 is formed. As an example of the film having a barrier property with respect to hydrogen, silicon nitride formed by a CVD method can be given.

The insulator 326 is preferably an insulator having a low dielectric constant (low-k material). For example, silicon oxide formed by a CVD method can be used. The use of a material with a low dielectric constant in an interlayer film can reduce the parasitic capacitance between wirings.

A conductive film to be the conductor 330 can be formed using a material and a method similar to those used for forming the conductor 328.

Note that in the case where the conductor 330 has a stacked-layer structure, a conductor having a barrier property with respect to oxygen, hydrogen, or water, such as tantalum nitride, is preferably used as a conductor in contact with the insulator 324. For example, tantalum nitride having a barrier property can be formed by an ALD method using a deposition gas that does not contain chlorine at a substrate temperature of 250° C. A dense conductor including reduced defects such as cracks or pinholes or having a uniform thickness can be formed by an ALD method. In the case where the insulator 324 having a barrier property with respect to oxygen, hydrogen, or water is in contact with the conductor having a barrier property with respect to oxygen, hydrogen, or water, the diffusion of oxygen, hydrogen, or water can be prevented more reliably.

Figure 12C:
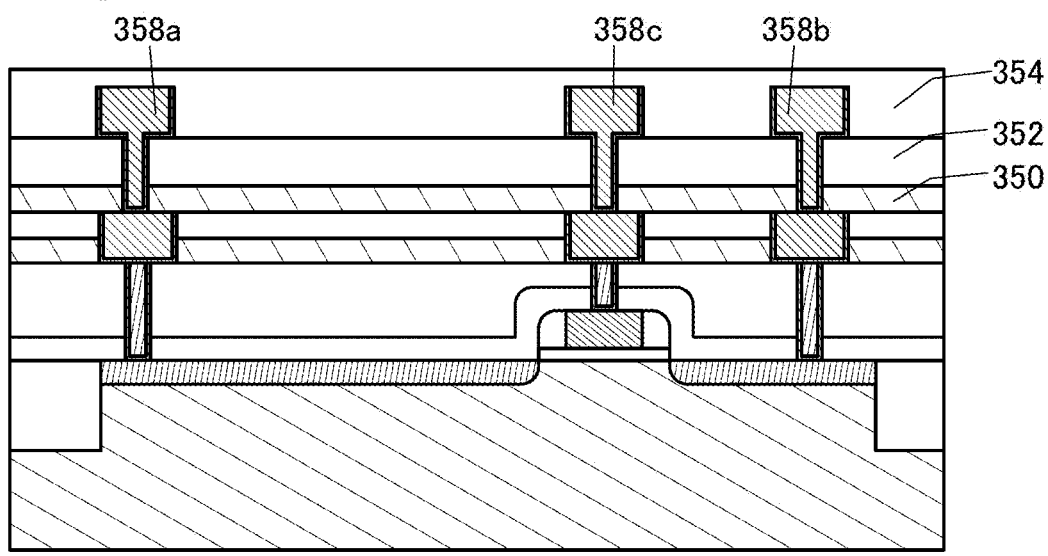

Then, the insulator 352, the insulator 354, a conductor 358a, a conductor 358b, and a conductor 358c are formed (FIG. 12C). The insulator 352 and the insulator 354 can be formed using a material and a method similar to those used for forming the insulator 320. The conductor 358 can be formed using a material similar to that used for forming the conductor 328 by a dual damascene process or the like.

Then, the transistor 200 is formed.

After the insulator 210 is formed, the insulator 212 and the insulator 214 having a barrier property with respect to hydrogen or oxygen are formed. The insulator 210, the insulator 212, and the insulator 214 can be formed using a material and a method similar to those used for forming the insulator 320.

The insulator 210 is preferably formed using, for example, a film having a barrier property that prevents hydrogen or impurities from diffusing from the substrate 301, the transistor 300, or the like into a region where the transistor 200 is formed. As an example of the film having a barrier property with respect to hydrogen, silicon nitride formed by a CVD method can be given.

The insulator 212 can be aluminum oxide formed by an ALD method as an example of a film having a barrier property with respect to hydrogen, for example. A dense insulator including reduced defects such as cracks or pinholes or having a uniform thickness can be formed by an ALD method.

The insulator 214 can be aluminum oxide formed by a sputtering method as an example of a film having a barrier property with respect to hydrogen, for example.

Figure 13A:
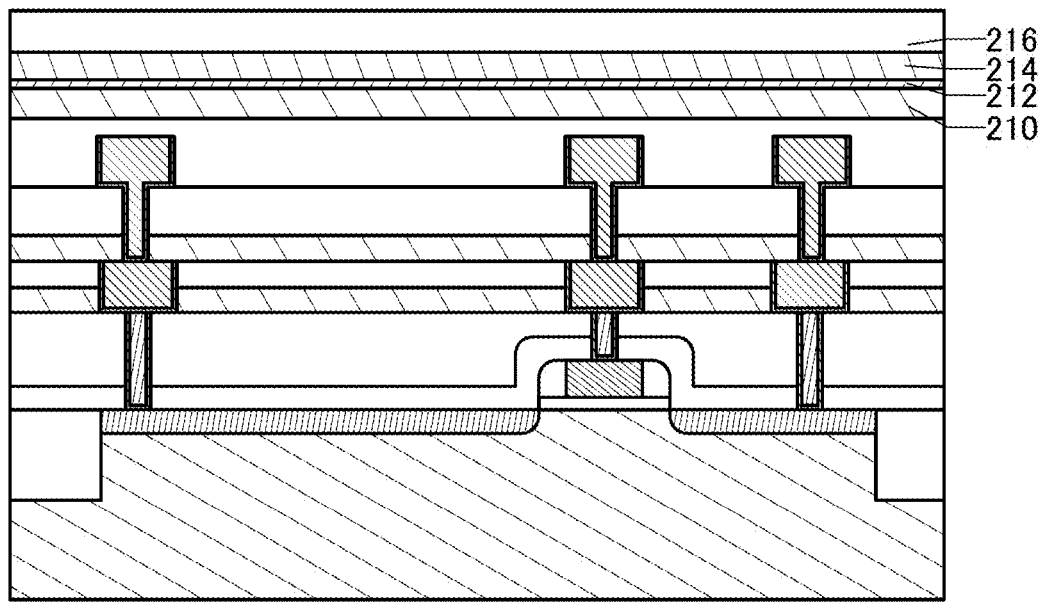
FIGS. 13A and 13B illustrate the example of a method for manufacturing a semiconductor device of one embodiment.

Then, the insulator 216 is formed over the insulator 214. The insulator 216 can be formed using a material and a method similar to those used for forming the insulator 210 (FIG. 13A).

Figure 13B:
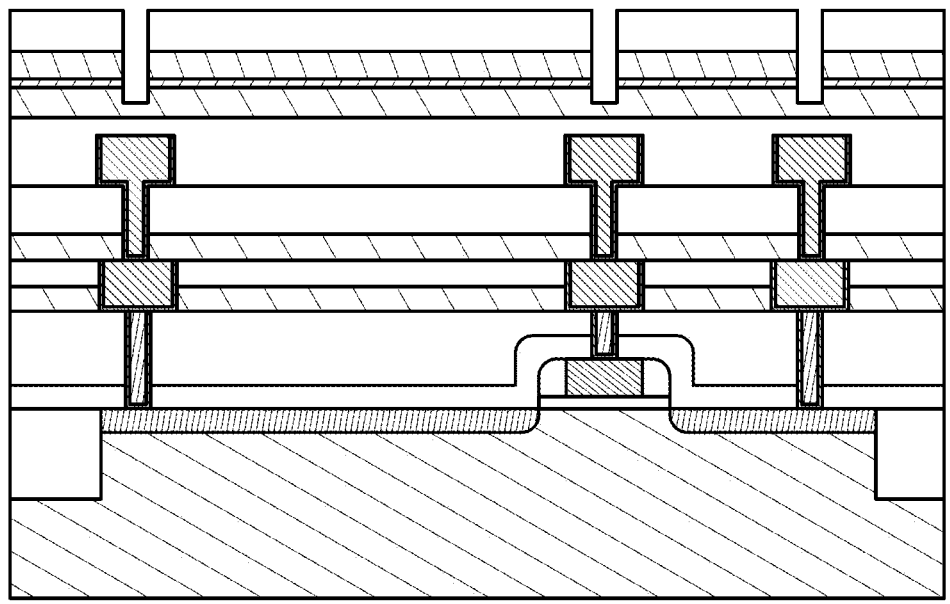

Then, depressed portions are formed in regions overlapping with the conductor 358a, the conductor 358b, the conductor 358c, and the like in the stacked-layer structure of the insulator 210, the insulator 212, the insulator 214, and the insulator 216 (FIG. 13B). Note that each of the depressed portions is preferably deep enough to form an opening portion in at least the insulator formed using a hardly-etched material. Here, the hardly-etched material denotes a material that is hardly etched, e.g., metal oxide. Typical examples of a metal oxide film formed of a hardly-etched material include a film containing any of aluminum oxide, zirconium oxide, and hafnium oxide; a silicate film containing any of these materials ($HfSi_xO_y$, $ZrSi_xO_y$, or the like), and a film of a composite oxide containing two or more of these materials ($Hf_{1-x}Al_xO_y$, $Zr_{1-x}Al_xO_y$, or the like).

Figure 14A:
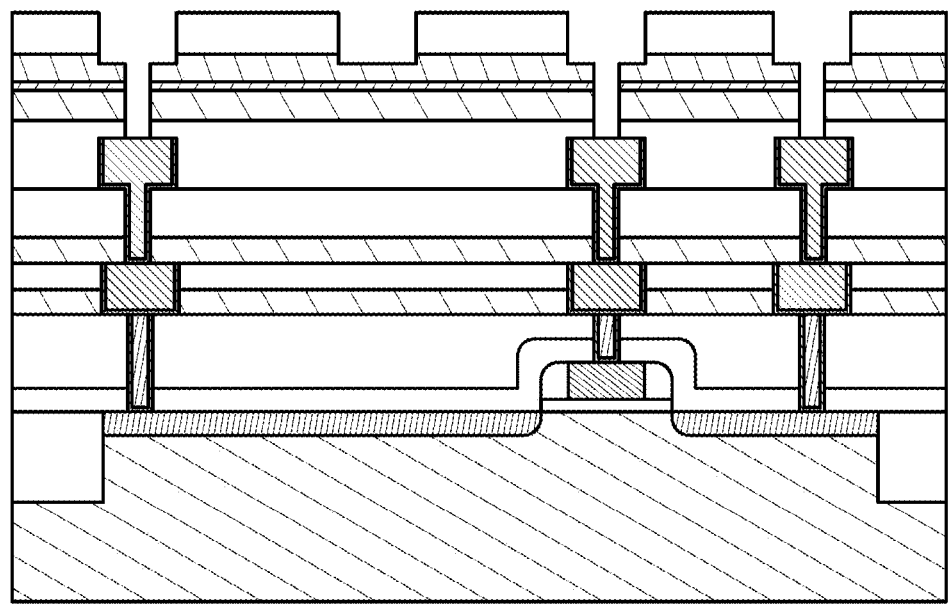
FIGS. 14A and 14B illustrate the example of a method for manufacturing a semiconductor device of one embodiment.

Then, an opening portion is formed in a region where the conductor 205 is to be formed in the stacked-layer structure of the insulator 210, the insulator 212, the insulator 214, and the insulator 216, and bottoms of the depressed portions formed in the stacked-layer structure of the insulator 210, the insulator 212, the insulator 214, and the insulator 216 are removed, whereby opening portions that reach the conductor 358a, the conductor 358b, and the conductor 358c are formed (see FIG. 14A). At this time, by increasing the widths of the upper parts of the depressed portions, e.g., the opening portions formed in the insulator 216, an adequate design margin for plugs or wirings to be formed in a later step can be provided.

Figure 14B:
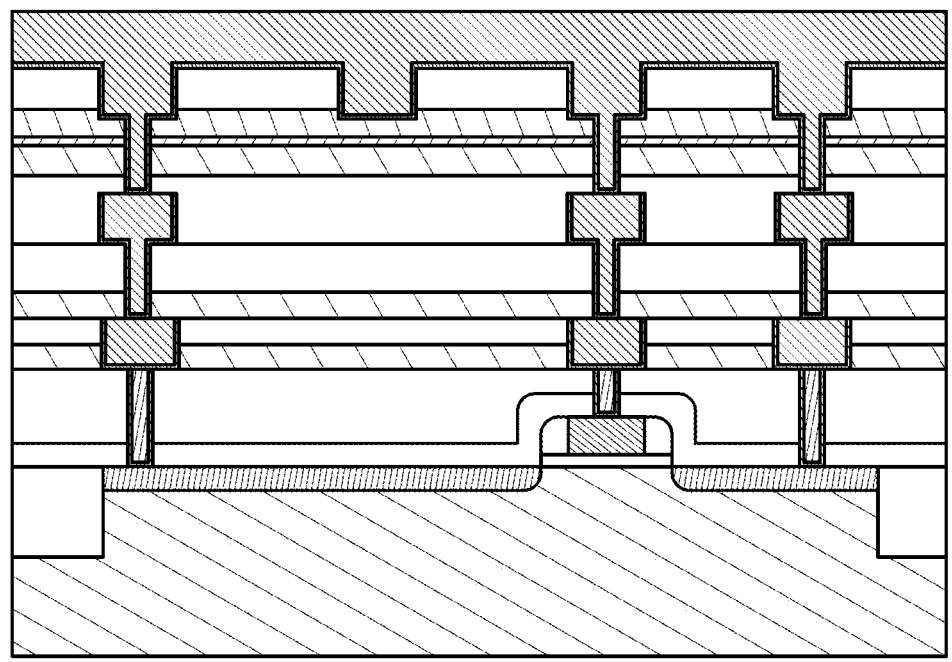
Figure 15A:
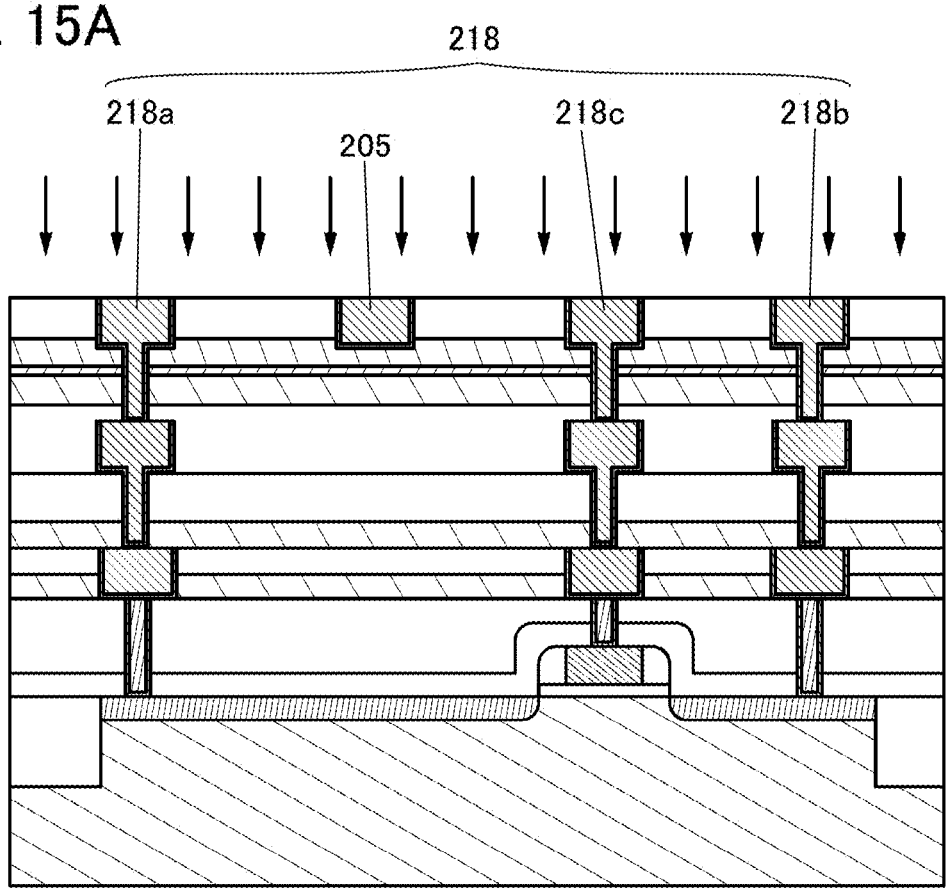
FIGS. 15A and 15B illustrate the example of a method for manufacturing a semiconductor device of one embodiment.

Then, a conductive film is formed to fill the opening portions (FIG. 14B). The conductive film can be formed using a material and a method similar to those used for forming the conductor 328. Then, planarization treatment is performed on the conductive film to expose a top surface of the insulator 216, whereby a conductor 218a, a conductor 218b, a conductor 218c, and the conductor 205 are formed (FIG. 15A). Note that arrows in FIG. 15A show CMP treatment.

Then, the insulator 220, the insulator 222, and the insulator 224 are formed.

The insulator 220, the insulator 222, and the insulator 224 can be formed using a material and a method similar to those used for forming the insulator 320. It is particularly preferable to use a high-k material such as hafnium oxide as the insulator 222.

Then, an oxide to be the oxide 230a and an oxide to be the oxide 230b are sequentially formed. The oxides are preferably formed successively without exposure to the air.

After the oxide to be the oxide 230b is formed, heat treatment is preferably performed. The heat treatment may be performed at a temperature higher than or equal to 250° C. and lower than or equal to 650° C., preferably higher than or equal to 300° C. and lower than or equal to 500° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. The heat treatment may be performed directly after the formation of the oxide to be the oxide 230b or may be performed after the oxide to be the oxide 230b is processed into an island shape. By the heat treatment, oxygen can be supplied from the insulator formed under the oxide 230a to the oxide 230a and the oxide 230b, so that oxygen vacancies in the oxide can be reduced.

Then, a conductive film to be the conductor 240a and the conductor 240b is formed over the oxide to be the oxide 230b. Then, a resist mask is formed by a method similar to that described above, and unnecessary portions of the conductive film are removed by etching. After that, unnecessary portions of the oxides are removed by etching using the conductive film as a mask. Then, the resist mask is removed. Thus, a stacked-layer structure of the oxide 230a having an island shape, the oxide 230b having an island shape, and the conductive film having an island shape can be formed.

Then, a resist mask is formed over the conductive film having an island shape by a method similar to that described above, and unnecessary portions of the conductive film are removed by etching. Then, the resist mask is removed. Thus, the conductor 240a and the conductor 240b are formed.

Then, an oxide to be the oxide 230c, an insulator to be the insulator 250, and a conductive film to be the conductor 260 are sequentially formed. For example, the conductive film to be the conductor 260 can be formed by stacking tantalum nitride formed by an ALD method and tungsten with high conductivity. The conductive film is preferably formed using a deposition gas that does not include chlorine. By the formation of tantalum nitride that has a barrier property with respect to oxygen, hydrogen, and water and is in contact with the insulator 250, the tungsten can be prevented from being oxidized by excess oxygen diffused into the insulator 250.

Then, a resist mask is formed over the conductive film by a method similar to that described above, and unnecessary portions of the conductive film are removed by etching, whereby the conductor 260 is formed.

Then, an insulator to be the insulator 270 is formed over the insulator to be the insulator 250 and the conductor 260. The insulator to be the insulator 270 is preferably formed using a material having a barrier property with respect to hydrogen and oxygen. Then, a resist mask is formed over the insulator by a method similar to that described above, and unnecessary portions of the insulator to be the insulator 270, the insulator to be the insulator 250, and the oxide to be the oxide 230c are removed by etching. After that, the resist mask is removed. Thus, the transistor 200 is formed.

Figure 15B:
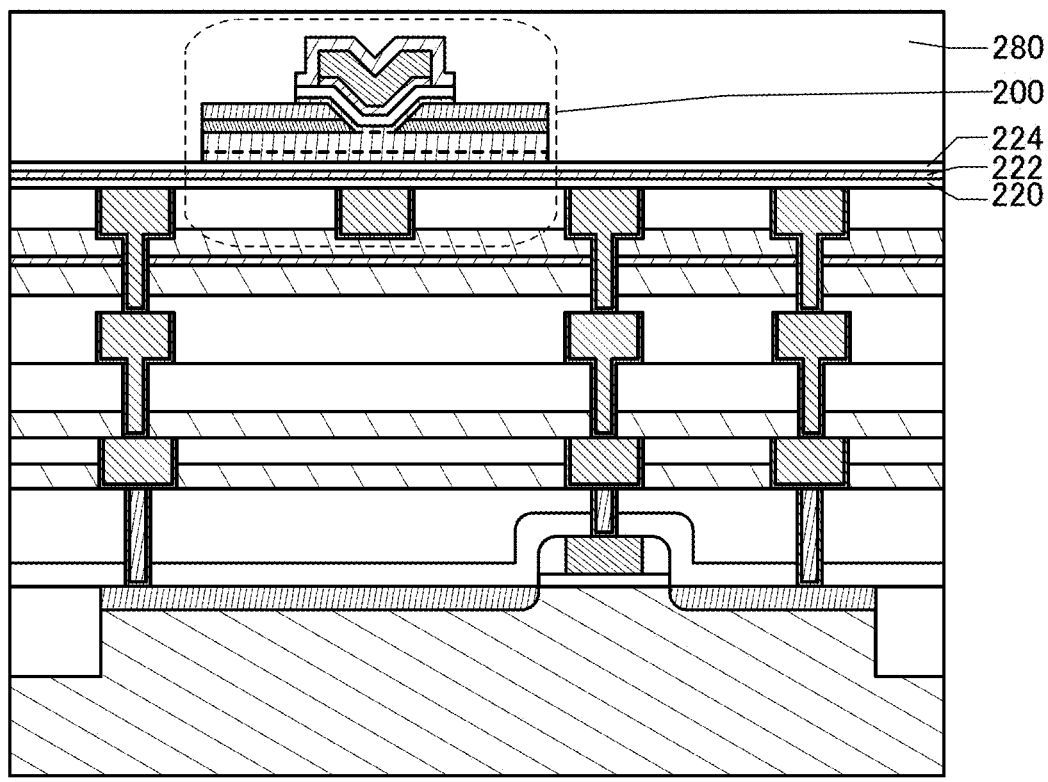

Then, the insulator 280 is formed. The insulator 280 preferably includes an oxide containing oxygen in excess of that in the stoichiometric composition. After an insulator to be the insulator 280 is formed, planarization treatment using a CMP method or the like may be performed to improve the planarity of a top surface of the insulator (FIG. 15B).

To make the insulator 280 contain excess oxygen, the insulator 280 may be formed in an oxygen atmosphere, for example. Alternatively, a region containing excess oxygen may be formed by introducing oxygen into the insulator 280 that has been formed. Both the methods may be combined.

As an example of the oxygen introduction treatment, a method of stacking oxides over the insulator 280 using a sputtering apparatus is given. For example, by forming the insulator 282 in an oxygen gas atmosphere using a sputtering apparatus, oxygen can be introduced into the insulator 280 while the insulator 282 is formed.

Figure 16:
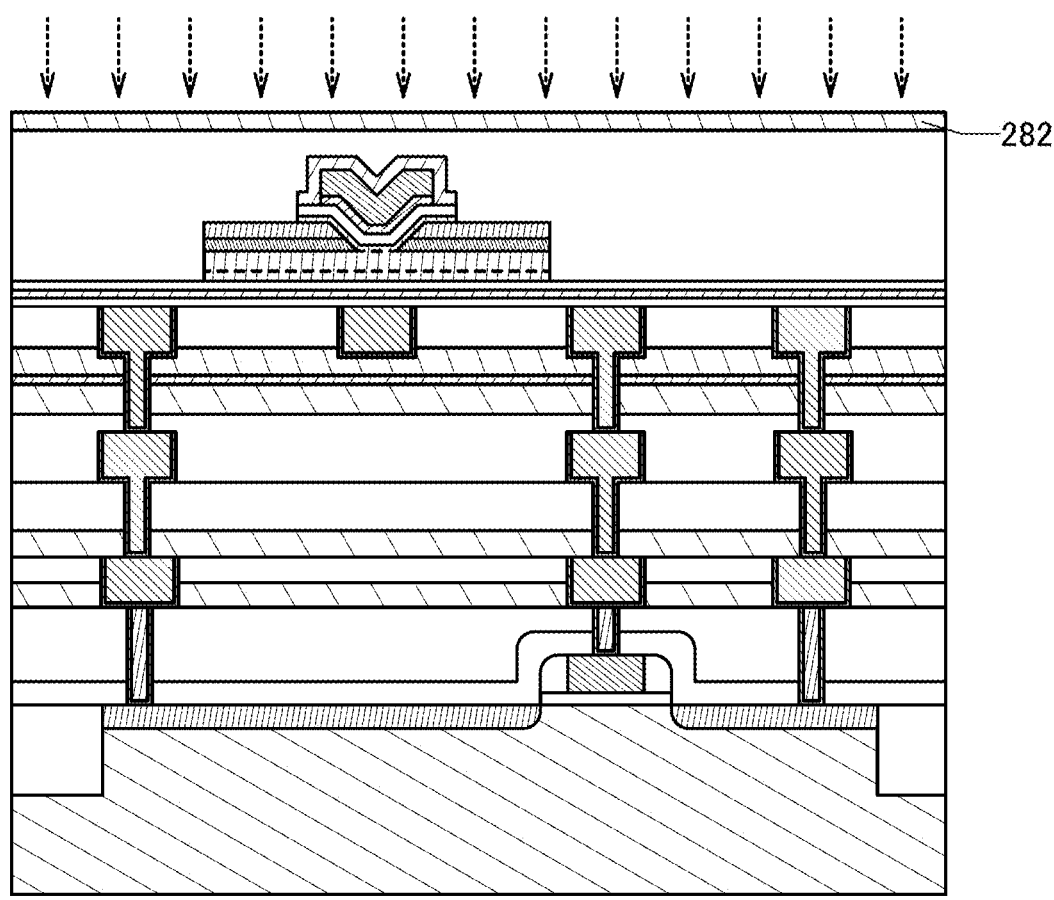
FIG. 16 illustrates the example of a method for manufacturing a semiconductor device of one embodiment.

Then, oxygen (at least including any of oxygen radicals, oxygen atoms, and oxygen ions) may be introduced into the insulator 280 through the insulator 282, so that a region containing excess oxygen is formed. Oxygen can be introduced by an ion implantation method, an ion doping method, a plasma immersion ion implantation method, plasma treatment, or the like. By performing the oxygen introduction treatment through the insulator 282, an excess-oxygen region can be formed in a state where the insulator 280 is protected (FIG. 16). Note that arrows in FIG. 16 show the oxygen introduction treatment.

A gas containing oxygen can be used for the oxygen introducing treatment. As a gas containing oxygen, oxygen, dinitrogen monoxide, nitrogen dioxide, carbon dioxide, carbon monoxide, or the like can be used. A rare gas may be contained in the oxygen-containing gas in introducing oxygen. For example, a mixed gas of carbon dioxide, hydrogen, and argon can be used.

Figure 17:
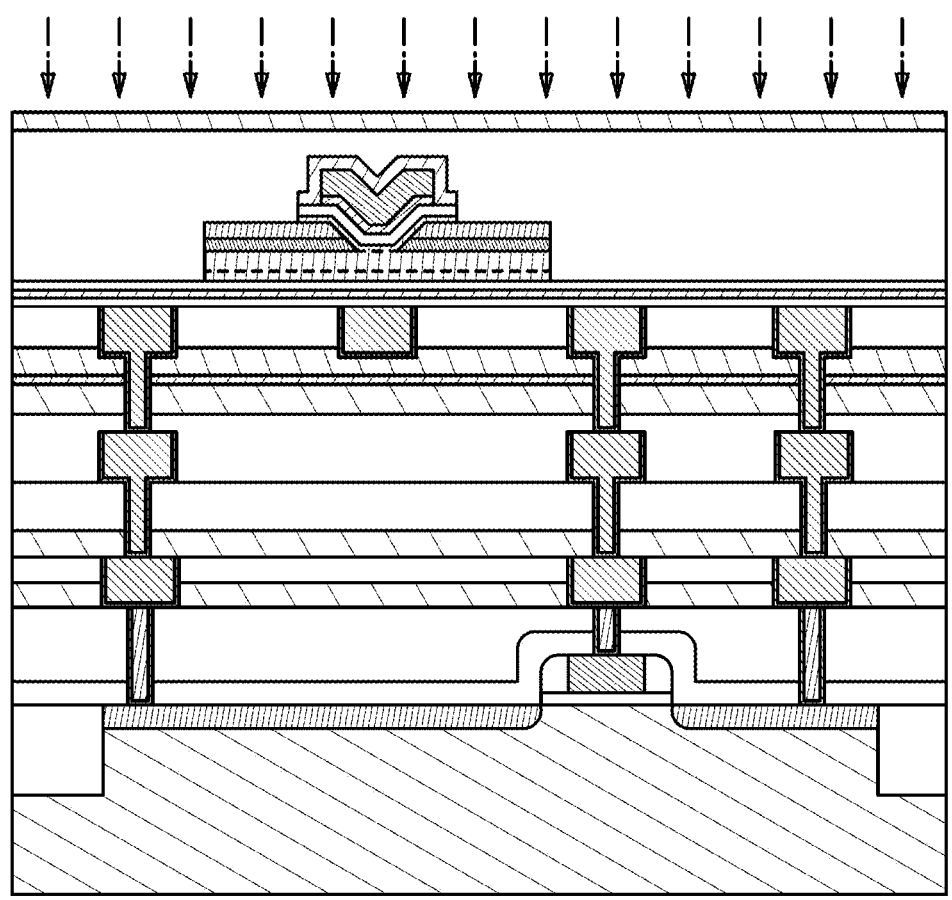
FIG. 17 illustrates the example of a method for manufacturing a semiconductor device of one embodiment.

Then, heat treatment is performed. The heat treatment may be performed at a temperature higher than or equal to 250° C. and lower than or equal to 650° C., preferably higher than or equal to 300° C. and lower than or equal to 500° C., more preferably higher than or equal to 350° C. and lower than or equal to 400° C., in an inert gas atmosphere, an atmosphere containing an oxidizing gas at 10 ppm or more, or a reduced pressure state. The heat treatment may be performed in such a manner that heat treatment is performed in an inert gas atmosphere, and then another heat treatment is performed in an atmosphere containing an oxidizing gas at 10 ppm or more, in order to compensate desorbed oxygen. For the heat treatment, lamp heating can be performed with the use of an RTA apparatus (FIG. 17). Note that arrows in FIG. 17 show the heat treatment.

By the heat treatment, excess oxygen introduced into the insulator 280 is diffused into the insulator 280. The insulator 280 is enclosed with the insulator 210 and the insulator 282 having a barrier property with respect to oxygen. Excess oxygen introduced into the insulator 280 is prevented from being released to the outside and is supplied to the oxide 230 efficiently.

Moreover, by the heat treatment, hydrogen in the insulator 280 is moved to the insulator 282. Hydrogen moved to the insulator 282 reacts with oxygen in the insulator 282, whereby water is produced in some cases. The formed water is released from a top surface of the insulator 282. Thus, hydrogen and water as impurities in the insulator 280 can be reduced. Note that in the case where insulator 282 is formed using aluminum oxide, the insulator 282 may function as a catalyst.

Oxygen supplied to the oxide 230 compensates oxygen vacancies in the oxide 230. Thus, the oxide where a channel is formed in the transistor 200 can be an oxide semiconductor with a low density of defect states and stable characteristics. That is, a change in electrical characteristics of the transistor 200 can be prevented and the reliability can be improved.

The oxygen introduction treatment and the heat treatment may be repeated a plurality of times until the excess-oxygen region is formed sufficiently or as long as the barrier property of the insulator 282 is not lost by damage caused by the oxygen introduction treatment.

In the case where the barrier property of the insulator 282 is degraded or destroyed, the oxygen introduction treatment and the heat treatment may be performed after the insulator 284 is formed. By performing the oxygen introduction treatment through the insulator 282 and the insulator 284, the excess-oxygen region can be formed in a state where the insulator 280 is protected.

Note that as the insulator 284, an aluminum oxide film having a barrier property is preferably formed by an ALD method, for example. A dense conductor including reduced defects such as cracks or pinholes or having a uniform thickness can be formed by an ALD method.

Figure 18:
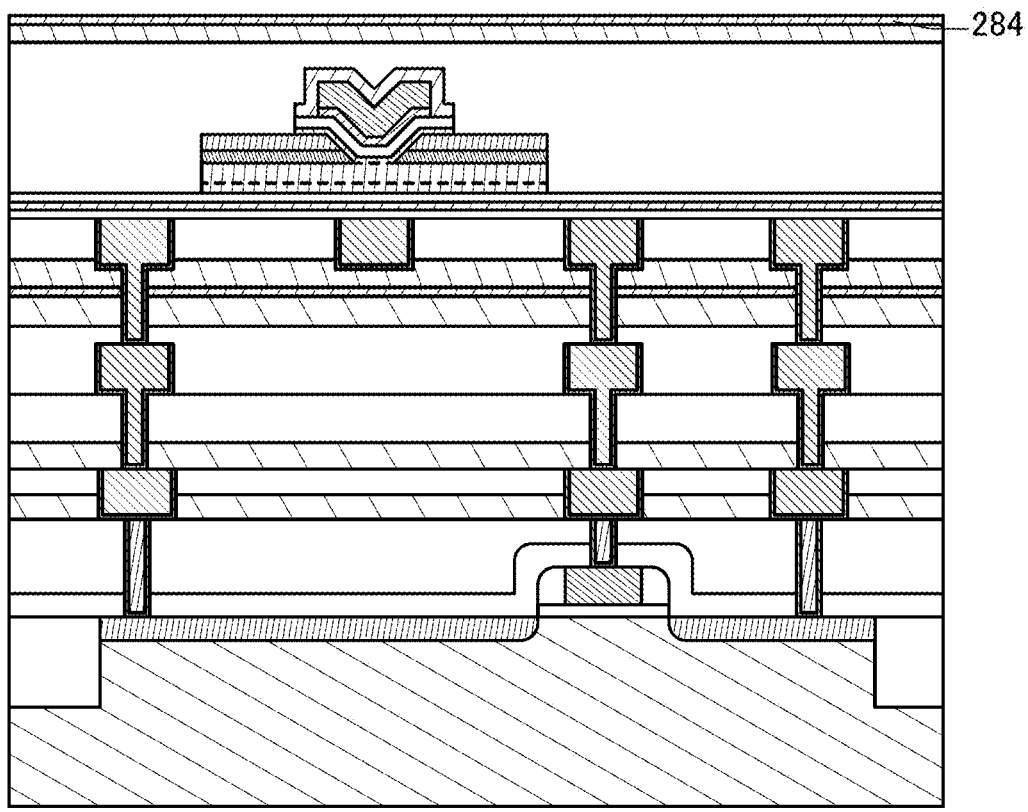
FIG. 18 illustrates the example of a method for manufacturing a semiconductor device of one embodiment.

By stacking the insulator 284 having dense film quality over the insulator 282, excess oxygen introduced into the insulator 280 can be effectively sealed on the transistor 200 side (FIG. 18).

Next, the capacitor 100 is formed. First, the insulator 102 is formed over the insulator 284. The insulator 102 can be formed using a material and a method similar to those used for forming the insulator 210.

The insulator 102 is preferably formed using, for example, a film having a barrier property that prevents diffusion of hydrogen and impurities from the capacitor 100 and the like into a region where the transistor 200 is formed. As an example of the film having a barrier property with respect to hydrogen, silicon nitride formed by a CVD method can be given.

Then, opening portions that reach the conductor 218a, the conductor 218b, the conductor 218c, the conductor 240a, the conductor 240b, and the like are formed in the insulator 220, the insulator 222, the insulator 224, the insulator 280, the insulator 282, and the insulator 284.

Figure 19:
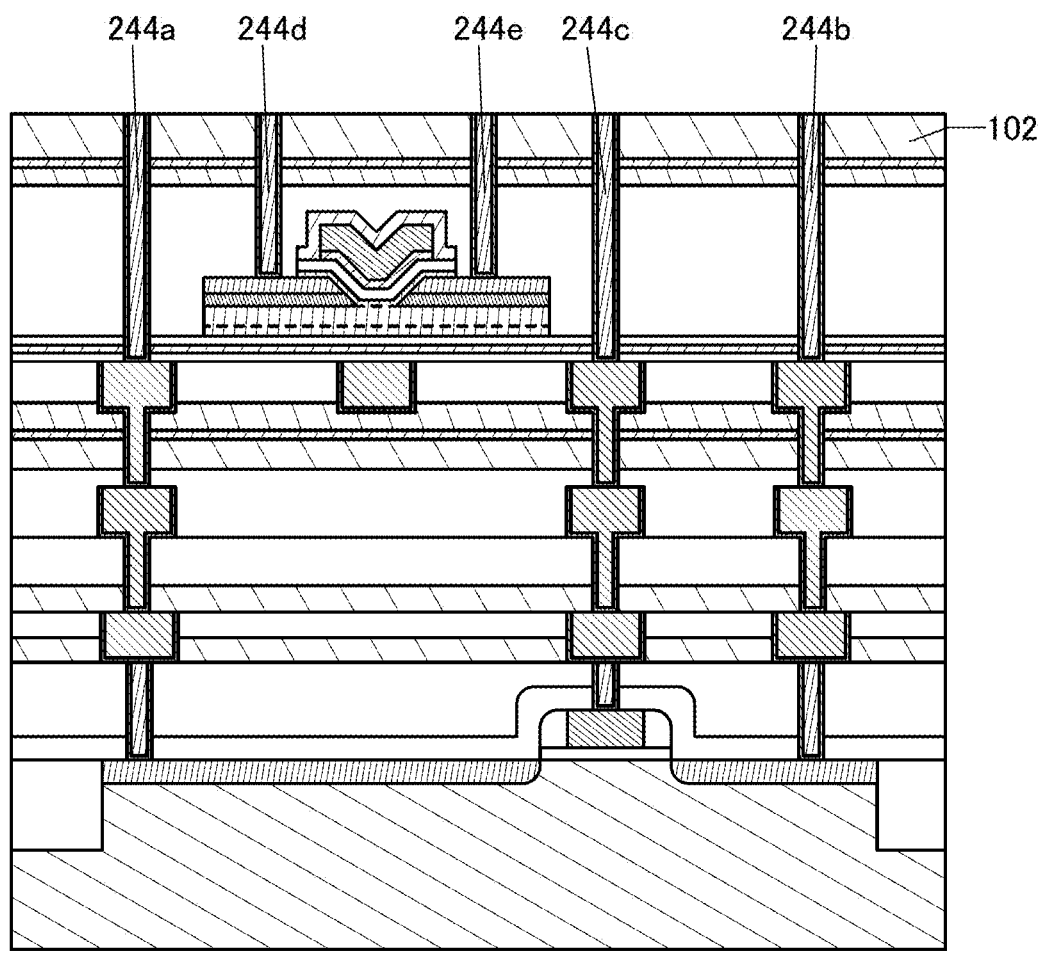
FIG. 19 illustrates the example of a method for manufacturing a semiconductor device of one embodiment.

Then, a conductive film is formed to fill the opening portions, and planarization treatment is performed on the conductive film to expose a top surface of the insulator 102, whereby a conductor 244a, a conductor 244b, a conductor 244c, a conductor 244d, and a conductor 244e are formed. Note that the conductive film can be formed using a material and a method similar to those used for forming the conductor 328 (FIG. 19).

Note that in the case where the conductor 244 has a stacked-layer structure, a conductor having a barrier property with respect to oxygen, hydrogen, or water, such as tantalum nitride, is preferably formed by an ALD method as a conductor in contact with the insulator 104. A dense conductor including reduced defects such as cracks or pinholes or having a uniform thickness can be formed by an ALD method. In the case where the insulator 104 having a barrier property with respect to oxygen, hydrogen, or water is in contact with the conductor 244 having a barrier property with respect to oxygen, hydrogen, or water, the diffusion of oxygen, hydrogen, or water can be prevented more reliably.

Then, the conductor 112 and the conductor 124 are formed over the insulator 102. Note that the conductor 112 and the conductor 124 can be formed using a material and a method similar to those used for forming other conductors such as the conductor 240 and the conductor 260. When the conductor 112 and the conductor 124 are formed, the top surface of the insulator 102 is preferably removed by a thickness larger than a thickness of the insulator 114. For example, by performing over-etching treatment, a part of the insulator 102 can be removed concurrently. Furthermore, by forming the conductor 112 or the like by over-etching treatment, etching can be performed without leaving an etching residue.

By changing the kind of etching gas in the etching treatment, a part of the insulator 102 can be removed efficiently.

After the conductor 112 is formed, a part of the insulator 102 may be removed using the conductor 112 as a hard mask, for example.

After the conductor 112 is formed, a surface of the conductor 112 may be subjected to cleaning treatment. By the cleaning treatment, an etching residue or the like can be removed.

Then, the insulator 114 covering a side surface and a top surface of the conductor 112 is formed. The insulator 114 can have a single-layer structure or a stacked-layer structure formed using, for example, silicon oxide, silicon oxynitride, silicon nitride oxide, silicon nitride, aluminum oxide, aluminum oxynitride, aluminum nitride oxide, aluminum nitride, hafnium oxide, hafnium oxynitride, hafnium nitride oxide, hafnium nitride, or the like.

For example, a stacked-layer structure of a high-k material such as aluminum oxide and a material with high dielectric strength such as silicon oxynitride is preferably used. The structure enables the capacitor 100 to include a high-k material and a material with high dielectric strength; thus, a sufficient capacitance can be provided, the dielectric strength can be increased, and the electrostatic breakdown of the capacitor 100 can be prevented, which leads to improvement in the reliability of the capacitor 100.

Then, the conductor 116 is formed over the insulator 114. Note that the conductor 116 can be formed using a material and a method similar to those used for forming the conductor 112.

The conductor 116 is preferably provided to cover the side surface and the top surface of the conductor 112 with the insulator 114 positioned therebetween. In the structure, the side surface of the conductor 112 faces the conductor 116 with the insulator 114 positioned therebetween. Thus, the capacitor can have a large capacitance per projected area.

Then, the insulator 120 that covers the capacitor 100 is formed. An insulator to be the insulator 120 can be formed using a material and a method similar to those used for forming the insulator 320 and the like.

A conductor 128a, a conductor 128b, a conductor 128c, and a conductor 128d are formed over the insulator 120. The conductor 128 can be formed using a material and a method similar to those used for forming the conductor 328.

Figure 20:
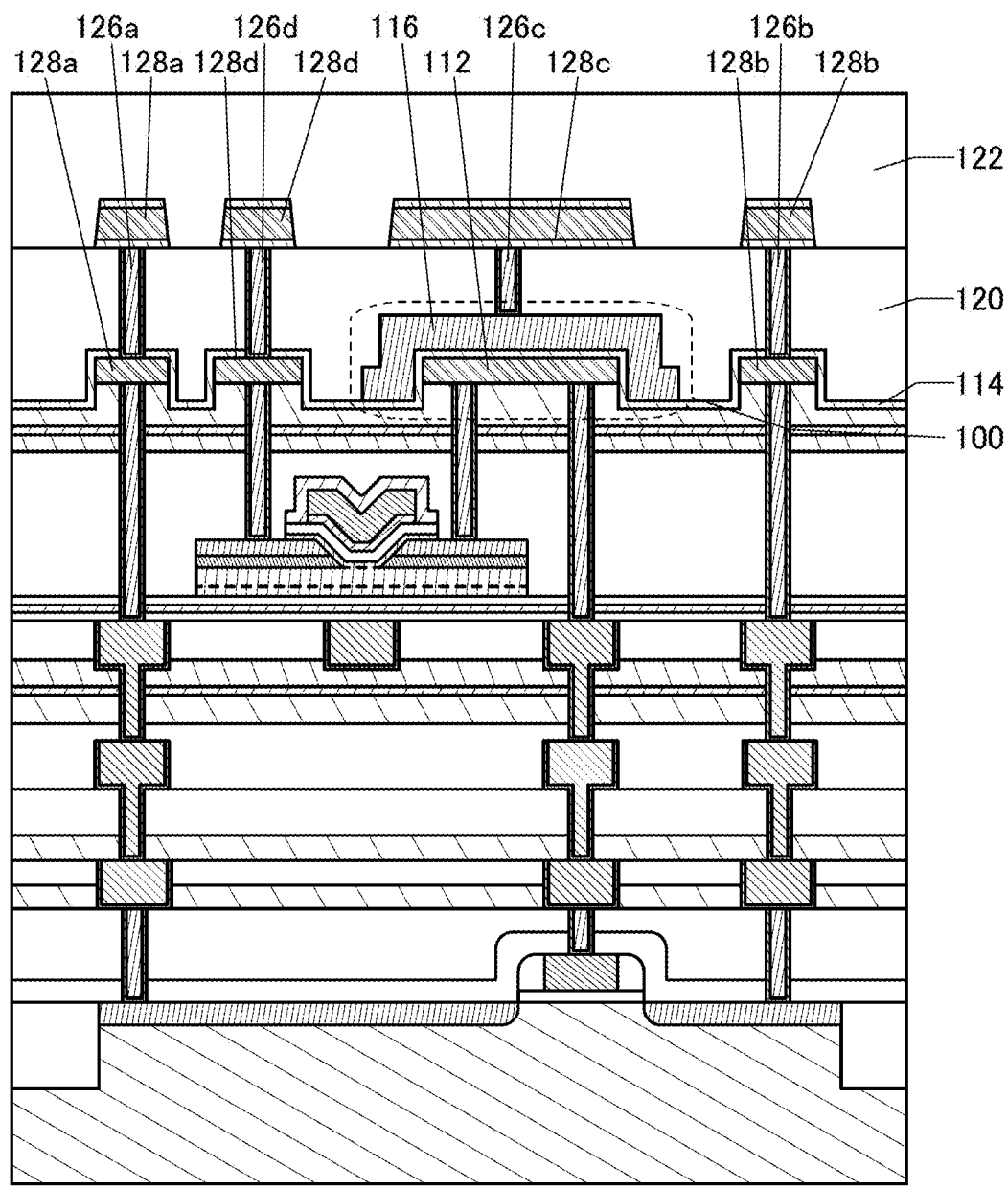
FIG. 20 illustrates the example of a method for manufacturing a semiconductor device of one embodiment.

Then, the insulator 122 is formed over the insulator 120 (FIG. 20). An insulator to be the insulator 122 can be formed using a material and a method similar to those used for forming the insulator 122 and the like.

Through the above steps, the semiconductor device of one embodiment of the present invention can be manufactured.

In a semiconductor device including a transistor using an oxide semiconductor and manufactured through the above steps, a change in electrical characteristics can be inhibited and reliability can be improved. A transistor including an oxide semiconductor with high on-state current can be provided. A transistor including an oxide semiconductor with low off-state current can be provided. A semiconductor device with low power consumption can be provided.

<Method 2 for Manufacturing Excess-Oxygen Region in Insulator>

A method for manufacturing an excess-oxygen region in an insulator in the present invention is described with reference to FIG. 21. Note that FIG. 21 is a process flow diagram illustrating an example of a process of forming an excess-oxygen region in an insulator in a method for manufacturing a semiconductor device.

[First Step]

Figure 21:
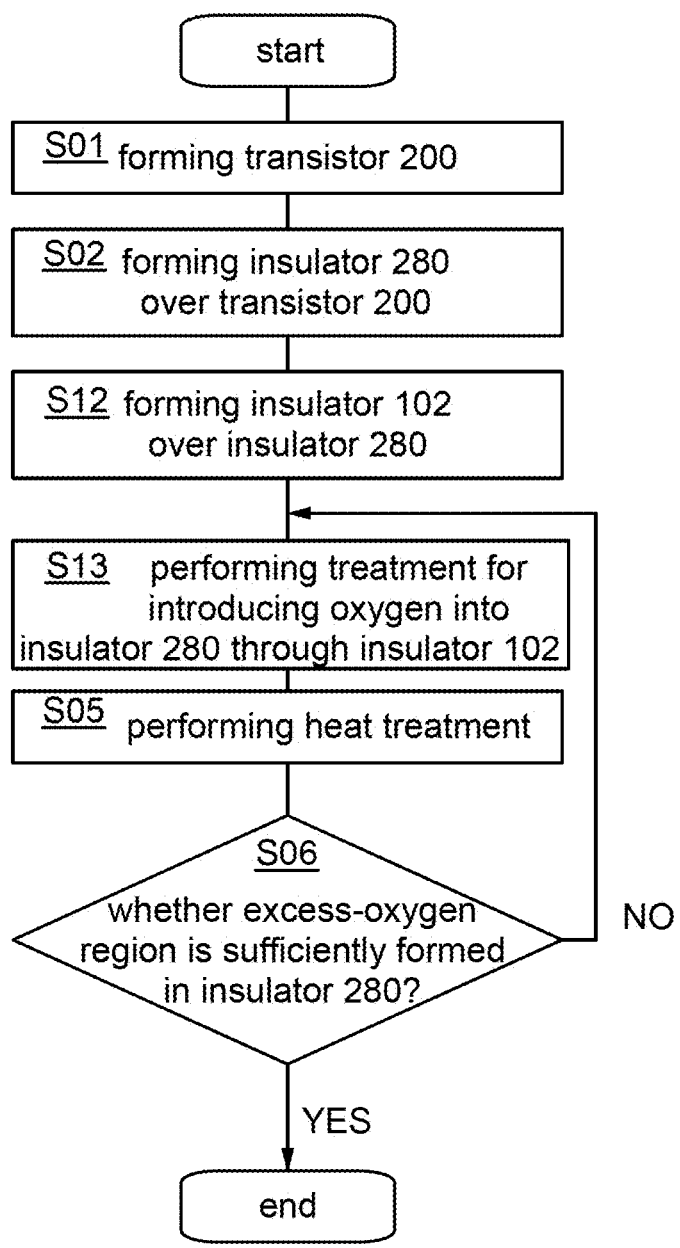
FIG. 21 is a process flowchart of a semiconductor device of one embodiment.

A first step includes a step of forming the transistor 200 (see Step S01 in FIG. 21).

[Second Step]

A second step includes a step of forming the insulator 280 (see Step S02 in FIG. 21).

[Twelfth Step]

A twelfth step includes a step of forming the insulator 102 (see Step S12 in FIG. 21). Note that the insulator 280 is formed using a material having a barrier property with respect to oxygen, hydrogen, or water.

As an example of the film having a barrier property with respect to hydrogen, silicon nitride formed by a CVD method can be given. Diffusion of hydrogen into a semiconductor element including an oxide semiconductor, such as the transistor 200, degrades the characteristics of the semiconductor element in some cases. Therefore, a film that prevents hydrogen diffusion is preferably provided between the transistor 200 and the transistor 300. Specifically, the film that prevents hydrogen diffusion is a film from which hydrogen is less likely to be released.

The amount of released hydrogen can be measured by thermal desorption spectroscopy (TDS), for example. The amount of hydrogen released from the insulator 324 that is converted into hydrogen atoms per area of the insulator 324 is less than or equal to $10 \times 10^{15}$ atoms/cm$^2$, preferably less than or equal to $5 \times 10^{15}$ atoms/cm$^2$ in TDS analysis in the range of 50° C. to 500° C., for example.

The insulator 102 may have a thickness greater than or equal to 10 nm and less than or equal to 80 nm, preferably greater than or equal to 20 nm and less than or equal to 60 nm. The insulator 102 is formed to a thickness with which the barrier property of the insulator 102 is not destroyed even when a thirteenth step and a fourteenth step are performed repeatedly, and through which a dopant passes in oxygen introduction treatment in the thirteenth step.

[Thirteenth Step]

The thirteenth step includes a step of performing treatment for introducing oxygen into the insulator 280 through the insulator 102 (see Step S13 in FIG. 21). As the treatment for introducing oxygen into the insulator 280, an ion implantation method, an ion doping method, a plasma immersion ion implantation method, plasma treatment, or the like can be used. By this step, oxygen in excess of that in the stoichiometric composition is introduced into the insulator 280, so that an excess-oxygen region is formed.

[Fourteenth Step]

The fourteenth step includes a step of performing heat treatment (see Step S05 in FIG. 21). The heat treatment may be performed at a temperature higher than or equal to 250° C. and lower than or equal to 650° C., preferably higher than or equal to 300° C. and lower than or equal to 500° C., more preferably higher than or equal to 350° C. and lower than or equal to 400° C. The heat treatment is performed in an inert gas atmosphere or an atmosphere containing an oxidizing gas at 10 ppm or more, 1% or more, or 10% or more. The heat treatment may be performed under a reduced pressure. For the heat treatment, lamp heating can be performed with use of an RTA apparatus.

By the heat treatment, oxygen introduced by the thirteenth step is diffused into a film of the insulator 280 and the transistor 200. By supply of oxygen to the oxide 230 in the transistor 200, oxygen vacancies in the oxide 230 are reduced. Thus, the oxide where a channel is formed in the transistor 200 can be an oxide semiconductor with a low density of defect states and stable characteristics. That is, a change in the electrical characteristics of the transistor 200 can be prevented and the reliability can be improved.

Note that the thirteenth step and the fourteenth step may be performed concurrently. That is, the treatment for introducing oxygen may be performed while the substrate is heated, whereby the productivity can be improved.

[Fifteenth Step]

In a fifteenth step, whether the excess-oxygen region is sufficiently formed in the insulator 280 is determined (see Step S06 in FIG. 21). In the case where the excess-oxygen region is formed sufficiently, the process proceeds to a step for forming the capacitor 100 or the like. In the case where the formation of the excess-oxygen region is insufficient, the thirteenth step and the fourteenth step are performed repeatedly until the excess-oxygen region is formed sufficiently.

As described above, in the method for manufacturing a semiconductor device of one embodiment of the present invention, an excess-oxygen region can be formed by repeatedly performing the treatment for introducing oxygen and the heat treatment on the insulator 280. Furthermore, by performing the treatment for introducing oxygen through the insulator 102, damage to the insulator 280 can be prevented and oxygen can be introduced efficiently. Accordingly, a change in electrical characteristics can be prevented and reliability can be improved in the transistor including an oxide semiconductor.

At least part of this embodiment can be implemented in combination with any of the other embodiments described in this specification as appropriate.

Embodiment 4

In this embodiment, an oxide semiconductor included in the transistor described in the above embodiment will be described below with reference to FIGS. 26A to 26E, FIGS. 27A to 27E, FIGS. 28A to 28D, FIGS. 29A and 29B, and FIG. 30.

<Structure of Oxide Semiconductor>

The structure of an oxide semiconductor will be described below.

An oxide semiconductor is classified into a single crystal oxide semiconductor and a non-single-crystal oxide semiconductor. Examples of a non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of a crystalline oxide semiconductor include a single crystal oxide semiconductor, a CAAC-OS, a polycrystalline oxide semiconductor, and an nc-OS.

An amorphous structure is generally thought to be isotropic and have no non-uniform structure, to be metastable and not have fixed positions of atoms, to have a flexible bond angle, and to have a short-range order but have no long-range order, for example.

This means that a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

<CAAC-OS>

First, a CAAC-OS is described.

A CAAC-OS is one of oxide semiconductors having a plurality of c-axis aligned crystal parts (also referred to as pellets).

Figure 26A:
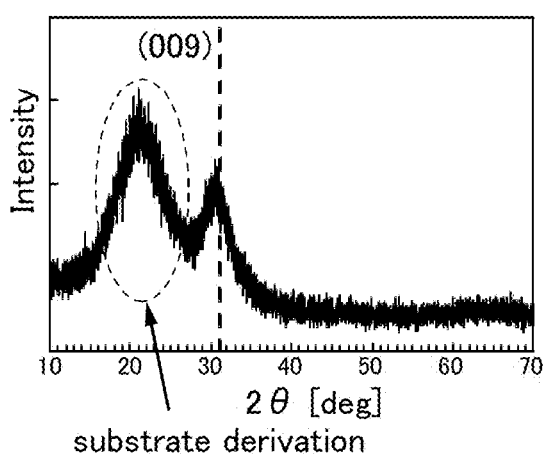
FIGS. 26A to 26E show structural analysis of a CAAC-OS and a single crystal oxide semiconductor by XRD and selected-area electron diffraction patterns of a CAAC-OS.
Figure 26D:
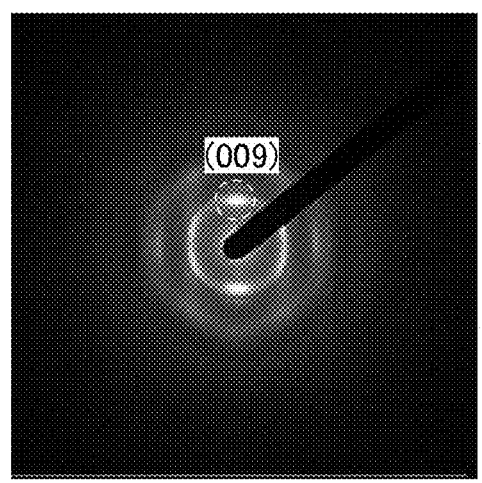

Analysis of a CAAC-OS by X-ray diffraction (XRD) is described. For example, when the structure of a CAAC-OS including an $InGaZnO_4$ crystal that is classified into the space group R-3m is analyzed by an out-of-plane method, a peak appears at a diffraction angle (2θ) of around 31° as shown in FIG. 26A. This peak is derived from the (009) plane of the $InGaZnO_4$ crystal, which indicates that crystals in the CAAC-OS have c-axis alignment, and that the c-axes are aligned in a direction substantially perpendicular to a surface over which the CAAC-OS film is formed (also referred to as a formation surface) or the top surface of the CAAC-OS film. Note that a peak sometimes appears at a 2θ of around 36° in addition to the peak at a 2θ of around 31°. The peak at a 2θ of around 36° is derived from a crystal structure that is classified into the space group Fd-3m; thus, this peak is preferably not exhibited in a CAAC-OS.

Figure 26B:
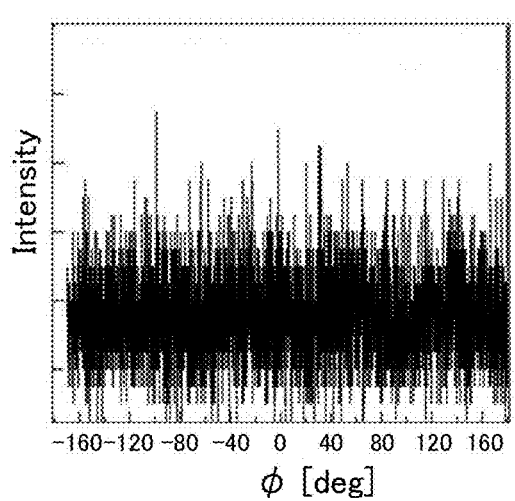
Figure 26E:
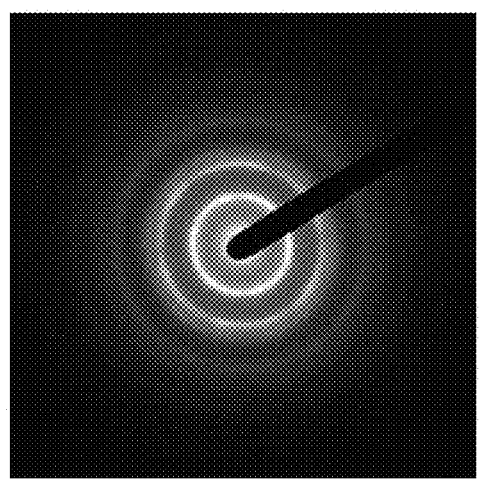
Figure 26C:
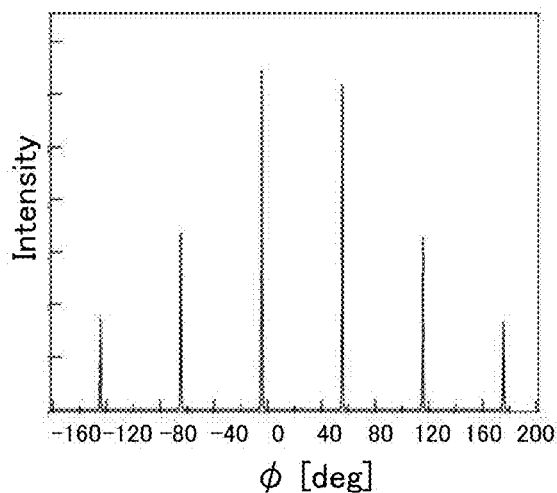

On the other hand, in structural analysis of the CAAC-OS by an in-plane method in which an X-ray is incident on the CAAC-OS in a direction parallel to the formation surface, a peak appears at a 2θ of around 56°. This peak is attributed to the (110) plane of the $InGaZnO_4$ crystal. When analysis (φ scan) is performed with 2θ fixed at around 56° and with the sample rotated using a normal vector to the sample surface as an axis (φ axis), as shown in FIG. 26B, a peak is not clearly observed. In contrast, in the case where single crystal $InGaZnO_4$ is subjected to φ scan with 2θ fixed at around 56°, as shown in FIG. 26C, six peaks which are derived from crystal planes equivalent to the (110) plane are observed. Accordingly, the structural analysis using XRD shows that the directions of a-axes and b-axes are irregularly oriented in the CAAC-OS.

Next, a CAAC-OS analyzed by electron diffraction is described. For example, when an electron beam with a probe diameter of 300 nm is incident on a CAAC-OS including an $InGaZnO_4$ crystal in a direction parallel to the formation surface of the CAAC-OS, a diffraction pattern (also referred to as a selected-area electron diffraction pattern) shown in FIG. 26D can be obtained. In this diffraction pattern, spots derived from the (009) plane of an $InGaZnO_4$ crystal are included. Thus, the electron diffraction also indicates that pellets included in the CAAC-OS have c-axis alignment and that the c-axes are aligned in a direction substantially perpendicular to the formation surface or the top surface of the CAAC-OS. Meanwhile, FIG. 26E shows a diffraction pattern obtained in such a manner that an electron beam with a probe diameter of 300 nm is incident on the same sample in a direction perpendicular to the sample surface. As shown in FIG. 26E, a ring-like diffraction pattern is observed. Thus, the electron diffraction using an electron beam with a probe diameter of 300 nm also indicates that the a-axes and b-axes of the pellets included in the CAAC-OS do not have regular orientation. The first ring in FIG. 26E is considered to be derived from the (010) plane, the (100) plane, and the like of the $InGaZnO_4$ crystal. The second ring in FIG. 26E is considered to be derived from the (110) plane and the like.

In a combined analysis image (also referred to as a high-resolution TEM image) of a bright-field image and a diffraction pattern of a CAAC-OS, which is obtained using a transmission electron microscope (TEM), a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 27A:
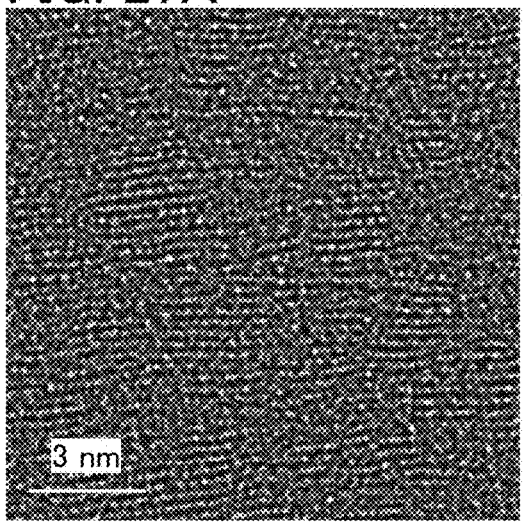
FIGS. 27A to 27E show a cross-sectional TEM image and plan-view TEM images of a CAAC-OS and images obtained through analysis thereof.

FIG. 27A shows a high-resolution TEM image of a cross section of the CAAC-OS which is observed from a direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 27A shows pellets in which metal atoms are arranged in a layered manner. FIG. 27A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS, and is parallel to the formation surface or the top surface of the CAAC-OS.

Figure 27D:
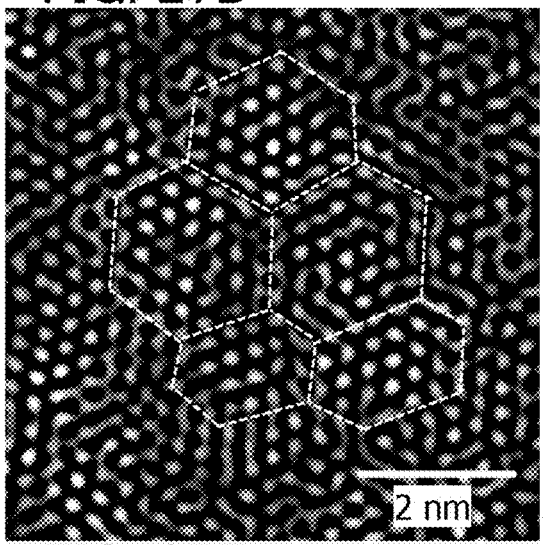
Figure 27B:
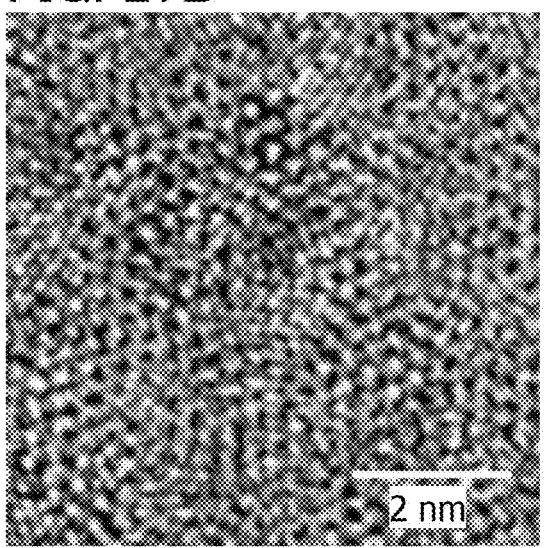
Figure 27E:
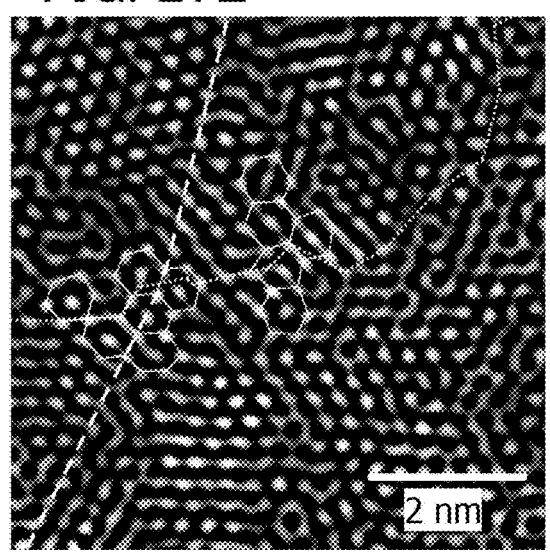
Figure 27C:
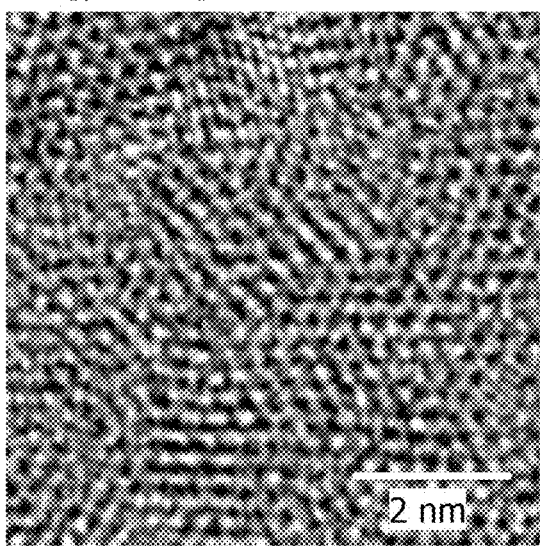

FIGS. 27B and 27C show Cs-corrected high-resolution TEM images of a plane of the CAAC-OS observed from a direction substantially perpendicular to the sample surface. FIGS. 27D and 27E are images obtained through image processing of FIGS. 27B and 27C. The method of image processing is as follows. The image in FIG. 27B is subjected to fast Fourier transform (FFT), so that an FFT image is obtained. Then, mask processing is performed such that a range of from 2.8 $nm^{-1}$ to 5.0 $nm^{-1}$ from the origin in the obtained FFT image remains. After the mask processing, the FFT image is processed by inverse fast Fourier transform (IFFT) to obtain a processed image. The image obtained in this manner is called an FFT filtering image. The FFT filtering image is a Cs-corrected high-resolution TEM image from which a periodic component is extracted, and shows a lattice arrangement.

In FIG. 27D, a portion where a lattice arrangement is broken is denoted with a dashed line. A region surrounded by a dashed line is one pellet. The portion denoted with the dashed line is a junction of pellets. The dashed line draws a hexagon, which means that the pellet has a hexagonal shape. Note that the shape of the pellet is not always a regular hexagon but is a non-regular hexagon in many cases.

In FIG. 27E, a dotted line denotes a portion where the direction of a lattice arrangement is changed between a region with a regular lattice arrangement and another region with a regular lattice arrangement, and a dashed line denotes the change in the direction of the lattice arrangement. A clear crystal grain boundary cannot be observed even in the vicinity of the dotted line. When a lattice point in the vicinity of the dotted line is regarded as a center and surrounding lattice points are joined, a distorted hexagon, pentagon, and/or heptagon can be formed, for example. That is, a lattice arrangement is distorted so that formation of a crystal grain boundary is inhibited. This is probably because the CAAC-OS can tolerate distortion owing to a low density of the atomic arrangement in an a-b plane direction, an interatomic bond distance changed by substitution of a metal element, and the like.

As described above, the CAAC-OS has c-axis alignment, its pellets (nanocrystals) are connected in an a-b plane direction, and the crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has small amounts of impurities and defects (e.g., oxygen vacancies).

Note that the impurity means an element other than the main components of the oxide semiconductor, such as hydrogen, carbon, silicon, or a transition metal element. For example, an element (specifically, silicon or the like) having higher strength of bonding to oxygen than a metal element included in an oxide semiconductor extracts oxygen from the oxide semiconductor, which results in disorder of the atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

The characteristics of an oxide semiconductor having impurities or defects might be changed by light, heat, or the like. Impurities contained in the oxide semiconductor might serve as carrier traps or carrier generation sources, for example. For example, an oxygen vacancy in the oxide semiconductor might serve as a carrier trap or serve as a carrier generation source when hydrogen is captured therein.

The CAAC-OS having small amounts of impurities and oxygen vacancies is an oxide semiconductor with low carrier density (specifically, lower than $8\times10^{11}/cm^3$, preferably lower than $1\times10^{11}/cm^3$, and further preferably lower than $1\times10^{10}/cm^3$, and is higher than or equal to $1\times10^{-9}/cm^3$). Such an oxide semiconductor is referred to as a highly purified intrinsic or substantially highly purified intrinsic oxide semiconductor. A CAAC-OS has a low impurity concentration and a low density of defect states. Thus, the CAAC-OS can be referred to as an oxide semiconductor having stable characteristics.

<nc-OS>

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 28A:
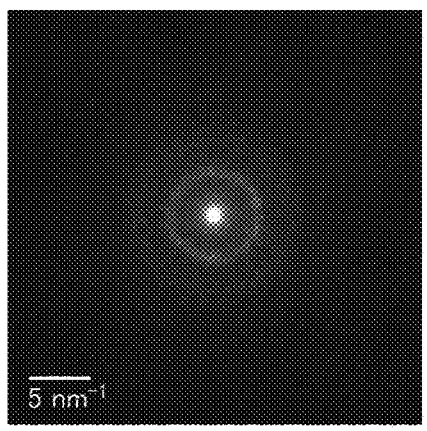
FIGS. 28A to 28D show electron diffraction patterns and a cross-sectional TEM image of an nc-OS.
Figure 28B:
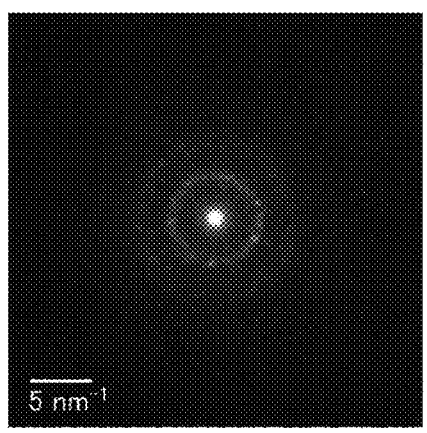

For example, when an electron beam with a probe diameter of 50 nm is incident on a 34-nm-thick region of thinned nc-OS including an $InGaZnO_4$ crystal in a direction parallel to the formation surface, a ring-shaped diffraction pattern (a nanobeam electron diffraction pattern) shown in FIG. 28A is observed. FIG. 28B shows a diffraction pattern obtained when an electron beam with a probe diameter of 1 nm is incident on the same sample. As shown in FIG. 28B, a plurality of spots are observed in a ring-like region. In other words, ordering in an nc-OS is not observed with an electron beam with a probe diameter of 50 nm but is observed with an electron beam with a probe diameter of 1 nm.

Figure 28C:
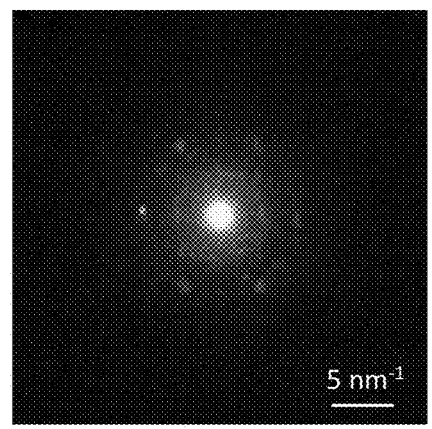

Furthermore, an electron diffraction pattern in which spots are arranged in an approximately regular hexagonal shape is observed in some cases as shown in FIG. 28C when an electron beam having a probe diameter of 1 nm is incident on a region with a thickness of less than 10 nm. This means that an nc-OS has a well-ordered region, i.e., a crystal, in the range of less than 10 nm in thickness. Note that an electron diffraction pattern having regularity is not observed in some regions because crystals are aligned in various directions.

Figure 28D:
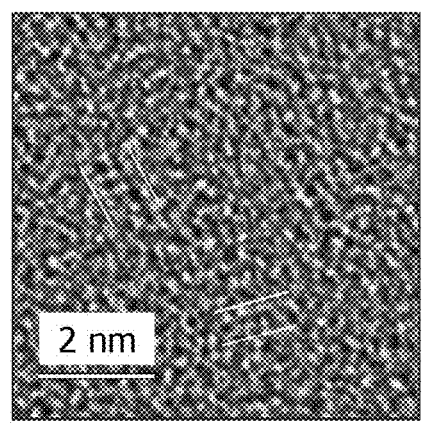

FIG. 28D shows a Cs-corrected high-resolution TEM image of a cross section of an nc-OS observed from the direction substantially parallel to the formation surface. In a high-resolution TEM image, an nc-OS has a region in which a crystal part is observed, such as the part indicated by additional lines in FIG. 28D, and a region in which a crystal part is not clearly observed. In most cases, the size of a crystal part included in the nc-OS is greater than or equal to 1 nm and less than or equal to 10 nm, in particular, greater than or equal to 1 nm and less than or equal to 3 nm. Note that an oxide semiconductor including a crystal part whose size is greater than 10 nm and less than or equal to 100 nm is sometimes referred to as a microcrystalline oxide semiconductor. In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not ordered. Accordingly, the nc-OS cannot be distinguished from an a-like OS or an amorphous oxide semiconductor, depending on an analysis method.

Since there is no regularity of crystal orientation between the pellets (nanocrystals) as mentioned above, the nc-OS can also be referred to as an oxide semiconductor including random aligned nanocrystals (RANC) or an oxide semiconductor including non-aligned nanocrystals (NANC).

The nc-OS is an oxide semiconductor that has high regularity as compared to an amorphous oxide semiconductor. Therefore, the nc-OS is likely to have a lower density of defect states than an a-like OS and an amorphous oxide semiconductor. Note that there is no regularity of crystal orientation between different pellets in the nc-OS. Therefore, the nc-OS has a higher density of defect states than the CAAC-OS.

<a-Like OS>

An a-like OS has a structure intermediate between those of the nc-OS and the amorphous oxide semiconductor.

Figure 29A:
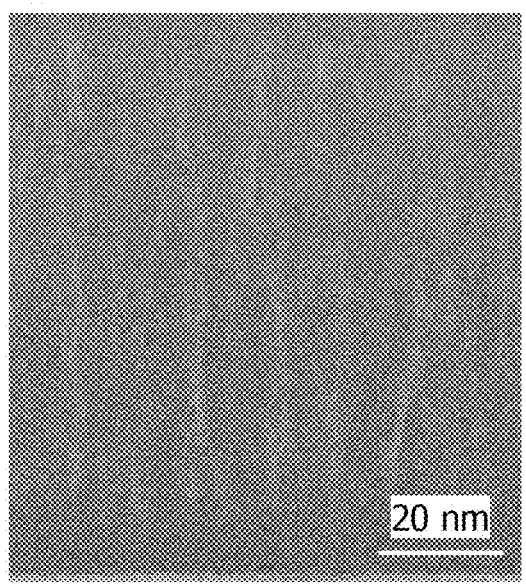
FIGS. 29A and 29B show cross-sectional TEM images of an a-like OS.
Figure 29B:
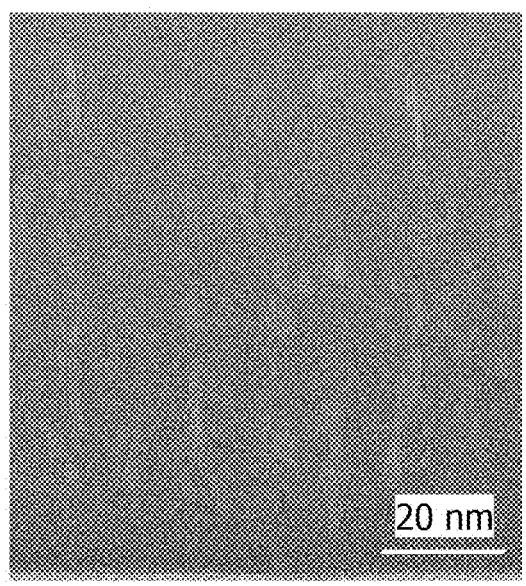

FIGS. 29A and 29B are high-resolution cross-sectional TEM images of an a-like OS. FIG. 29A is the high-resolution cross-sectional TEM image of the a-like OS at the start of the electron irradiation. FIG. 29B is the high-resolution cross-sectional TEM image of a-like OS after the electron ($e^-$) irradiation at $4.3\times10^8$ $e^-/nm^2$. FIGS. 29A and 29B show that stripe-like bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared to a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an $InGaZnO_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion where the spacing between lattice fringes is greater than or equal to 0.28 nm and less than or equal to 0.30 nm is regarded as a crystal part of $InGaZnO_4$ in the following description. Each of lattice fringes corresponds to the a-b plane of the $InGaZnO_4$ crystal.

Figure 30:
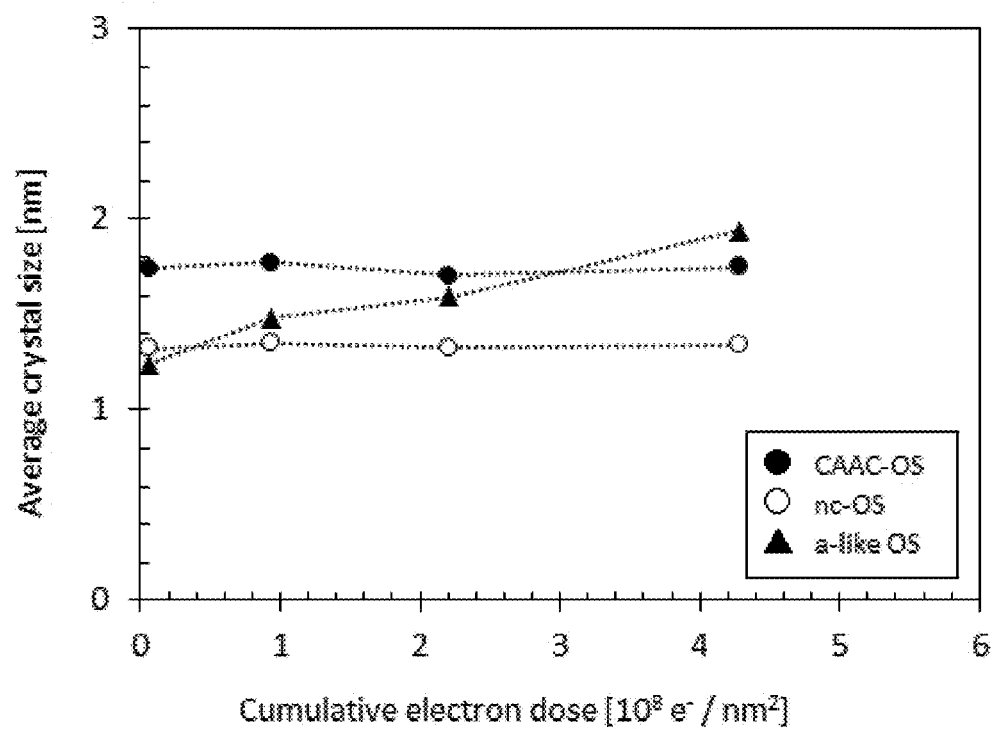
FIG. 30 shows a change in crystal part of an In—Ga—Zn oxide induced by electron irradiation.

FIG. 30 shows change in the average size of crystal parts (at 22 points to 30 points) in each sample. Note that the crystal part size corresponds to the length of a lattice fringe. FIG. 30 indicates that the crystal part size in the a-like OS increases with an increase in the cumulative electron dose in obtaining TEM images, for example. As shown in FIG. 30, a crystal part of approximately 1.2 nm (also referred to as an initial nucleus) at the start of TEM observation grows to a size of approximately 1.9 nm at a cumulative electron ($e^-$) dose of $4.2\times10^8$ $e^-/nm^2$. In contrast, the crystal part size in the nc-OS and the CAAC-OS shows little change from the start of electron irradiation to a cumulative electron dose of $4.2\times10^8$ $e^-/nm^2$. As shown in FIG. 30, the crystal part sizes in an nc-OS and a CAAC-OS are approximately 1.3 nm and approximately 1.8 nm, respectively, regardless of the cumulative electron dose. For the electron beam irradiation and TEM observation, a Hitachi H-9000NAR transmission electron microscope is used. The conditions of electron beam irradiation are as follows: the accelerating voltage is 300 kV; the current density is $6.7\times10^5$ $e^-/(nm^2\cdot s)$; and the diameter of irradiation region is 230 nm.

In this manner, growth of the crystal part in the a-like OS is sometimes induced by electron irradiation. In contrast, in the nc-OS and the CAAC-OS, growth of the crystal part is hardly induced by electron irradiation. Therefore, the a-like OS has an unstable structure as compared to the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single crystal oxide semiconductor having the same composition. The density of each of the nc-OS and the CAAC-OS is higher than or equal to 92.3% and lower than 100% of the density of the single crystal oxide semiconductor having the same composition. Note that it is difficult to deposit an oxide semiconductor having a density of lower than 78% of the density of the single crystal oxide semiconductor.

For example, in the case of an oxide semiconductor having an atomic ratio of In:Ga:Zn=1:1:1, the density of single crystal $InGaZnO_4$ with a rhombohedral crystal structure is 6.357 $g/cm^3$. Accordingly, in the case of the semiconductor having an atomic ratio of In:Ga:Zn=1:1:1, the density of the a-like OS is higher than or equal to 5.0 $g/cm^3$ and lower than 5.9 $g/cm^3$. For example, in the case of the oxide semiconductor having an atomic ratio of In:Ga:Zn=1:1:1, the density of each of the nc-OS and the CAAC-OS is higher than or equal to 5.9 $g/cm^3$ and lower than 6.3 $g/cm^3$.

Note that in the case where an oxide semiconductor having a certain composition does not exist in a single crystal structure, single crystal oxide semiconductors with different compositions are combined at an adequate ratio, which makes it possible to calculate density equivalent to that of a single crystal oxide semiconductor with the desired composition. The density of a single crystal oxide semiconductor having the desired composition can be calculated using a weighted average according to the combination ratio of the single crystal oxide semiconductors with different compositions. Note that it is preferable to use as few kinds of single crystal oxide semiconductors as possible to calculate the density.

As described above, oxide semiconductors have various structures and various properties. Note that an oxide semiconductor may be a stacked layer film including two or more films of an amorphous oxide semiconductor, an a-like OS, an nc-OS, and a CAAC-OS, for example.

The structure described in this embodiment can be used in appropriate combination with the structure described in any of the other embodiments.

Embodiment 5

A CPU including a semiconductor device such as any of the above-described transistors or the above-described memory device is described below.

<Configuration of CPU>

Figure 31:
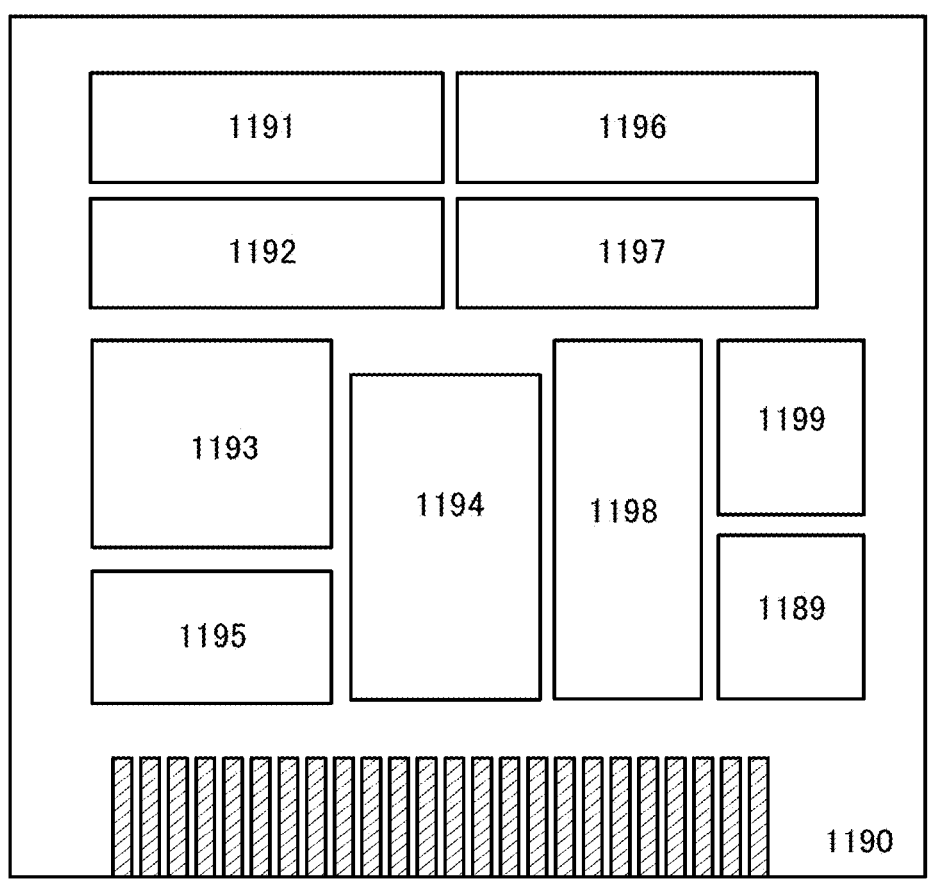
FIG. 31 is a block diagram illustrating a semiconductor device of one embodiment of the present invention.

FIG. 31 is a block diagram illustrating a configuration example of a CPU including any of the above-described transistors as a component.

The CPU illustrated in FIG. 31 includes, over a substrate 1190, an arithmetic logic unit (ALU) 1191, an ALU controller 1192, an instruction decoder 1193, an interrupt controller 1194, a timing controller 1195, a register 1196, a register controller 1197, a bus interface 1198, a rewritable ROM 1199, and an ROM interface 1189. A semiconductor substrate, an SOI substrate, a glass substrate, or the like is used as the substrate 1190. The ROM 1199 and the ROM interface 1189 may be provided over a separate chip. Needless to say, the CPU in FIG. 31 is just an example of a simplified structure, and an actual CPU may have a variety of structures depending on the application. For example, the CPU may have the following configuration: a structure including the CPU illustrated in FIG. 31 or an arithmetic circuit is considered as one core; a plurality of the cores are included; and the cores operate in parallel. The number of bits that the CPU can process in an internal arithmetic circuit or in a data bus can be 8, 16, 32, or 64, for example.

An instruction that is input to the CPU through the bus interface 1198 is input to the instruction decoder 1193 and decoded therein, and then, input to the ALU controller 1192, the interrupt controller 1194, the register controller 1197, and the timing controller 1195.

The ALU controller 1192, the interrupt controller 1194, the register controller 1197, and the timing controller 1195 conduct various controls in accordance with the decoded instruction. Specifically, the ALU controller 1192 generates signals for controlling the operation of the ALU 1191. While the CPU is executing a program, the interrupt controller 1194 processes an interrupt request from an external input/output device or a peripheral circuit depending on its priority or a mask state. The register controller 1197 generates an address of the register 1196, and reads/writes data from/to the register 1196 depending on the state of the CPU.

The timing controller 1195 generates signals for controlling operation timings of the ALU 1191, the ALU controller 1192, the instruction decoder 1193, the interrupt controller 1194, and the register controller 1197. For example, the timing controller 1195 includes an internal clock generator for generating an internal clock signal based on a reference clock signal, and supplies the internal clock signal to the above circuits.

In the CPU illustrated in FIG. 31, a memory cell is provided in the register 1196. For the memory cell of the register 1196, any of the above-described transistors, the above-described memory device, or the like can be used.

In the CPU illustrated in FIG. 31, the register controller 1197 selects operation of retaining data in the register 1196 in accordance with an instruction from the ALU 1191. That is, the register controller 1197 selects whether data is held by a flip-flop or by a capacitor in the memory cell included in the register 1196. When data holding by the flip-flop is selected, a power supply voltage is supplied to the memory cell in the register 1196. When data holding by the capacitor is selected, the data is rewritten in the capacitor, and supply of the power supply voltage to the memory cell in the register 1196 can be stopped.

Figure 32:
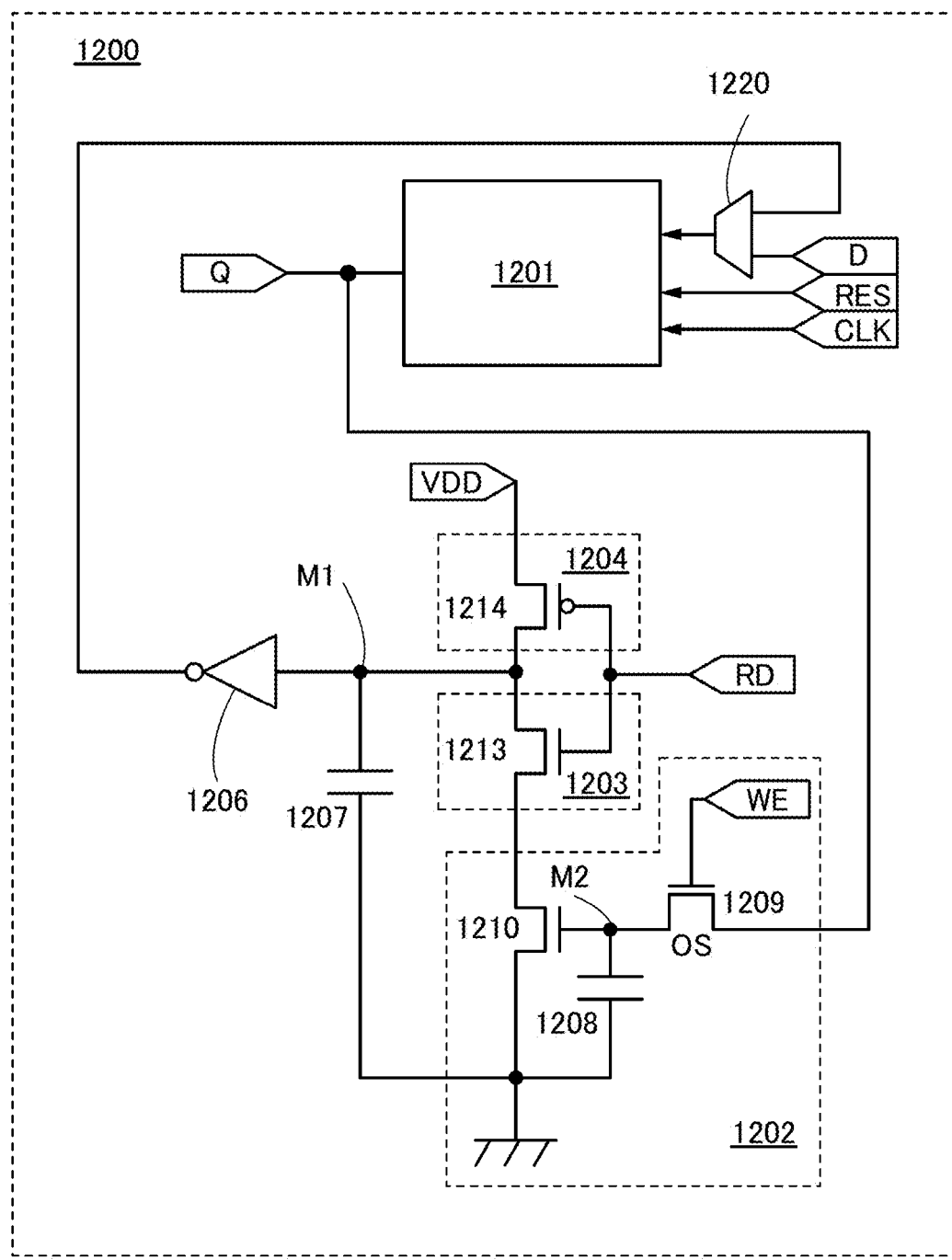
FIG. 32 shows a circuit and a block diagram of a semiconductor device of one embodiment of the present invention.

FIG. 32 is an example of a circuit diagram of a memory element 1200 that can be used as the register 1196. The memory element 1200 includes a circuit 1201 in which stored data is volatile when power supply is stopped, a circuit 1202 in which stored data is nonvolatile even when power supply is stopped, a switch 1203, a switch 1204, a logic element 1206, a capacitor 1207, and a circuit 1220 having a selecting function. The circuit 1202 includes a capacitor 1208, a transistor 1209, and a transistor 1210. Note that the memory element 1200 may further include another element such as a diode, a resistor, or an inductor, as needed.

Here, the above-described memory device can be used as the circuit 1202. When supply of a power supply voltage to the memory element 1200 is stopped, GND (0 V) or a potential at which the transistor 1209 in the circuit 1202 is turned off continues to be input to a gate of the transistor 1209. For example, the gate of the transistor 1209 is grounded through a load such as a resistor.

Shown here is an example in which the switch 1203 is a transistor 1213 having one conductivity type (e.g., an n-channel transistor) and the switch 1204 is a transistor 1214 having a conductivity type opposite to the one conductivity type (e.g., a p-channel transistor). A first terminal of the switch 1203 corresponds to one of a source and a drain of the transistor 1213, a second terminal of the switch 1203 corresponds to the other of the source and the drain of the transistor 1213, and conduction or non-conduction between the first terminal and the second terminal of the switch 1203 (i.e., the on/off state of the transistor 1213) is selected by a control signal RD input to a gate of the transistor 1213. A first terminal of the switch 1204 corresponds to one of a source and a drain of the transistor 1214, a second terminal of the switch 1204 corresponds to the other of the source and the drain of the transistor 1214, and conduction or non-conduction between the first terminal and the second terminal of the switch 1204 (i.e., the on/off state of the transistor 1214) is selected by the control signal RD input to a gate of the transistor 1214.

One of a source and a drain of the transistor 1209 is electrically connected to one of a pair of electrodes of the capacitor 1208 and a gate of the transistor 1210. Here, the connection portion is referred to as a node M2. One of a source and a drain of the transistor 1210 is electrically connected to a line that can supply a low power supply potential (e.g., a GND line), and the other thereof is electrically connected to the first terminal of the switch 1203 (the one of the source and the drain of the transistor 1213). The second terminal of the switch 1203 (the other of the source and the drain of the transistor 1213) is electrically connected to the first terminal of the switch 1204 (the one of the source and the drain of the transistor 1214). The second terminal of the switch 1204 (the other of the source and the drain of the transistor 1214) is electrically connected to a line that can supply a power supply potential VDD. The second terminal of the switch 1203 (the other of the source and the drain of the transistor 1213), the first terminal of the switch 1204 (the one of the source and the drain of the transistor 1214), an input terminal of the logic element 1206, and one of a pair of electrodes of the capacitor 1207 are electrically connected to each other. Here, the connection portion is referred to as a node M1. The other of the pair of electrodes of the capacitor 1207 can be supplied with a constant potential. For example, the other of the pair of electrodes of the capacitor 1207 can be supplied with a low power supply potential (e.g., GND) or a high power supply potential (e.g., VDD). The other of the pair of electrodes of the capacitor 1207 is electrically connected to the line that can supply a low power supply potential (e.g., a GND line). The other of the pair of electrodes of the capacitor 1208 can be supplied with a constant potential. For example, the other of the pair of electrodes of the capacitor 1208 can be supplied with a low power supply potential (e.g., GND) or a high power supply potential (e.g., VDD). The other of the pair of electrodes of the capacitor 1208 is electrically connected to the line that can supply a low power supply potential (e.g., a GND line).

The capacitor 1207 and the capacitor 1208 are not necessarily provided as long as the parasitic capacitance of the transistor, the line, or the like is actively utilized.

A control signal WE is input to the gate of the transistor 1209. As for each of the switch 1203 and the switch 1204, a conduction state or a non-conduction state between the first terminal and the second terminal is selected by the control signal RD that is different from the control signal WE. When the first terminal and the second terminal of one of the switches are in the conduction state, the first terminal and the second terminal of the other of the switches are in the non-conduction state.

A signal corresponding to data retained in the circuit 1201 is input to the other of the source and the drain of the transistor 1209. FIG. 32 illustrates an example in which a signal output from the circuit 1201 is input to the other of the source and the drain of the transistor 1209. The logic value of a signal output from the second terminal of the switch 1203 (the other of the source and the drain of the transistor 1213) is inverted by the logic element 1206, and the inverted signal is input to the circuit 1201 through the circuit 1220.

In the example of FIG. 32, a signal output from the second terminal of the switch 1203 (the other of the source and the drain of the transistor 1213) is input to the circuit 1201 through the logic element 1206 and the circuit 1220; however, one embodiment of the present invention is not limited thereto. The signal output from the second terminal of the switch 1203 (the other of the source and the drain of the transistor 1213) may be input to the circuit 1201 without its logic value being inverted. For example, in the case where the circuit 1201 includes a node in which a signal obtained by inversion of the logic value of a signal input from the input terminal is retained, the signal output from the second terminal of the switch 1203 (the other of the source and the drain of the transistor 1213) can be input to the node.

In FIG. 32, the transistors included in the memory element 1200 except for the transistor 1209 can each be a transistor in which a channel is formed in a film formed using a semiconductor other than an oxide semiconductor or in the substrate 1190. For example, the transistor can be a transistor whose channel is formed in a silicon film or a silicon substrate. Alternatively, all the transistors in the memory element 1200 may be a transistor in which a channel is formed in an oxide semiconductor. Further alternatively, in the memory element 1200, a transistor in which a channel is formed in an oxide semiconductor can be included besides the transistor 1209, and a transistor in which a channel is formed in a layer including a semiconductor other than an oxide semiconductor or the substrate 1190 can be used for the rest of the transistors.

As the circuit 1201 in FIG. 32, for example, a flip-flop circuit can be used. As the logic element 1206, for example, an inverter or a clocked inverter can be used.

In a period during which the memory element 1200 is not supplied with the power supply voltage, the semiconductor device of one embodiment of the present invention can retain data stored in the circuit 1201 by the capacitor 1208 that is provided in the circuit 1202.

The off-state current of a transistor in which a channel is formed in an oxide semiconductor is extremely low. For example, the off-state current of a transistor in which a channel is formed in an oxide semiconductor is significantly lower than that of a transistor in which a channel is formed in silicon having crystallinity. Thus, when the transistor is used as the transistor 1209, a signal held in the capacitor 1208 is retained for a long time also in a period during which the power supply voltage is not supplied to the memory element 1200. The memory element 1200 can accordingly retain the stored content (data) also in a period during which the supply of the power supply voltage is stopped.

Since the above-described memory element performs pre-charge operation with the switch 1203 and the switch 1204, the time required for the circuit 1201 to retain original data again after the supply of the power supply voltage is restarted can be shortened.

In the circuit 1202, a signal retained by the capacitor 1208 is input to the gate of the transistor 1210. Therefore, after supply of the power supply voltage to the memory element 1200 is restarted, the state of the transistor 1210 (the on state or the off state) is determined in accordance with the signal retained by the capacitor 1208, and the signal can be read from the circuit 1202. Consequently, an original signal can be accurately read even when a potential corresponding to the signal retained by the capacitor 1208 varies to some degree.

By applying the above-described memory element 1200 to a memory device such as a register or a cache memory included in a processor, data in the memory device can be prevented from being lost owing to the stop of the supply of the power supply voltage. Furthermore, shortly after the supply of the power supply voltage is restarted, the memory element can be returned to the same state as that before the power supply is stopped. Therefore, the power supply can be stopped even for a short time in the processor or one or a plurality of logic circuits included in the processor. Accordingly, power consumption can be suppressed.

Although the memory element 1200 is used in a CPU, the memory element 1200 can also be used in an LSI such as a digital signal processor (DSP) or a custom LSI, and a radio frequency (RF) device. The memory element 1200 can also be used in an LSI such as a programmable logic circuit (or a programmable logic device (PLD)) including a field programmable gate array (FPGA) or a complex programmable logic device (CPLD).

The structure described in this embodiment can be used in appropriate combination with the structure described in any of the other embodiments.

Embodiment 6

In this embodiment, display devices each including the transistor or the like of one embodiment of the present invention will be described with reference to FIGS. 33A to 33C and FIGS. 34A and 34B.

<Structure of Display Device>

Examples of a display element provided in the display device include a liquid crystal element (also referred to as a liquid crystal display element) and a light-emitting element (also referred to as a light-emitting display element). The light-emitting element includes, in its category, an element whose luminance is controlled by a current or voltage, and specifically includes, in its category, an inorganic electroluminescent (EL) element, an organic EL element, and the like. A display device including an EL element (EL display device) and a display device including a liquid crystal element (liquid crystal display device) are described below as examples of the display device.

Note that the display device described below includes in its category a panel in which a display element is sealed and a module in which an IC such as a controller is mounted on the panel.

The display device described below refers to an image display device or a light source (including a lighting device). The display device includes any of the following modules: a module provided with a connector such as an FPC or a TCP; a module in which a printed wiring board is provided at the end of TCP; and a module in which an IC is mounted directly on a display element by a COG method.

Figure 33A:
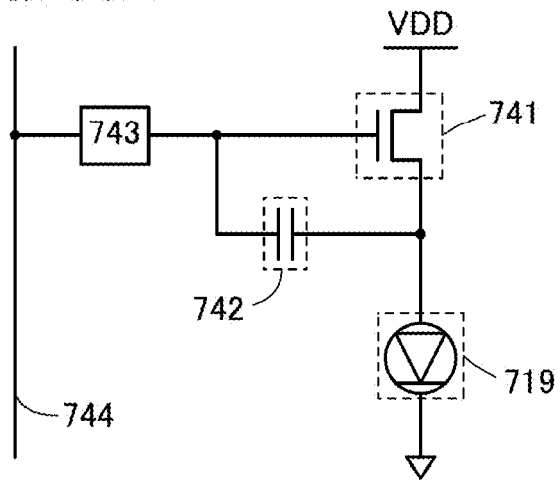
FIGS. 33A to 33C are a circuit diagram, a top view, and a cross-sectional view of a semiconductor device of one embodiment of the present invention.
Figure 33B:
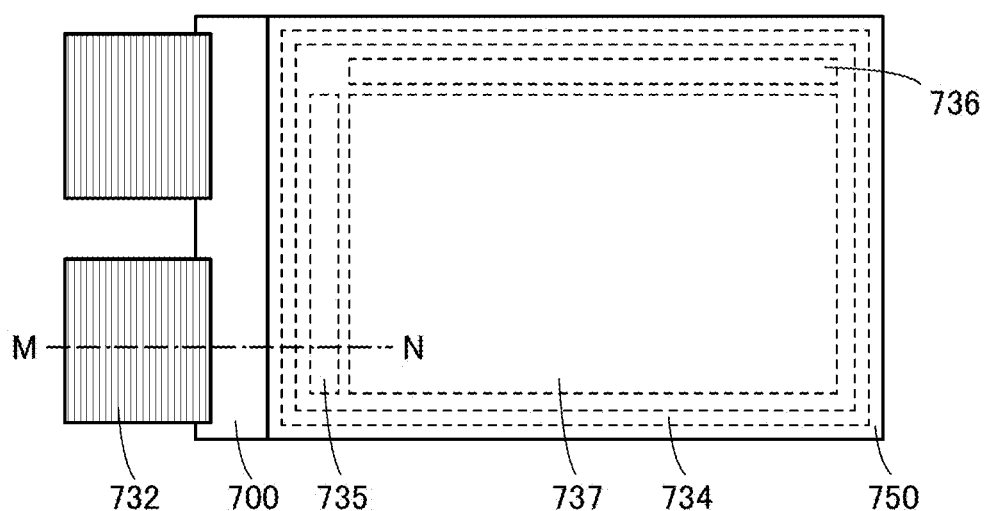
Figure 33C:
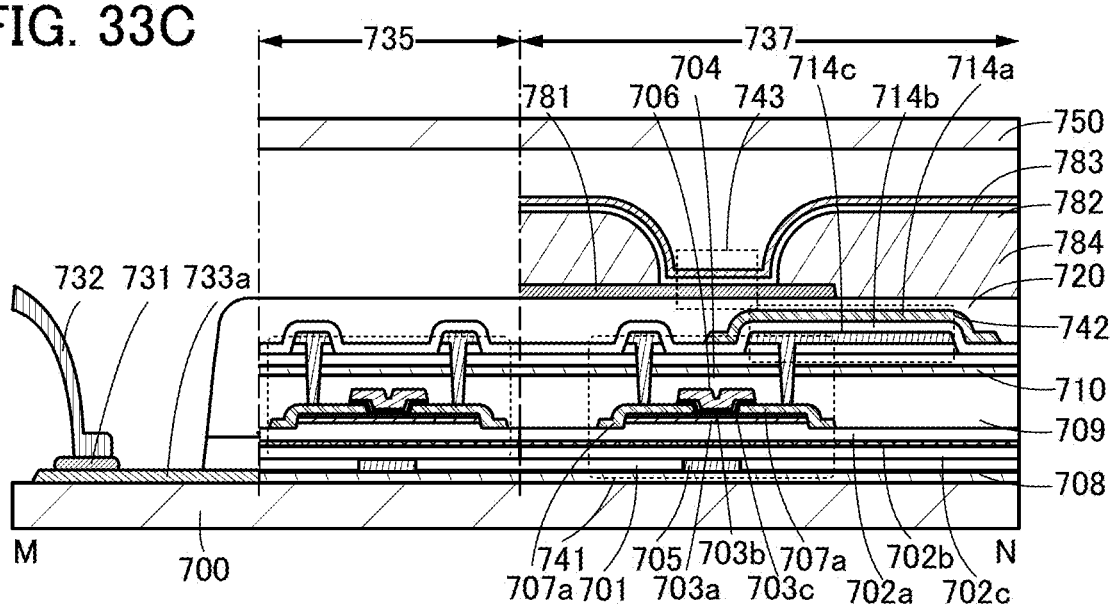

FIGS. 33A to 33C illustrate an example of an EL display device of one embodiment of the present invention. FIG. 33A is a circuit diagram of a pixel in an EL display device. FIG. 33B is a top view showing the whole of the EL display device. FIG. 33C is a cross-sectional view taken along part of dashed-dotted line M-N in FIG. 33B.

FIG. 33A illustrates an example of a circuit diagram of a pixel used in an EL display device.

Note that in this specification and the like, it might be possible for those skilled in the art to constitute one embodiment of the invention even when portions to which all the terminals of an active element (e.g., a transistor or a diode), a passive element (e.g., a capacitor or a resistor), or the like are connected are not specified. In other words, one embodiment of the invention can be clear even when connection portions are not specified. Furthermore, in the case where a connection portion is disclosed in this specification and the like, it can be determined that one embodiment of the invention in which a connection portion is not specified is disclosed in this specification and the like, in some cases. Particularly in the case where the number of portions to which a terminal is connected might be more than one, it is not necessary to specify the portions to which the terminal is connected. Therefore, it might be possible to constitute one embodiment of the invention by specifying only portions to which some of terminals of an active element (e.g., a transistor or a diode), a passive element (e.g., a capacitor or a resistor), or the like are connected.

Note that in this specification and the like, it might be possible for those skilled in the art to specify the invention when at least the connection portion of a circuit is specified. Alternatively, it might be possible for those skilled in the art to specify the invention when at least a function of a circuit is specified. In other words, when a function of a circuit is specified, one embodiment of the present invention can be clear. Furthermore, it can be determined that one embodiment of the present invention whose function is specified is disclosed in this specification and the like. Therefore, when a connection portion of a circuit is specified, the circuit is disclosed as one embodiment of the invention even when a function is not specified, and one embodiment of the invention can be constituted. Alternatively, when a function of a circuit is specified, the circuit is disclosed as one embodiment of the invention even when a connection portion is not specified, and one embodiment of the invention can be constituted.

The EL display device illustrated in FIG. 33A includes a switching element 743, a transistor 741, a capacitor 742, and a light-emitting element 719.

Note that FIG. 33A and the like each illustrate an example of a circuit structure; therefore, a transistor can be provided additionally. In contrast, for each node in FIG. 33A and the like, it is possible not to provide an additional transistor, switch, passive element, or the like.

A gate of the transistor 741 is electrically connected to one terminal of the switching element 743 and one electrode of the capacitor 742. A source of the transistor 741 is electrically connected to the other electrode of the capacitor 742 and one electrode of the light-emitting element 719. A power supply potential VDD is supplied to a drain of the transistor 741. The other terminal of the switching element 743 is electrically connected to a signal line 744. A constant potential is supplied to the other electrode of the light-emitting element 719. The constant potential is a ground potential GND or a potential lower than the ground potential GND.

It is preferable to use a transistor as the switching element 743. When the transistor is used as the switching element, the area of a pixel can be reduced, so that the EL display device can have high resolution. As the switching element 743, a transistor formed through the same step as the transistor 741 can be used, so that EL display devices can be manufactured with high productivity. Note that as the transistor 741 and/or the switching element 743, the above-described transistor can be used, for example.

FIG. 33B is a top view of the EL display device. The EL display device includes a substrate 700, a substrate 750, a sealant 734, a driver circuit 735, a driver circuit 736, a pixel 737, and an FPC 732. The sealant 734 is provided between the substrate 700 and the substrate 750 so as to surround the pixel 737, the driver circuit 735, and the driver circuit 736. Note that the driver circuit 735 and/or the driver circuit 736 may be provided outside the sealant 734.

FIG. 33C is a cross-sectional view of the EL display device taken along part of dashed-dotted line M-N in FIG. 33B.

The transistor 741 in FIG. 33C includes a conductor 705 over the substrate 700, an insulator 701 in which the conductor 705 is embedded, an insulator 702 over the insulator 701, a semiconductor 703 over the insulator 702, a conductor 707a and a conductor 707b over the semiconductor 703, an insulator 706 over the semiconductor 703, and a conductor 704 over the insulator 706. Note that the structure of the transistor 741 is just an example; the transistor 741 may have a structure different from that in FIG. 33C.

Thus, in the transistor 741 illustrated in FIG. 33C, the conductors 704 and 705 each function as a gate electrode, the insulators 702 and 706 each function as a gate insulator, and the conductors 707a and 707b function as a source electrode or a drain electrode. Note that in some cases, electrical characteristics of the semiconductor 703 change if light enters the semiconductor 703. To prevent this, it is preferable that one or more of the conductor 705 and the conductor 704 have a light-blocking property.

Note that an insulator 709 including an excess-oxygen region is provided over the transistor 741. The transistor 741 is provided between an insulator 708 and an insulator 710 having a barrier property.

FIG. 33C illustrates a structure including, as the capacitor 742, a conductor 714c over an insulator 710, an insulator 714b over the conductor 714c, and a conductor 714a over the insulator 714b.

In the capacitor 742, the conductor 714c serves as one electrode, and the conductor 714a serves as the other electrode.

The capacitor 742 illustrated in FIG. 33C has a large capacitance per area occupied by the capacitor. Therefore, the EL display device illustrated in FIG. 33C has high display quality.

An insulator 720 is provided over the transistor 741 and the capacitor 742. Here, the insulator 716 and the insulator 720 may have an opening portion reaching the region 705a that serves as the source of the transistor 741. A conductor 781 is provided over the insulator 720. The conductor 781 is electrically connected to the transistor 741 through the opening portion in the insulator 720.

A partition wall 784 having an opening portion reaching the conductor 781 is provided over the conductor 781. A light-emitting layer 782 in contact with the conductor 781 through the opening portion formed in the partition wall 784 is provided over the partition wall 784. A conductor 783 is provided over the light-emitting layer 782. A region where the conductor 781, the light-emitting layer 782, and the conductor 783 overlap with one another serves as the light-emitting element 719.

So far, examples of the EL display device are described. Next, an example of a liquid crystal display device is described.

Figure 34A:
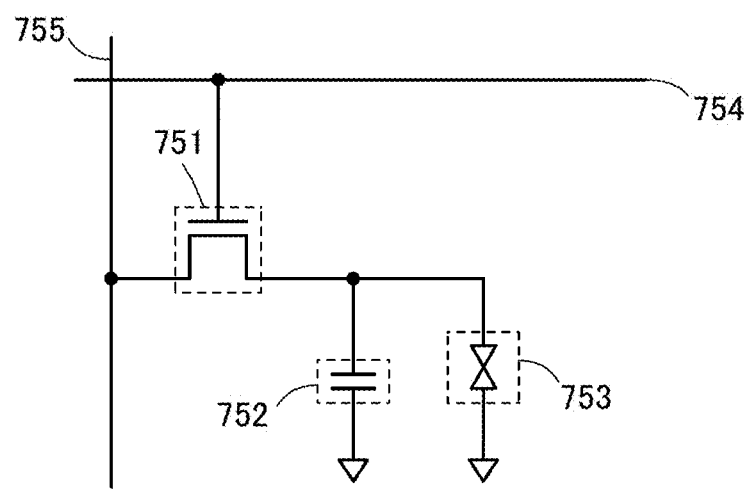
FIGS. 34A and 34B are a circuit diagram and a cross-sectional view of a semiconductor device of one embodiment of the present invention.

FIG. 34A is a circuit diagram showing a structural example of a pixel of the liquid crystal display device. A pixel illustrated in FIGS. 34A and 34B includes a transistor 751, a capacitor 752, and an element (liquid crystal element) 753 in which a space between a pair of electrodes is filled with a liquid crystal.

One of a source and a drain of the transistor 751 is electrically connected to a signal line 755, and a gate of the transistor 751 is electrically connected to a scan line 754.

One electrode of the capacitor 752 is electrically connected to the other of the source and the drain of the transistor 751, and the other electrode of the capacitor 752 is electrically connected to a wiring for supplying a common potential.

One electrode of the liquid crystal element 753 is electrically connected to the other of the source and the drain of the transistor 751, and the other electrode of the liquid crystal element 753 is electrically connected to a wiring for supplying a common potential. The common potential supplied to the wiring electrically connected to the other electrode of the capacitor 752 may be different from that supplied to the other electrode of the liquid crystal element 753.

Figure 34B:
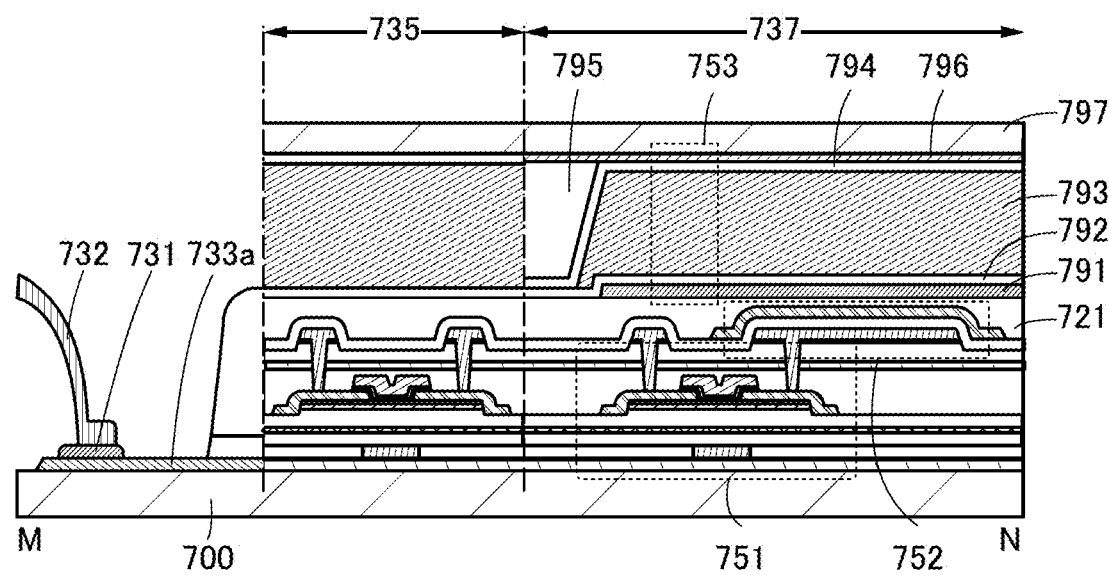

Note that the description of the liquid crystal display device is made on the assumption that the top view of the liquid crystal display device is similar to that of the EL display device. FIG. 34B is a cross-sectional view of the liquid crystal display device taken along dashed-dotted line M-N in FIG. 33B. In FIG. 34B, the FPC 732 is connected to the wiring 733a via the terminal 731. Note that the wiring 733a may be formed using the same kind of conductor as the conductor of the transistor 751 or using the same kind of semiconductor as the semiconductor of the transistor 751.

For the transistor 751, the description of the transistor 741 is referred to. For the capacitor 752, the description of the capacitor 742 is referred to. Note that the structure of the capacitor 752 in FIG. 34B corresponds to, but is not limited to, the structure of the capacitor 742 in FIG. 33C.

Note that in the case where an oxide semiconductor is used as the semiconductor of the transistor 751, the off-state current of the transistor 751 can be extremely small. Therefore, an electric charge held in the capacitor 752 is unlikely to leak, so that the voltage applied to the liquid crystal element 753 can be maintained for a long time. Accordingly, the transistor 751 can be kept off during a period in which moving images with few motions or a still image are/is displayed, whereby power for the operation of the transistor 751 can be saved in that period; accordingly a liquid crystal display device with low power consumption can be provided. Furthermore, the area occupied by the capacitor 752 can be reduced; thus, a liquid crystal display device with a high aperture ratio or a high-resolution liquid crystal display device can be provided.

An insulator 721 is provided over the transistor 751 and the capacitor 752. The insulator 721 has an opening reaching the transistor 751. A conductor 791 is provided over the insulator 721. The conductor 791 is electrically connected to the transistor 751 through the opening in the insulator 721.

An insulator 792 serving as an alignment film is provided over the conductor 791. A liquid crystal layer 793 is provided over the insulator 792. An insulator 794 serving as an alignment film is provided over the liquid crystal layer 793. A spacer 795 is provided over the insulator 794. A conductor 796 is provided over the spacer 795 and the insulator 794. A substrate 797 is provided over the conductor 796.

Note that the following methods can be employed for driving the liquid crystal: a twisted nematic (TN) mode, a super twisted nematic (STN) mode, an in-plane-switching (IPS) mode, a fringe field switching (FFS) mode, a multi-domain vertical alignment (MVA) mode, a patterned vertical alignment (PVA) mode, an advanced super view (ASV) mode, an axially symmetric aligned microcell (ASM) mode, an optically compensated birefringence (OCB) mode, an electrically controlled birefringence (ECB) mode, an ferro-electric liquid crystal (FLC) mode, an anti-ferroelectric liquid crystal (AFLC) mode, a polymer dispersed liquid crystal (PDLC) mode, a guest-host mode, and a blue phase mode. Note that the present invention is not limited to these examples, and various driving methods can be used.

Owing to the above-described structure, a display device including a capacitor occupying a small area, a display device with high display quality, or a high-resolution display device can be provided.

For example, in this specification and the like, a display element, a display device which is a device including a display element, a light-emitting element, and a light-emitting device which is a device including a light-emitting element can employ various modes or can include various elements. For example, the display element, the display device, the light-emitting element, or the light-emitting device includes at least one of a light-emitting diode (LED) for white, red, green, blue, or the like, a transistor (a transistor that emits light depending on current), an electron emitter, a liquid crystal element, electronic ink, an electrophoretic element, a grating light valve (GLV), a plasma display panel (PDP), a display element using micro electro mechanical systems (MEMS), a digital micromirror device (DMD), a digital micro shutter (DMS), an interferometric modulator display (IMOD) element, a MEMS shutter display element, an optical-interference-type MEMS display element, an electrowetting element, a piezoelectric ceramic display, and a display element including a carbon nanotube. Other than the above, display media whose contrast, luminance, reflectivity, transmittance, or the like is changed by an electrical or magnetic effect may be included.

Note that examples of display devices having EL elements include an EL display. Examples of a display device including an electron emitter include a field emission display (FED), an SED-type flat panel display (SED: surface-conduction electron-emitter display), and the like. Examples of display devices including liquid crystal elements include a liquid crystal display (e.g., a transmissive liquid crystal display, a transflective liquid crystal display, a reflective liquid crystal display, a direct-view liquid crystal display, or a projection liquid crystal display). Examples of a display devices having electronic ink or an electrophoretic element include electronic paper. In the case of a transflective liquid crystal display or a reflective liquid crystal display, some of or all of pixel electrodes function as reflective electrodes. For example, some or all of pixel electrodes are formed to contain aluminum, silver, or the like. In such a case, a memory circuit such as an SRAM can be provided under the reflective electrodes, leading to lower power consumption.

Note that in the case of using an LED, graphene or graphite may be provided under an electrode or a nitride semiconductor of the LED. Graphene or graphite may be a multilayer film in which a plurality of layers are stacked. As described above, provision of graphene or graphite enables easy formation of a nitride semiconductor thereover, such as an n-type GaN semiconductor including crystals. Furthermore, a p-type GaN semiconductor including crystals or the like can be provided thereover, and thus the LED can be formed. Note that an AlN layer may be provided between the n-type GaN semiconductor including crystals and graphene or graphite. The GaN semiconductors included in the LED may be formed by MOCVD. Note that when the graphene is provided, the GaN semiconductors included in the LED can also be formed by a sputtering method.

The structure described in this embodiment can be used in appropriate combination with the structure described in any of the other embodiments.

Embodiment 7

In this embodiment, electronic devices each including the transistor or the like of one embodiment of the present invention are described.
<Electronic Device>
The semiconductor device of one embodiment of the present invention can be used for display devices, laptops, or image reproducing devices provided with recording media (typically devices which reproduce the content of recording media such as DVDs (digital versatile disc) and have displays for displaying the reproduced images). Other than the above, as an electronic apparatuses which can use the semiconductor device of an embodiment of the present invention, mobile phones, portable game machines, portable information terminals, e-book readers, video cameras, digital still cameras, goggle-type displays (head mounted displays), navigation systems, audio reproducing devices (e.g., car audio systems and digital audio players), copiers, facsimiles, printers, multifunction printers, automated teller machines (ATM), vending machines, and the like can be given. Specific examples of such electronic apparatuses are shown in FIGS. 35A to 35F.

Figure 35A:
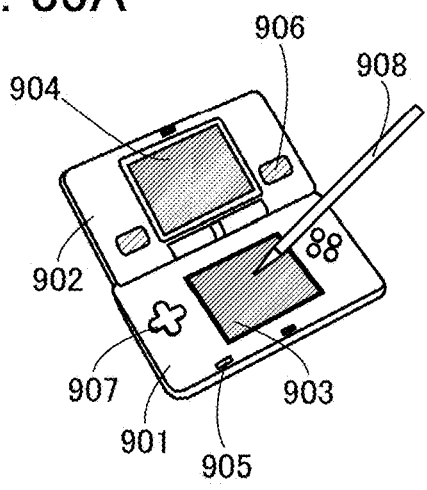
FIGS. 35A to 35F are perspective views each illustrating an electronic device of one embodiment of the present invention.

FIG. 35A illustrates a portable game machine including a housing 901, a housing 902, a display portion 903, a display portion 904, a microphone 905, a speaker 906, an operation key 907, a stylus 908, and the like. Although the portable game machine in FIG. 35A has the two display portions 903 and 904, the number of display portions included in a portable game machine is not limited to this.

Figure 35B:
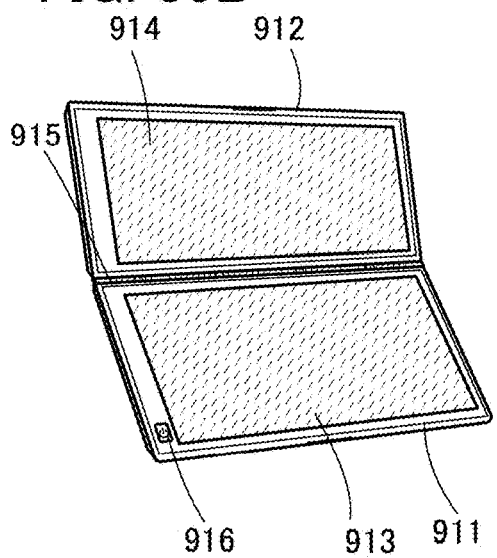

FIG. 35B illustrates a portable data terminal including a first housing 911, a second housing 912, a first display portion 913, a second display portion 914, a joint 915, an operation key 916, and the like. The first display portion 913 is provided in the first housing 911, and the second display portion 914 is provided in the second housing 912. The first housing 911 and the second housing 912 are connected to each other with the joint 915, and the angle between the first housing 911 and the second housing 912 can be changed with the joint 915. An image on the first display portion 913 may be switched depending on the angle between the first housing 911 and the second housing 912 at the joint 915. A display device with a position input function may be used as at least one of the first display portion 913 and the second display portion 914. Note that the position input function can be added by provision of a touch panel in a display device. Alternatively, the position input function can be added by provision of a photoelectric conversion element called a photosensor in a pixel area of a display device.

Figure 35C:
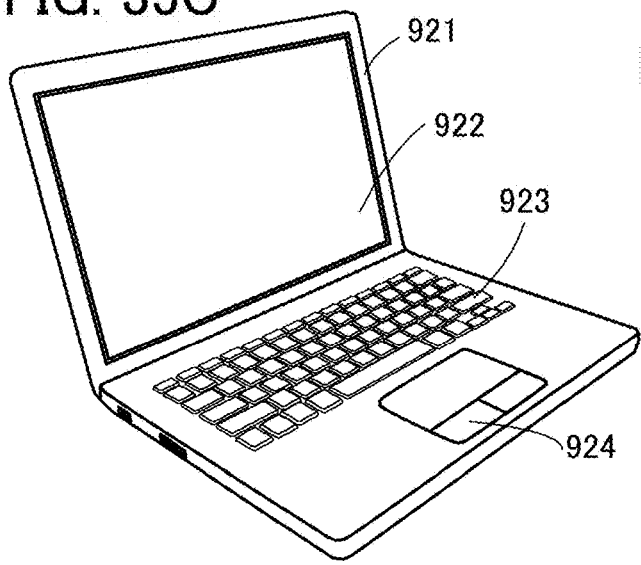

FIG. 35C illustrates a laptop personal computer, which includes a housing 921, a display portion 922, a keyboard 923, a pointing device 924, and the like.

Figure 35D:
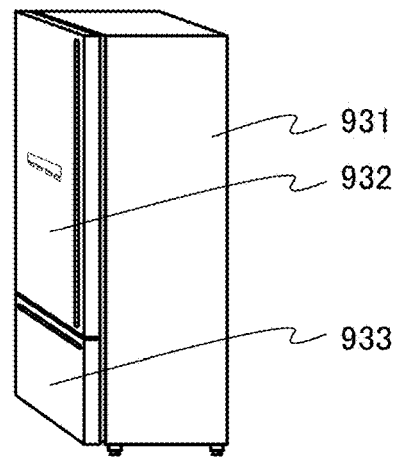

FIG. 35D illustrates the electric refrigerator-freezer including a housing 931, a door for a refrigerator 932, a door for a freezer 933, and the like.

Figure 35E:
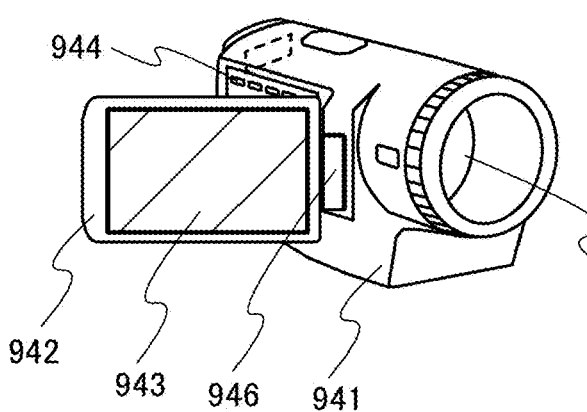

FIG. 35E illustrates a video camera, which includes a first housing 941, a second housing 942, a display portion 943, operation keys 944, a lens 945, a joint 946, and the like. The operation keys 944 and the lens 945 are provided for the first housing 941, and the display portion 943 is provided for the second housing 942. The first housing 941 and the second housing 942 are connected to each other with the joint 946, and the angle between the first housing 941 and the second housing 942 can be changed with the joint 946. Images displayed on the display portion 943 may be switched in accordance with the angle at the joint 946 between the first housing 941 and the second housing 942.

Figure 35F:
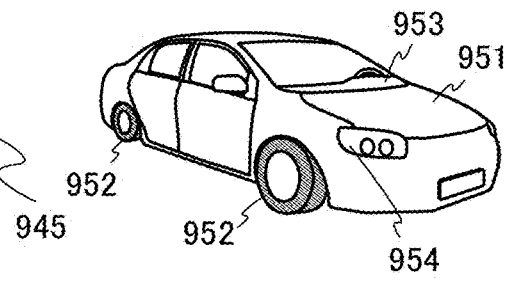

FIG. 35F illustrates a passenger car including a car body 951, wheels 952, a dashboard 953, lights 954, and the like.

The structure described in this embodiment can be used in appropriate combination with the structure described in any of the other embodiments.

Embodiments of the present invention have been described in the above embodiments. Note that one embodiment of the present invention is not limited to the above examples. That is, various embodiments of the invention are described in this embodiment and the like, and one embodiment of the present invention is not limited to a particular embodiment. For example, an example in which a channel formation region, source and drain regions, and the like of a transistor include an oxide semiconductor is described as one embodiment of the present invention; however, one embodiment of the present invention is not limited to this example. Alternatively, depending on circumstances or conditions, various semiconductors may be included in various transistors, a channel formation region of a transistor, a source region or a drain region of a transistor, or the like of one embodiment of the present invention. Depending on circumstances or conditions, at least one of silicon, germanium, silicon germanium, silicon carbide, gallium arsenide, aluminum gallium arsenide, indium phosphide, gallium nitride, an organic semiconductor, and the like may be included in various transistors, a channel formation region of a transistor, a source region or a drain region of a transistor, or the like of one embodiment of the present invention. Alternatively, depending on circumstances or conditions, an oxide semiconductor is not necessarily included in various transistors, a channel formation region of a transistor, a source region or a drain region of a transistor, or the like of one embodiment of the present invention, for example.

Example 1

A sample was formed in which an aluminum oxide film was formed by a sputtering method and oxygen was introduced into a silicon oxynitride film by an ion implantation method through the aluminum oxide film over the silicon oxynitride film. TDS analysis results of the sample are described in this example.

First, addition of oxygen ions to a stacked-layer film including an aluminum oxide film (denoted by AlO$_x$ in FIG. 36) over a silicon oxynitride film (denoted by SiON in FIG. 36) was simulated to determine an acceleration voltage to be used for the ion implantation method. Models A to E differing in the acceleration voltage of the ion implantation method were used for the simulation. For the model A, the acceleration voltage was set to 10 kV. For the model B, the acceleration voltage was set to 15 kV. For the model C, the acceleration voltage was set to 20 kV. For the model D, the acceleration voltage was set to 25 kV. For the model E, the acceleration voltage was set to 30 kV. The thickness and the density of the aluminum oxide film were set to 30 nm and 3.05 g/cm$^3$, respectively. The thickness and the density of the silicon oxynitride film were set to 120 nm and 2.2 g/cm$^3$, respectively. As the oxygen ions to be added, $^{16}$O$^+$ was used and the dose was set to 1.0×10$^{16}$ ions/cm$^2$.

As simulation software, SRIM, the Stopping and Range of Ions in Matter, was used. The SRIM is simulation software for ion introduction processes by a Monte Carlo method.

Figure 36:
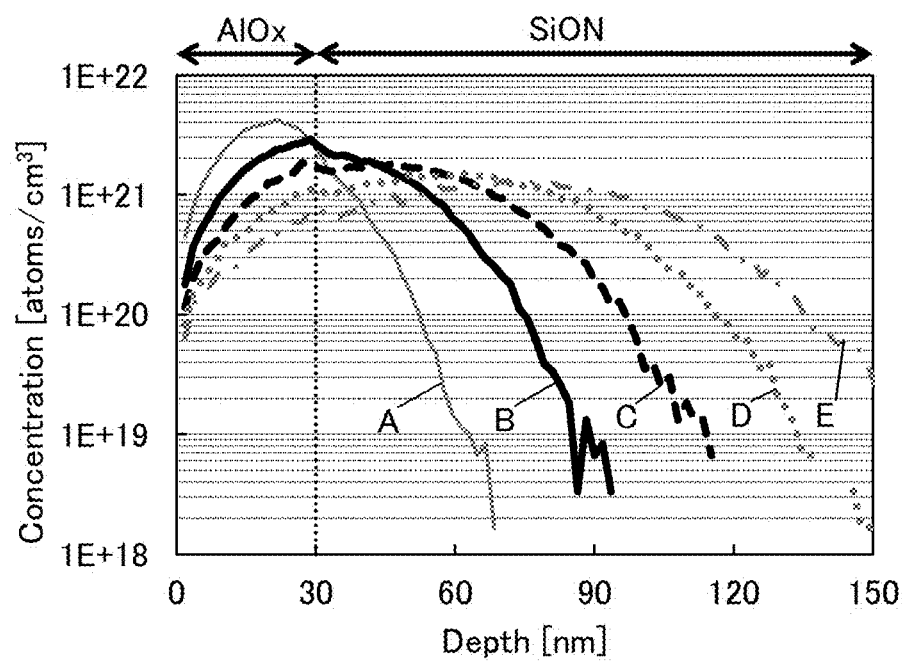
FIG. 36 shows profiles of simulation results of Example 1.

FIG. 36 shows profiles obtained by the simulation of the models A to E. In FIG. 36, the horizontal axis represents the depth (from a surface of the aluminum oxide film) [nm] and the vertical axis represents the concentration of oxygen atoms ($^{16}$O) [atoms/cm$^3$].

As shown in FIG. 36, in the model A, the amount of oxygen introduced into the silicon oxynitride film is small. In the models D and E, oxygen is introduced deeply into the silicon oxynitride film. Accordingly, an acceleration voltage of 15 kV of the model B and an acceleration voltage of 20 kV of the model C were employed in this example. As for the model B, the profile has a peak near the interface between the aluminum oxide film and the silicon oxynitride film. As for the model C, the profile spreads from a portion near the interface to the inside of the silicon oxynitride film.

In this example, TDS analysis was performed on samples 1A to 1C in which oxygen was introduced by an ion implantation method under the conditions described below. Methods for forming the samples 1A to 1C are described below.

By thermal oxidation of a silicon wafer, a 100-nm-thick thermal oxide film was formed on a surface of the silicon wafer. The thermal oxidation was performed at 950° C. in an oxygen atmosphere containing HCl at 3 volume % for 4 hours.

Then, a 5-nm-thick In—Ga—Zn oxide film (hereinafter referred to as IGZO film) was formed over the thermal oxide film by a DC sputtering method. The IGZO film was formed under the following conditions: an In—Ga—Zn oxide target having an atomic ratio of In:Ga:Zn=1:3:2 was used; an argon gas at 30 sccm and an oxygen gas at 15 sccm were used as the deposition gases; the deposition pressure was 0.7 Pa; the deposition power was 500 W; the substrate temperature was 200° C.; and the target-substrate distance was 60 mm.

Then, a 50-nm-thick silicon oxynitride film was formed over the IGZO film by a PECVD method. The silicon oxynitride film was formed under the following conditions: a SiH$_4$ gas at 5 sccm and an N$_2$O gas at 1000 sccm were used as the deposition gases, the deposition pressure was 133.3 Pa, the high-frequency power was 13.56 MHz, the power of an RF power source was 45 W, and the substrate temperature was 325° C.

Then, a 30-nm-thick aluminum oxide film was formed over the silicon oxynitride film by an RF sputtering method. The aluminum oxide film was formed under the following conditions: an Al$_2$O$_3$ target was used, an argon gas at 25 sccm and an oxygen gas at 25 sccm were used as the deposition gases, the deposition pressure was 0.4 Pa, the deposition power was 2500 W, the substrate temperature was 250° C., and the target-substrate distance was 60 mm.

Then, in the samples 1B and 1C, ions of oxygen with a mass number of 16 ($^{16}$O$^+$) were added at a dose of 1.0×10$^{16}$ ions/cm$^2$ using an ion implantation apparatus. Here, an acceleration voltage of 15 kV was used for the sample 1B, and an acceleration voltage of 20 kV was used for the sample 1C. Note that in the samples 1A, the addition of oxygen ions by an ion implantation method was not performed.

Then, the aluminum oxide film was removed by wet etching using a mixed solution of phosphoric acid, acetic acid, and nitric acid at approximately 90° C.

Figure 37A:
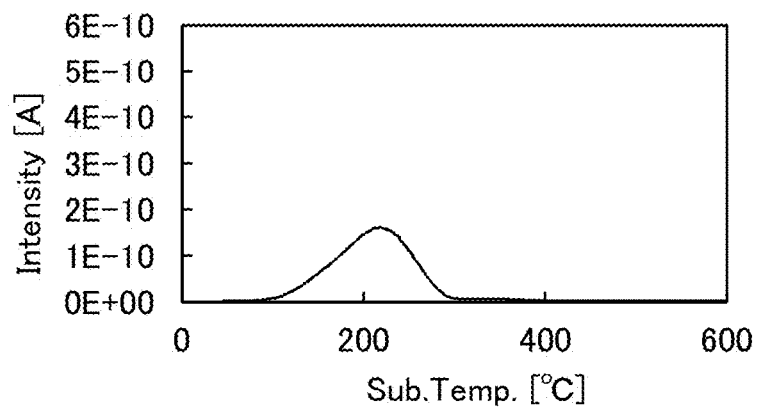
FIGS. 37A to 37C are graphs each showing results of TDS analysis in Example 1.
Figure 37B:
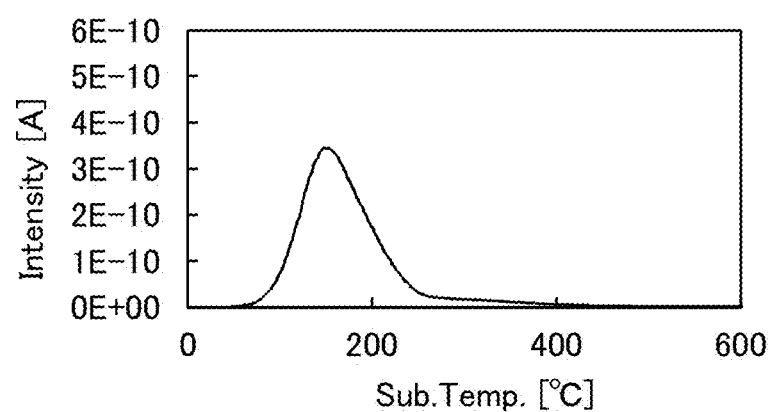
Figure 37C:
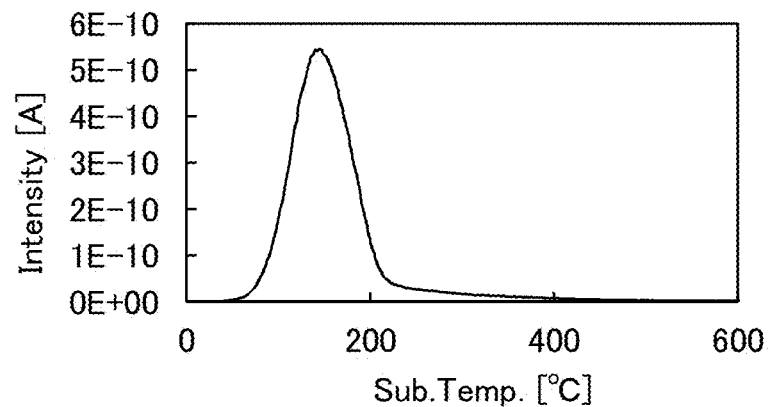

FIGS. 37A to 37C show the TDS analysis results of the samples 1A to 1C formed in the above manner. Note that in the TDS analysis, the amount of a released gas with a mass-to-charge ratio M/z=32, which corresponds to an oxygen molecule, was measured. In each of FIGS. 37A to 37C, the horizontal axis represents substrate heating temperature [° C.] and the vertical axis represents intensity proportional to the amount of the released gas with M/z=32.

As shown in FIGS. 37A to 37C, release of oxygen molecules was observed from the samples 1A to 1C. The released amounts of oxygen molecules of the samples 1A, 1B, and 1C were 3.1×10$^{15}$ molecules/cm$^2$, 5.2×10$^{15}$ molecules/cm$^2$, and 7.3×10$^{15}$ molecules/cm$^2$, respectively. The released amounts of oxygen converted into oxygen atoms of the samples 1A, 1B, and 1C were 6.3×10$^{15}$ atoms/cm$^2$, 1.0×10$^{16}$ atoms/cm$^2$, and 1.5×10$^{16}$ atoms/cm$^2$, respectively. Furthermore, the oxygen concentrations in the 50-nm-thick silicon oxynitride films were obtained from the released amounts of oxygen atoms. The obtained oxygen concentrations of the samples 1A, 1B, and 1C were 1.3×10$^{21}$ atoms/cm$^3$, 2.1×10$^{21}$ atoms/cm$^3$, and 2.9×10$^{21}$ atoms/cm$^3$, respectively. Note that the oxygen concentrations in the silicon oxynitride films of the samples 1B and 1C agree comparatively well with the simulation results shown in FIG. 36.

The oxygen molecules released from the sample 1A may be derived from oxygen introduced into the silicon oxynitride film when the aluminum oxide film was formed by a sputtering method. In contrast, as for the samples 1B and 1C to which oxygen ions were added by an ion implantation method, more oxygen molecules were released.

As described above, oxygen can be introduced into the silicon oxynitride film by the formation of the aluminum oxide film over the silicon oxynitride film by a sputtering method. Furthermore, more oxygen can be introduced into the silicon oxynitride film by the addition of oxygen ions by an ion implantation method through the aluminum oxide film over the silicon oxynitride film.

EXPLANATION OF REFERENCE

10: insulator, 12: insulator, 20: conductor, 22: conductor, 30: insulator, 100: capacitor, 102: insulator, 103: insulator, 104: insulator, 112: conductor, 114: insulator, 116: conductor, 120: insulator, 122: insulator, 124: conductor, 126: conductor, 128: conductor, 128a: conductor, 128b: conductor, 128c: conductor, 128d: conductor, 200: transistor, 205: conductor, 205a: conductor, 205b: conductor, 210: insulator, 212: insulator, 214: insulator, 216: insulator, 218: conductor, 218a: conductor, 218b: conductor, 218c: conductor, 220: insulator, 222: insulator, 224: insulator, 230: oxide, 230a: oxide, 230b: oxide, 230c: oxide, 240a: conductor, 240b:

conductor, 241a: conductor, 241b: conductor, 244: conductor, 244a: conductor, 244b: conductor, 244c: conductor, 244d: conductor, 244e: conductor, 245a: region, 245b: region, 250: insulator, 260: conductor, 260a: conductor, 260b: conductor, 270: insulator, 280: insulator, 282: insulator, 284: insulator, 286: insulator, 300: transistor, 301: substrate, 302: semiconductor region, 304: insulator, 306: conductor, 308a: low-resistance region, 308b: low-resistance region, 320: insulator, 322: insulator, 324: insulator, 326: insulator, 328: conductor, 328a: conductor, 328b: conductor, 328c: conductor, 330: conductor, 330a: conductor, 330b: conductor, 330c: conductor, 350: insulator, 352: insulator, 354: insulator, 356: conductor, 358: conductor, 358a: conductor, 358b: conductor, 358c: conductor, 700: substrate, 701: insulator, 702: insulator, 703: semiconductor, 704: conductor, 705: conductor, 705a: region, 706: insulator, 707a: conductor, 707b: conductor, 708: insulator, 709: insulator, 710: insulator, 714a: conductor, 714b: insulator, 714c: conductor, 716: insulator, 719: light-emitting element, 720: insulator, 721: insulator, 731: terminal, 732: FPC, 733a: wiring, 734: sealant, 735: driver circuit, 736: driver circuit, 737: pixel, 741: transistor, 742: capacitor, 743: switching element, 744: signal line, 750: substrate, 751: transistor, 752: capacitor, 753: liquid crystal element, 754: scan line, 755: signal line, 781: conductor, 782: light-emitting layer, 783: conductor, 784: partition wall, 791: conductor, 792: insulator, 793: liquid crystal layer, 794: insulator, 795: spacer, 796: conductor, 797: substrate, 901: housing, 902: housing, 903: display portion, 904: display portion, 905: microphone, 906: speaker, 907: operation key, 908: stylus, 911: housing, 912: housing, 913: display portion, 914: display portion, 915: joint, 916: operation key, 921: housing, 922: display portion, 923: keyboard, 924: pointing device, 931: housing, 932: door for refrigerator, 933: door for freezer, 941: housing, 942: housing, 943: display portion, 944: operation key, 945: lens, 946: joint, 951: car body, 952: wheel, 953: dashboard, 954: light, 1189: ROM interface, 1190: substrate, 1191: ALU, 1192: ALU controller, 1193: instruction decoder, 1194: interrupt controller, 1195: timing controller, 1196: register, 1197: register controller, 1198: bus interface, 1199: ROM, 1200: memory element, 1201: circuit, 1202: circuit, 1203: switch, 1204: switch, 1206: logic element, 1207: capacitor, 1208: capacitor, 1209: transistor, 1210: transistor, 1213: transistor, 1214: transistor, 1220: circuit 3001: wiring, 3002: wiring, 3003: wiring, 3004: wiring, 3005: wiring.

This application is based on Japanese Patent Application serial no. 2015-222731 filed with Japan Patent Office on Nov. 13, 2015, the entire contents of which are hereby incorporated by reference.

The invention claimed is:

1. A semiconductor device comprising:
a first transistor comprising a semiconductor;
a first insulator over the first transistor;
a second insulator over the first transistor;
a plug provided in an opening which is provided in the first insulator and the second insulator;
a second transistor under the first transistor; and
a wiring between the first transistor and the second transistor, the wiring being electrically connected to the plug,
wherein the first insulator comprises silicon and oxide,
wherein the second insulator comprises hafnium and oxide,
wherein the plug comprises a metal nitride film which is in contact with an inner surface of the opening and a tungsten film which is over the metal nitride film,
wherein the second insulator is in direct contact with an upper surface of the first insulator in a first region,
wherein the second insulator is in direct contact with a side surface of the first insulator in a second region,
wherein the first region overlaps with the first transistor, and
wherein the second region does not overlap with the first transistor.

2. The semiconductor device according to claim 1, wherein the second insulator comprises a hafnium oxide.

3. The semiconductor device according to claim 1, wherein the first insulator comprises a silicon oxide.

4. A semiconductor device comprising:
a first transistor comprising a semiconductor;
a first insulator over the first transistor;
a second insulator over the first transistor;
a plug provided in an opening which is provided in the first insulator and the second insulator;
a second transistor under the first transistor; and
a wiring between the first transistor and the second transistor, the wiring being electrically connected to the plug,
wherein the first insulator comprises an silicon and oxide,
wherein the second insulator comprises hafnium and oxide,
wherein the plug comprises a metal nitride film which is in contact with an inner surface of the opening and a tungsten film which is over the metal nitride film,
wherein the second insulator is in direct contact with an upper surface of the first insulator in a first region,
wherein the second insulator is in direct contact with a side surface of the first insulator in a second region,
wherein the first region overlaps with the first transistor,
wherein the second region does not overlap with the first transistor, and
wherein the opening does not overlap with the first transistor.

5. The semiconductor device according to claim 4, wherein the second insulator comprises a hafnium oxide.

6. The semiconductor device according to claim 4, wherein the first insulator comprises a silicon oxide.

7. The semiconductor device according to claim 4, wherein a part of the metal nitride film of the plug is over the second insulator.

* * * * *